United States Patent [19]

Huang

[11] 4,281,391
[45] Jul. 28, 1981

[54] NUMBER THEORETIC PROCESSOR

[75] Inventor: Alan Huang, Menlo Park, Calif.

[73] Assignee: Leland Stanford Junior University, Stanford, Calif.

[21] Appl. No.: 3,745

[22] Filed: Jan. 15, 1979

[51] Int. Cl.³ .............................................. H03K 13/24
[52] U.S. Cl. ...................................... 364/746; 235/311; 340/347 DD
[58] Field of Search ................................ 364/746, 771; 340/347 DD; 235/310, 311

[56] References Cited

U.S. PATENT DOCUMENTS

| | | | |
|---|---|---|---|
| 3,191,014 | 6/1965 | Roth et al. ............................. | 235/311 |
| 3,700,872 | 10/1972 | May ...................................... | 235/311 |
| 3,750,111 | 7/1973 | Kobylar et al. ....................... | 235/311 |
| 3,758,766 | 9/1973 | Combet ................................ | 235/311 |
| 3,882,483 | 5/1975 | Burke et al. ................... | 340/347 DD |
| 3,943,350 | 3/1976 | Lanning ................................ | 235/311 |
| 3,980,874 | 9/1976 | Vora ...................................... | 364/746 |
| 4,107,783 | 8/1978 | Huang ................................... | 364/746 |

OTHER PUBLICATIONS

Banerji, Sign Detection in Residue Number Systems, IEEE Transactions on Computers, vol. C-18, No. 4, Apr. 1969, pp. 313–320.
Jullien, Residue Number Scaling and Other Operating Using ROM Arrays, IEEE Transactions on Computers, vol. C-27, No. 4, Apr. 1978, pp. 325–336.

Primary Examiner—Charles E. Atkinson

[57] ABSTRACT

Input data is converted into its modular equivalents. These equivalents are used to perform the desired computation in a modular manner. Each computation is done for several moduli. The various modular results are woven into a mixed radix version of the answer. This version of the answer is then converted into a normal radix equivalent.

The processor is constructed from a network of nodes. These nodes either store constants, perform modular arithmetic, or perform three operand binary arithmetic. The nodes are organized in networks to perform encoding, modular computations, residue to mixed radix decoding, and mixed to normal radix conversion. These operations are performed in a parallel manner. The function of the nodes can be performed by table lookup. The table lookups can be implemented with memories. The interconnection of the nodes is structured to facilitate the construction and modification of such processors. Processors can be implemented to perform many types of operations. Processors which perform summation, inner products, determinate evaluation, and summation of the squares of differences are discussed.

21 Claims, 34 Drawing Figures

NUMBER THEORETIC PROCESSOR

BACKGROUND OF THE INVENTION

1. Field of the Invention

This invention relates to a system for processing arithmetic information. In a primary application the invention relates to the parallel processing of arithmetic operations such as addition, subtraction, multiplication, integer polynomial transforms, any number of such operations, or any combination thereof. In a further application this invention relates to organizing such a processor into a partitioned and highly structured form to facilitate design, construction, and modification of such processors.

2. Description of the Prior Art

Residue arithmetic, also referred to as modular arithmetic, number theoretic arithmetic, or arithmetic over a Galois field has been known for some time. In the 19th century K. F. Gauss introduced the concept of modular arithmetic. He discovered that any calculation involving only additions, subtractions, multiplications, integer polynomial transforms, or any combination of these operations can be performed in a modular manner. In other words if all the operands, intermediate and final results are expressed as remainders of a given divisor then the equality of the overall expression would be preserved. It was also shown that if these calculations were duplicated for particular divisors then the modular results could be woven to resynthesize the traditional answer. One of the weaving techniques relies on Euclid's base conversion algorithm while the other technique relies on the Chinese Remainder theorem credited to Sun Tsu in 100 AD.

Residue arithmetic is unique in that no borrows or carries are used. This simplifies the circuitry needed since the carries or borrows need not be communicated, waited for, or stored. The arithmetic is simple and can be implemented with table lookups. A good review of the field is given in the book *Residue Arithmetic and Its Application to Computer Technology* by N. S. Szabo and R. I. Tanaka (N.Y., McGraw-Hill, 1967).

There are several problems associated with using the residue number system which has impeded its acceptance. One reason is that generalized division cannot be accomplished in an easy manner. Another is that encoding into residue and decoding out residues contributes a significant computational overhead. And finally relative magnitude or sign detection cannot be accomplished without first decoding from residues.

A processor which utilizes the advantages of residue arithmetic is described in a U.S. Pat. No. 4,107,783 issued to Alan Huang on Aug. 15, 1978. The system described amortizes the computational overhead of the required encoding and decoding by processing a plurality of operands and operations. If only two numbers were to be added then the benefits of a residue approach would be questionable, however if many numbers were to be added then the avoided carries would compensate for the required encoding and decoding overhead.

The processor described also utilizes another aspect of the residue system. The computational interactions of the processor are very simple and can be expressed as mappings or table look-ups. This facilitates the partitioning of the processor into basic building blocks which can be implemented by a wide range of technologies. In turn the different properties of these technologies enable a processor so constructed to process several unique properties.

The processor described in the patent is essentially a cascaded structure. Such an architecture is characterized by an intermediate result interacting in sequence with other operands. It is most suited to algorithms which can be represented by extended expression evaluation trees.

The present invention is also designed to handle a plurality of operands and operations, however they are handled in a parallel rather than a cascaded manner. Such a structure can process a plurality of intermediate results each interacting with different operands or among themselves. This parallel architecture is more general in that it can be applied to algorithms represented by any type of expression evaluation tree.

As mentioned previously the compatibility of residue results with conventional processors has been a major difficulty. This invention includes a means of converting from residues to conventional binary. Another problem which is addressed is the correct handling of sign information in the encoding, processing, and decoding processes.

Large conventional processors must contend with increased fabrication and internal communication problems associated with any increase in complexity. Recent efforts to overcome this problem have centered around using VLSI technology. Much work has been done in trying to partition processors into cellular arrays. Many approaches have been suggested, however an orderly structure seems to come at the expense of increased internal communications. By using the residue number system the internal communications related to arithmetic can be greatly be reduced. Thus this invention is also directed to a highly structured architecture which is easy to design, construct, and modify.

SUMMARY OF INVENTION

An object of the invention is to provide a system for processing arithmetic operations for a plurality of operands in a parallel manner.

Another object of the invention is to provide a system for processing arithmetic operations for a plurality of operands in a pipelined manner.

Another object of the invention is to provide a system for performing arithmetic in a parallel manner.

Another object of the invention is to provide a system of processing arithmetic operations for a plurality of positive or negative operands.

Another object of the invention is to provide a system for processing arithmetic operations with table lookup.

Another object of the invention is to provide a system for processing arithmetic operations for a plurality of floating point operands.

A final object of the invention is to provide a system for processing arithmetic operations which is structured to be easily designed, constructed, and modified.

Briefly in accordance with this invention input data is encoded into modular equivalents. These equivalents are used to perform a desired calculation in a modular manner. The computation can be comprised of addition, subtraction, multiplication, integer polynomial transforms, any number of such operations, or combination thereof. The resulting modular equivalents of the answer are woven to form a mixed radix equivalent of the answer. This mixed radix equivalent is then converted into a normal radix equivalent of the answer.

The processor is comprised of several basic building blocks. These blocks either store constants, perform modular arithmetic, or perform three operand binary arithmetic. They can be implemented as mappings or table lookups. These tables can be stored in memories. The communications between these tables are structured to ease design, construction, and modification. Processors designed to perform summations, inner products, determinate evaluation, and summation of the square of differences are used as examples.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
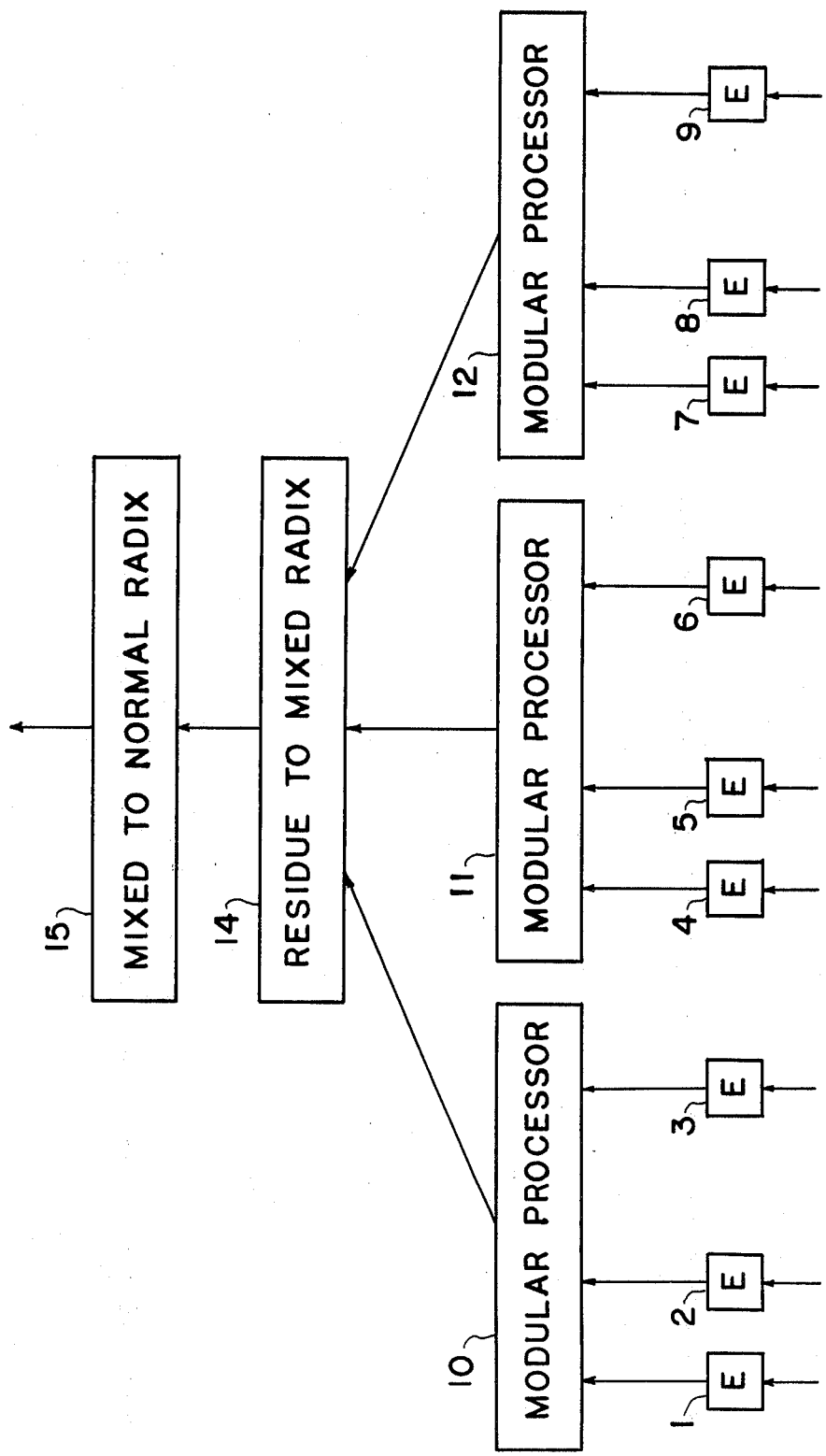
FIG. 1 is a block diagram illustrating the invention showing encoders, modular processors, a residue to mixed radix converter, and a mixed to normal radix converter.

An understanding of the broad aspects of the invention can best be had by reference to FIG. 1 of th drawings. The data to be processed is fed to the normal radix to residue encoders such as 1-3, 4-6, and 7-9. Each group of encoders such as 1-3 are associated with a modular processor such as 10, 11, or 12. Each group of encoders translates the input data into the modular equivalent for the modulus of its associated modular processor. The modular processors uses the modular equivalents of the data to perform the desired calculation in a modular manner. The desired calculation can be an addition, subtraction, multiplication, integer polynomial transform, a plurality of these operations, or any combination thereof. The modular answer of a desired calculation produced by each modular processor is then fed to a residue to mixed radix converter 14. This unit weaves the modular equivalents of the answer to produce a mixed radix equivalent. The mixed radix equivalent can then be passed to a mixed radix to normal radix converter 15. This unit converts the mixed radix equivalent into a normal radix version of the answer.

Figure 6:
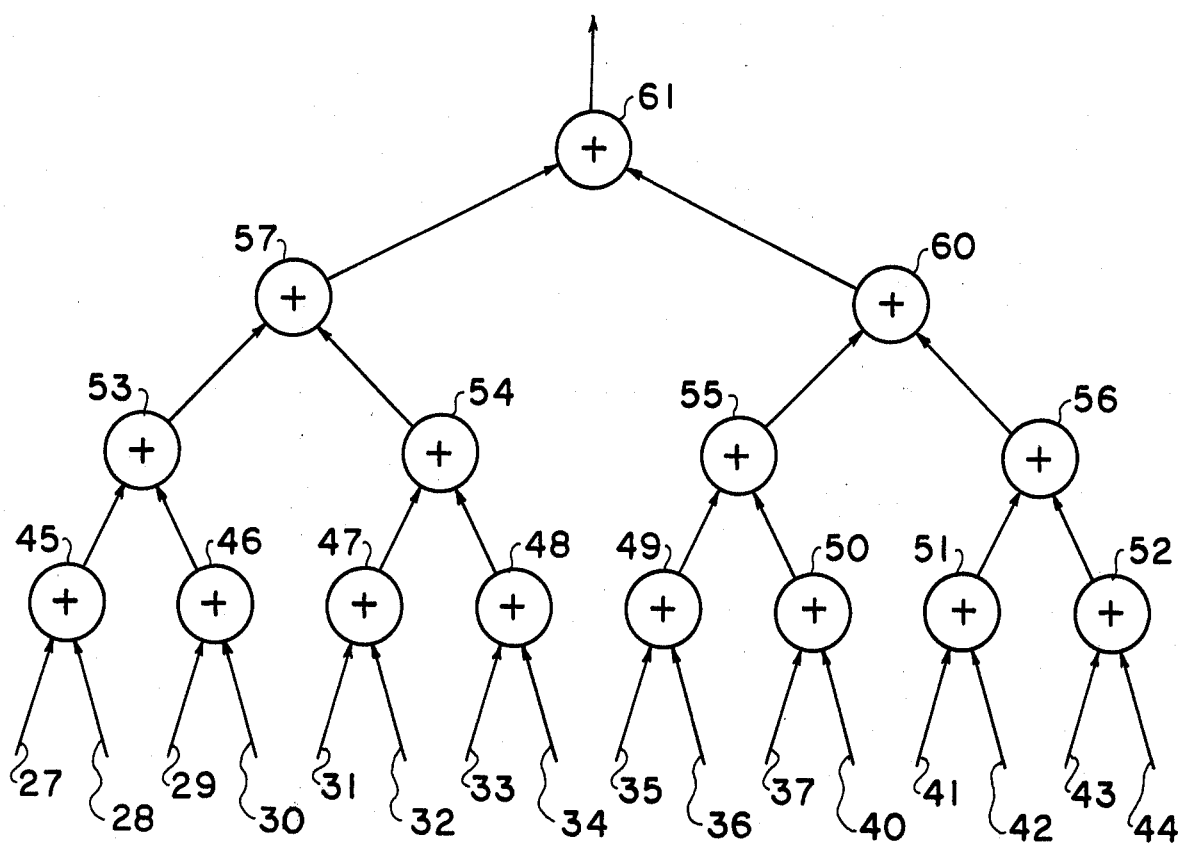
FIG. 6 illustrates a modular processor which performs summation.
Figure 7:
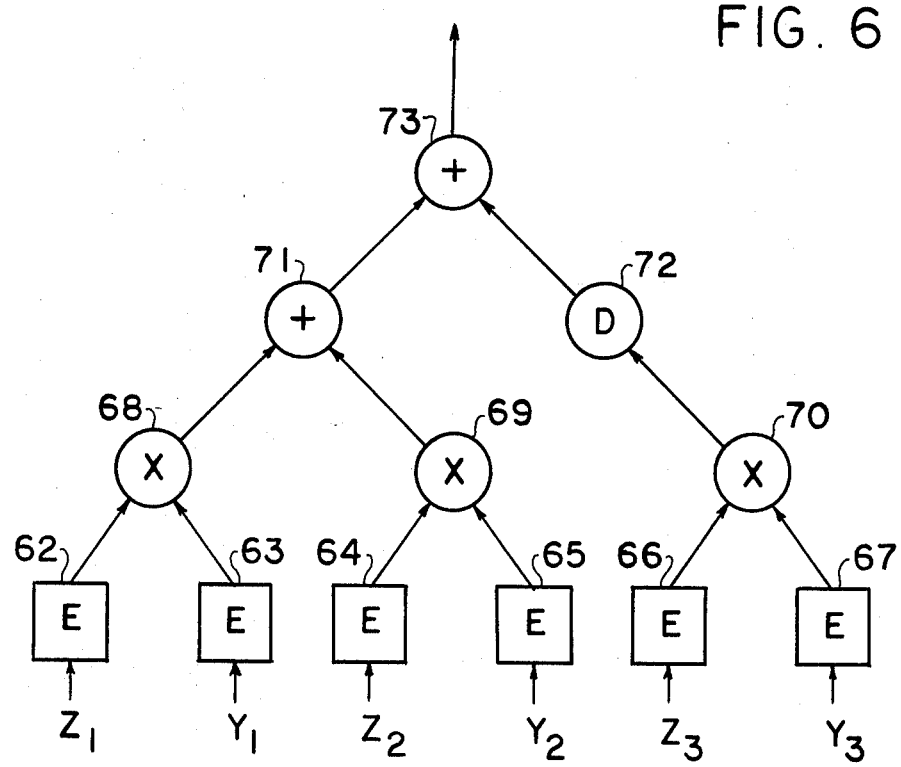
FIG. 7 illustrates a modular processor which performs an inner product.
Figure 8:
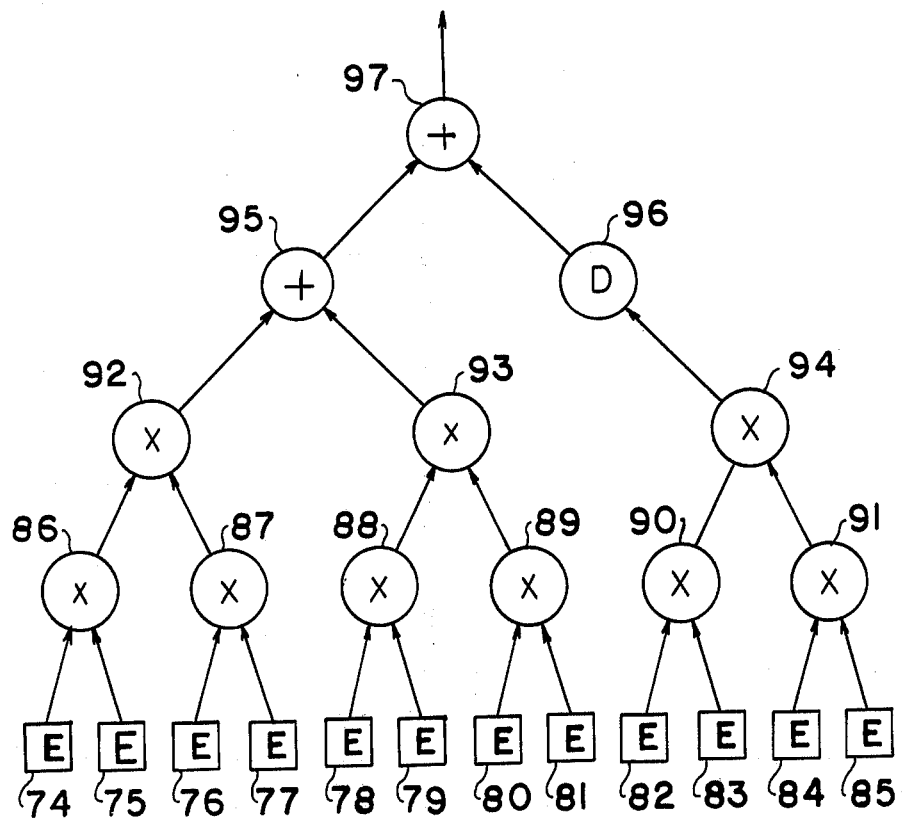
FIG. 8 illustrates a modular processor which performs summation of multiple products.
Figure 9:
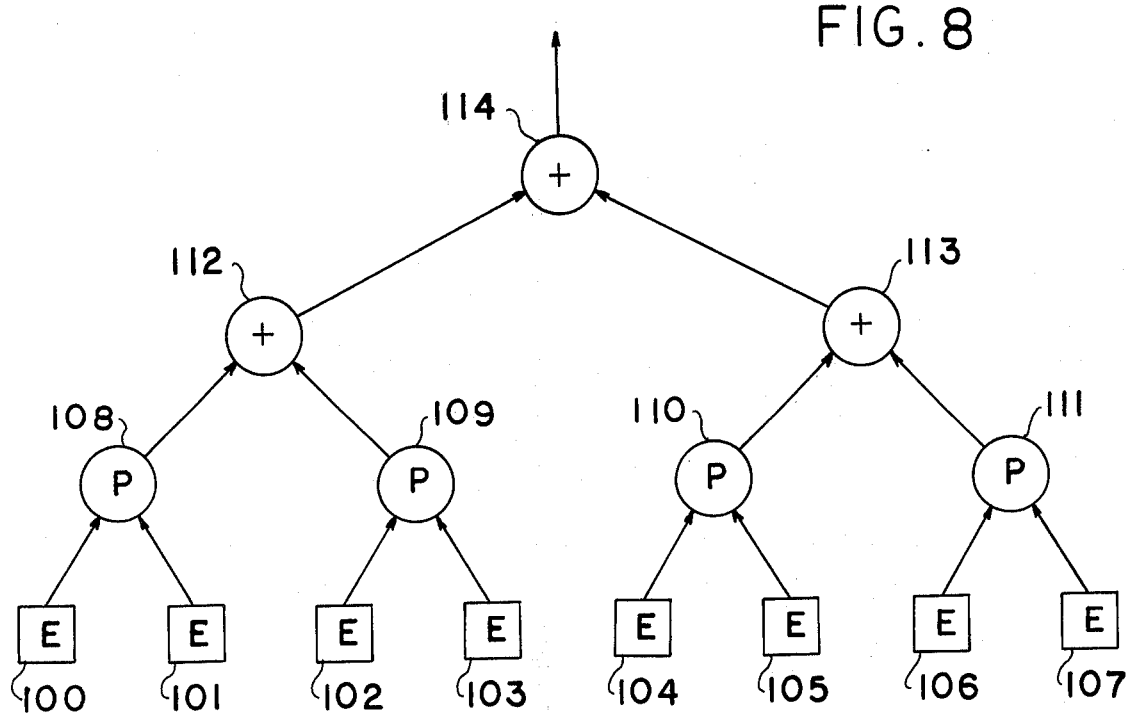
FIG. 9 illustrates a modular processor which performs the summation of the square of differences.
Figure 11:
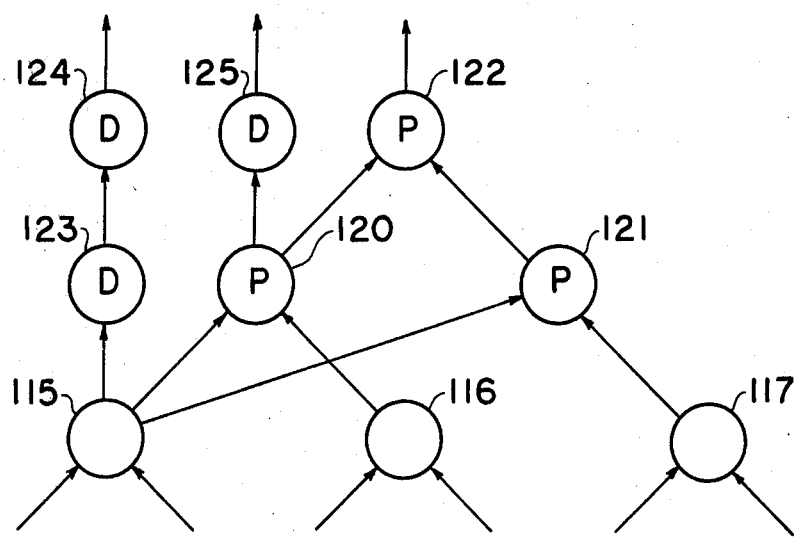
FIG. 11 illustrates a residue to mixed radix converter.
Figure 12:
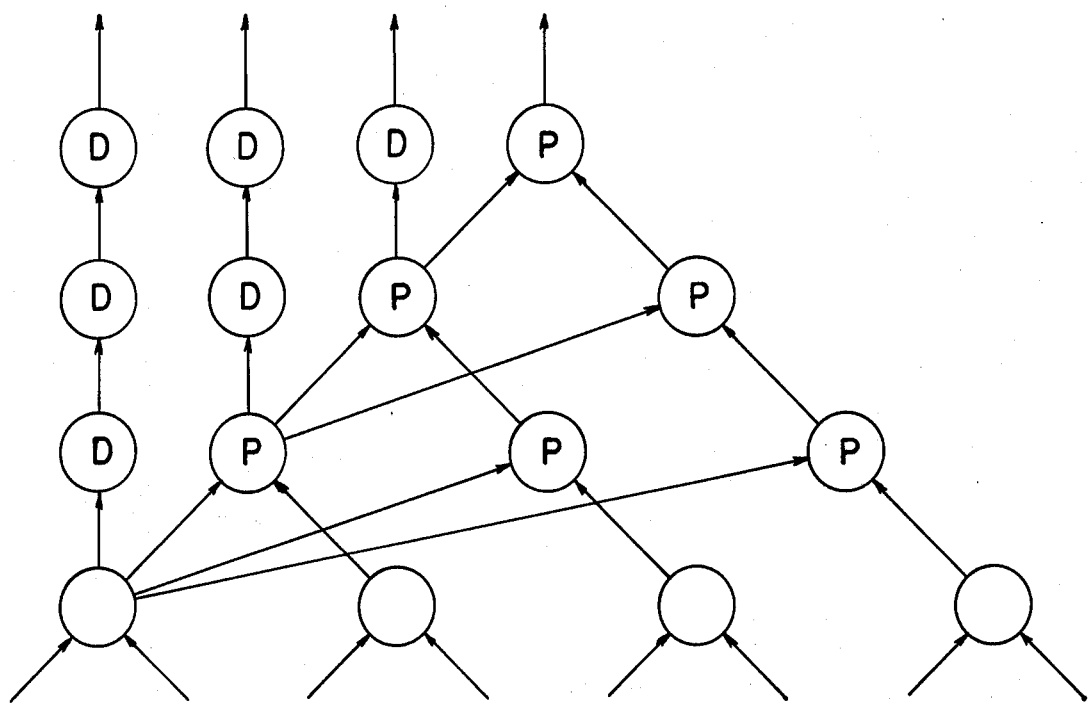
FIG. 12 illustrates a residue to mixed radix converter which processes four moduli.
Figure 18:
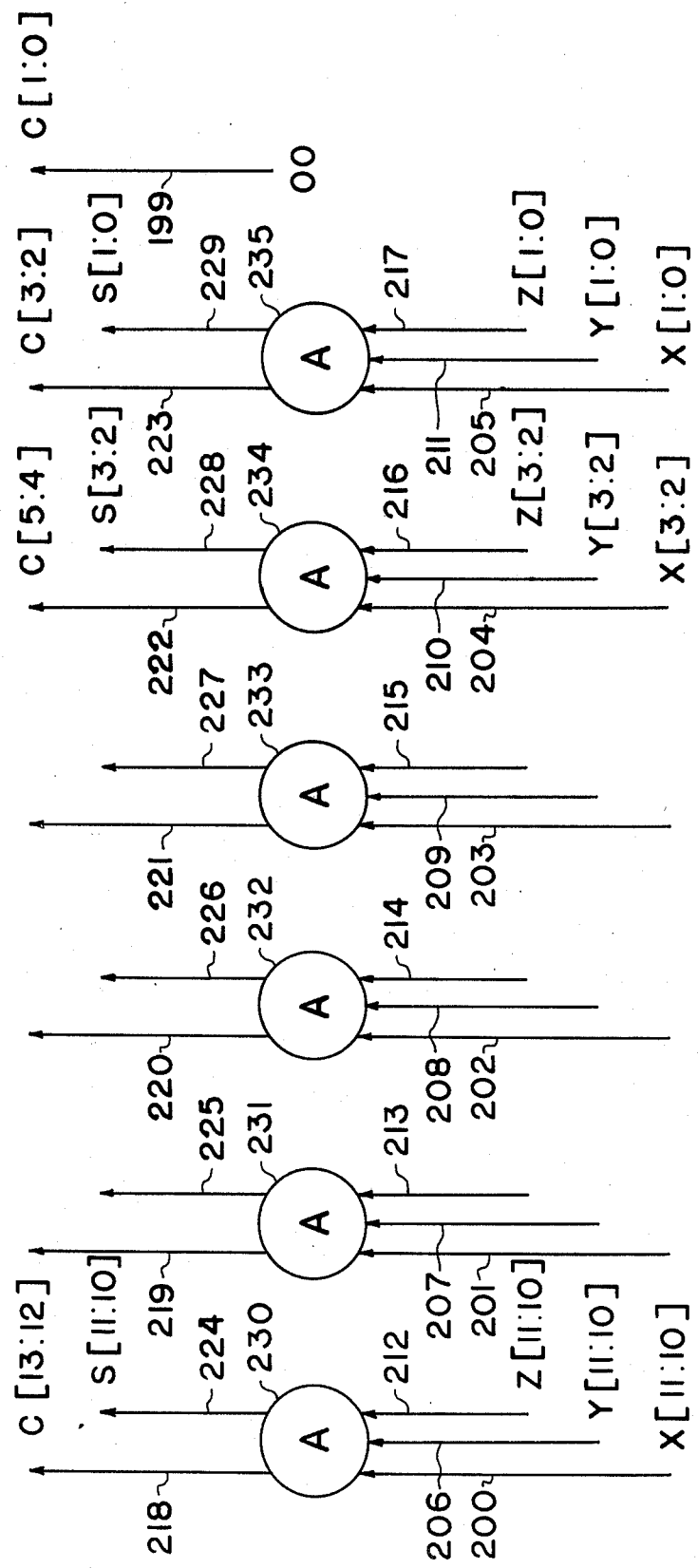
FIG. 18 illustrates nodes organized into a carry save adder.
Figure 19:
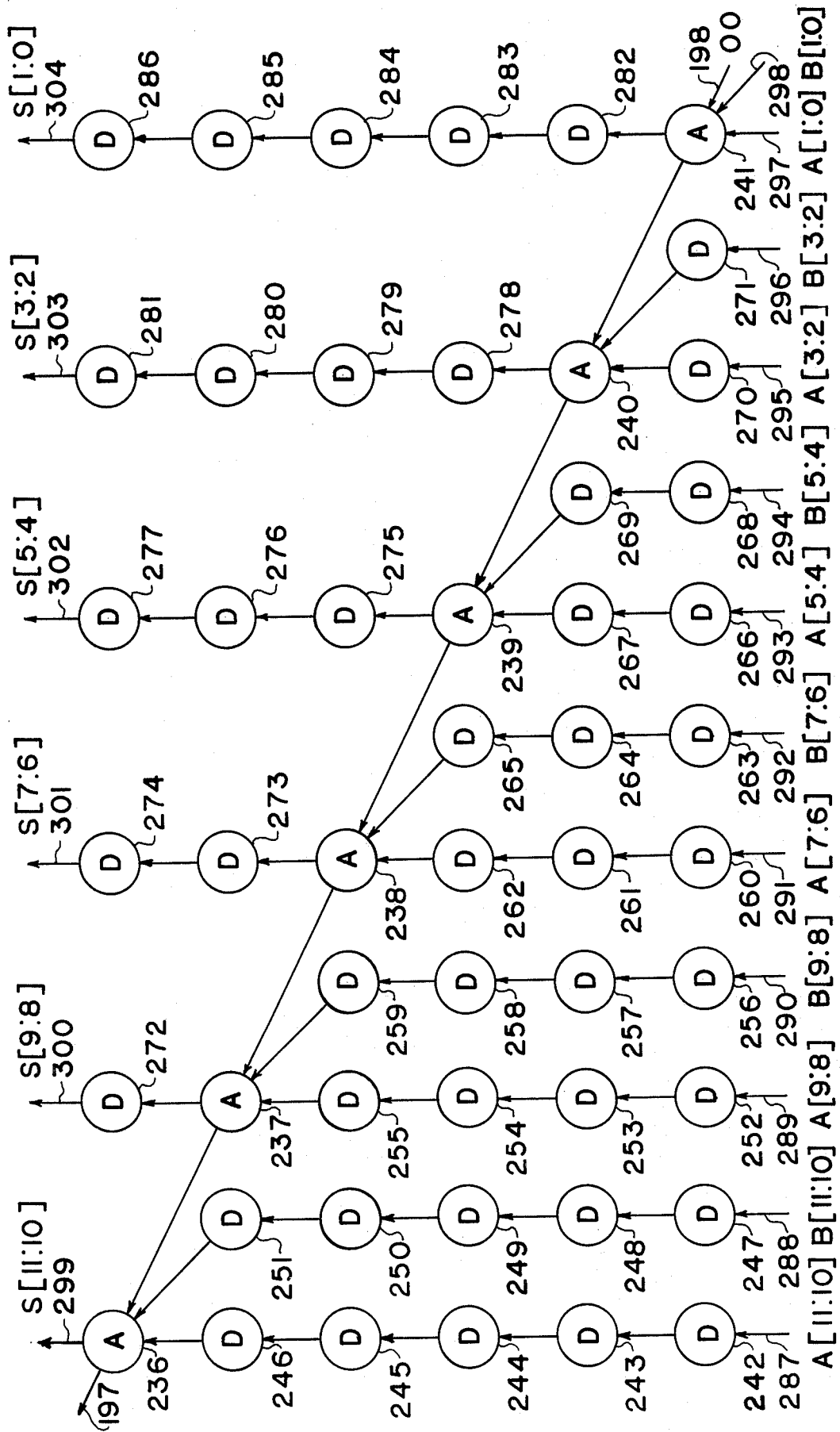
FIG. 19 illustrates nodes organized into a carry propagate adder.
Figure 20:
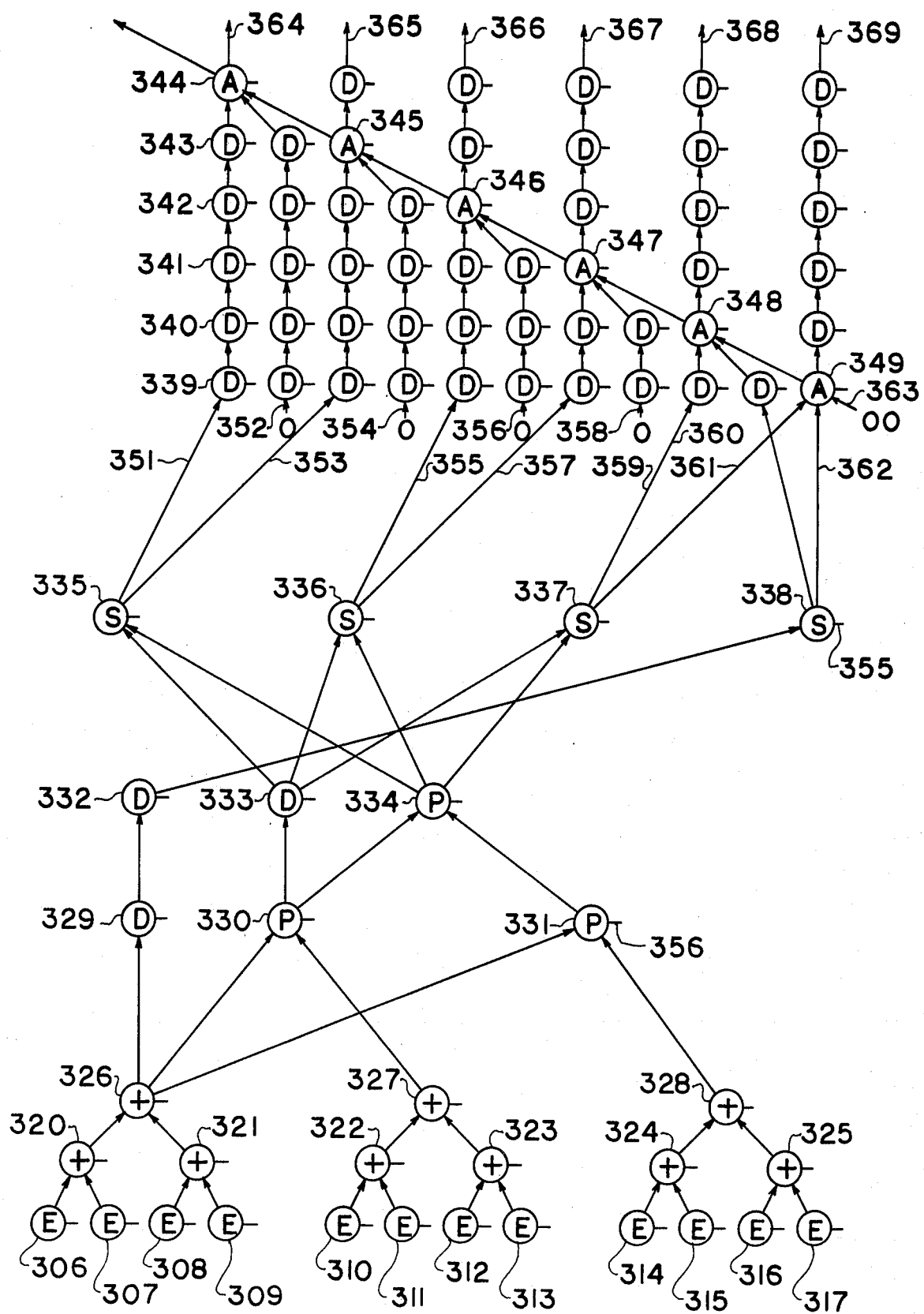
FIG. 20 illustrates a pipelined number theoretic summation processor.
Figure 21:
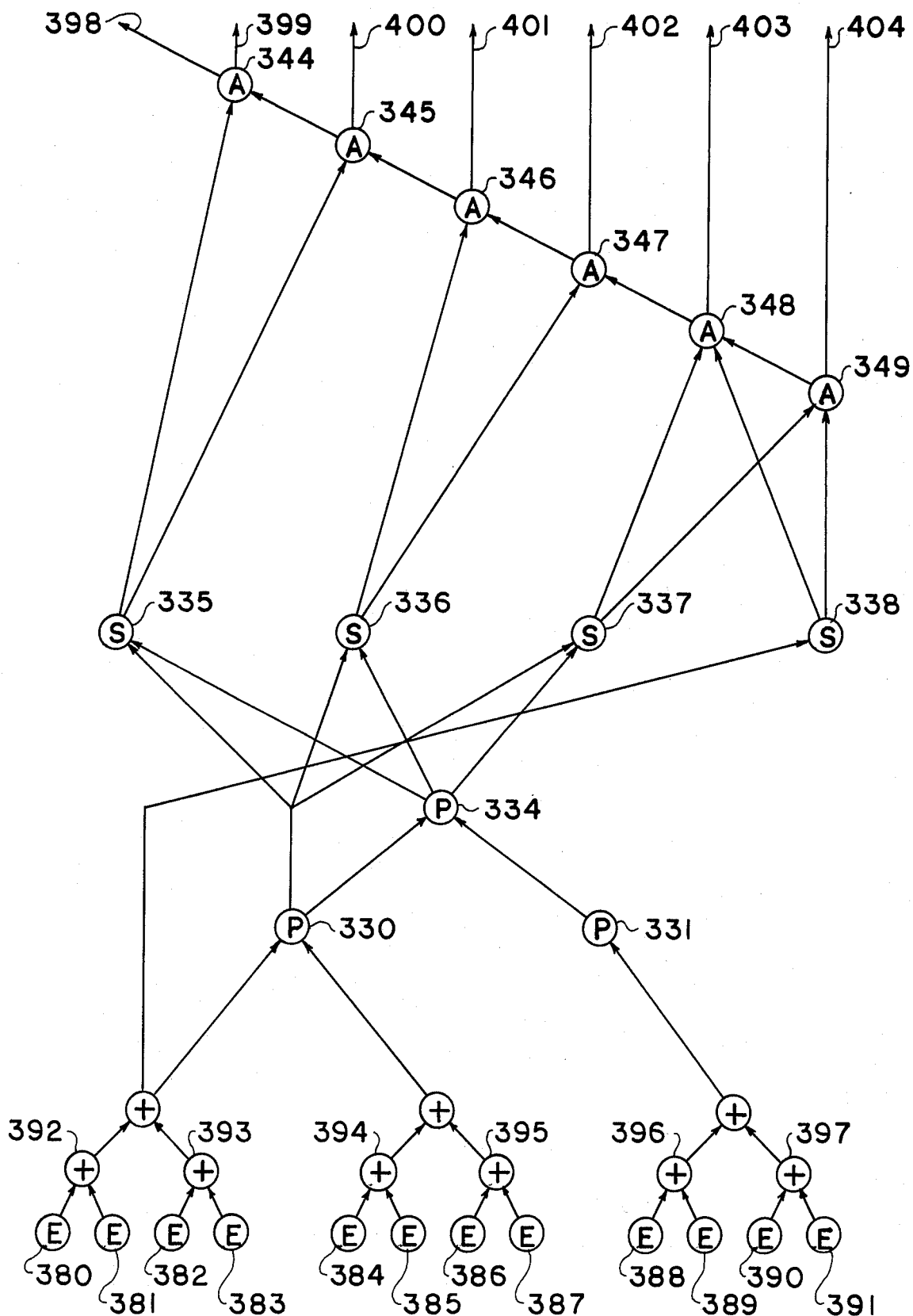
FIG. 21 illustrates a asynchronous number theoretic summation processor.
Figure 22:
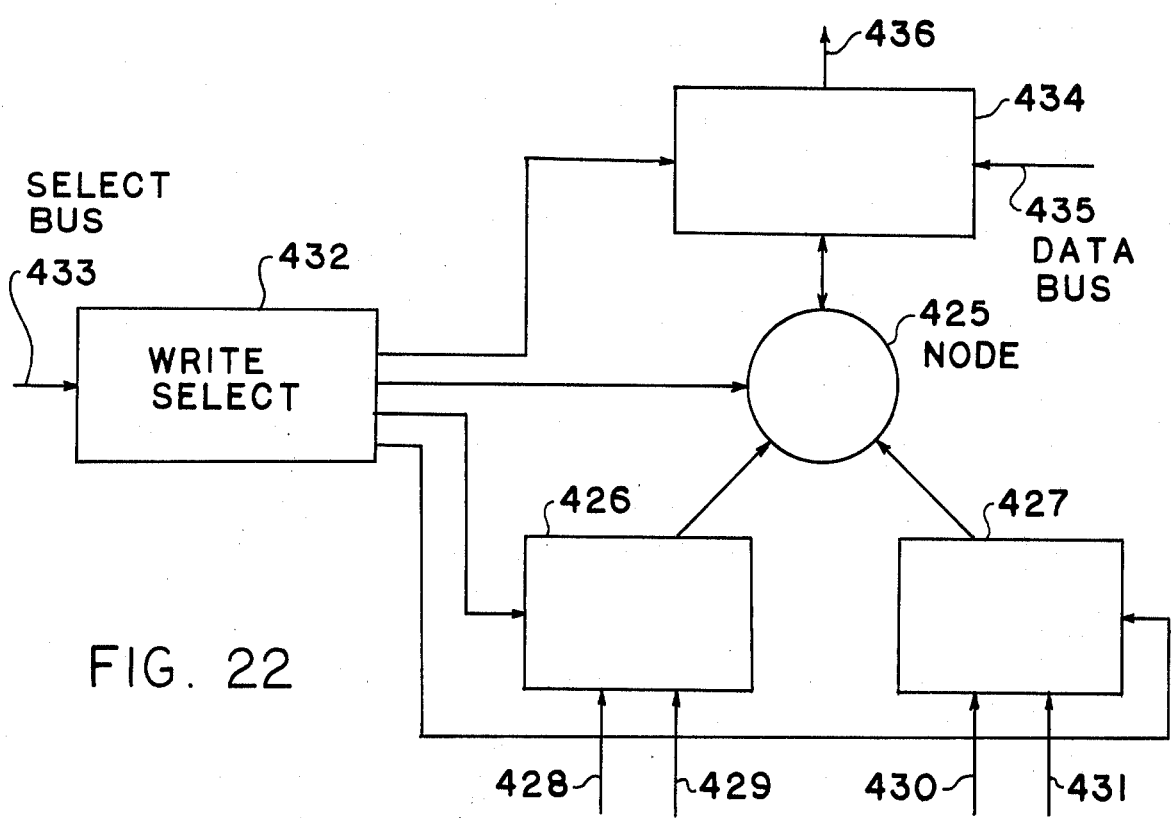
FIG. 22 illustrates a node which can be re-programmed.
Figure 32:
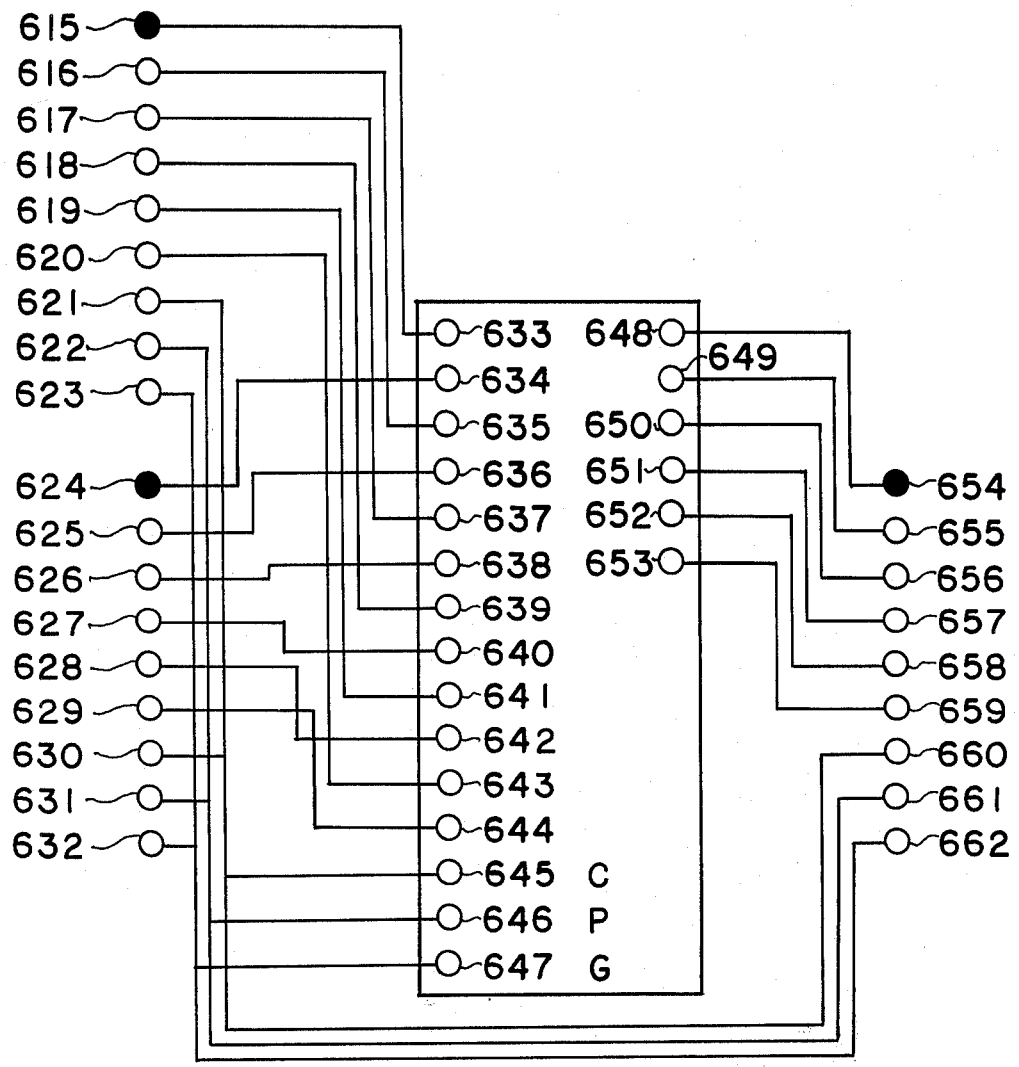
FIG. 32 illustrates a two input and one output module with interwoven inputs.
Figure 33:
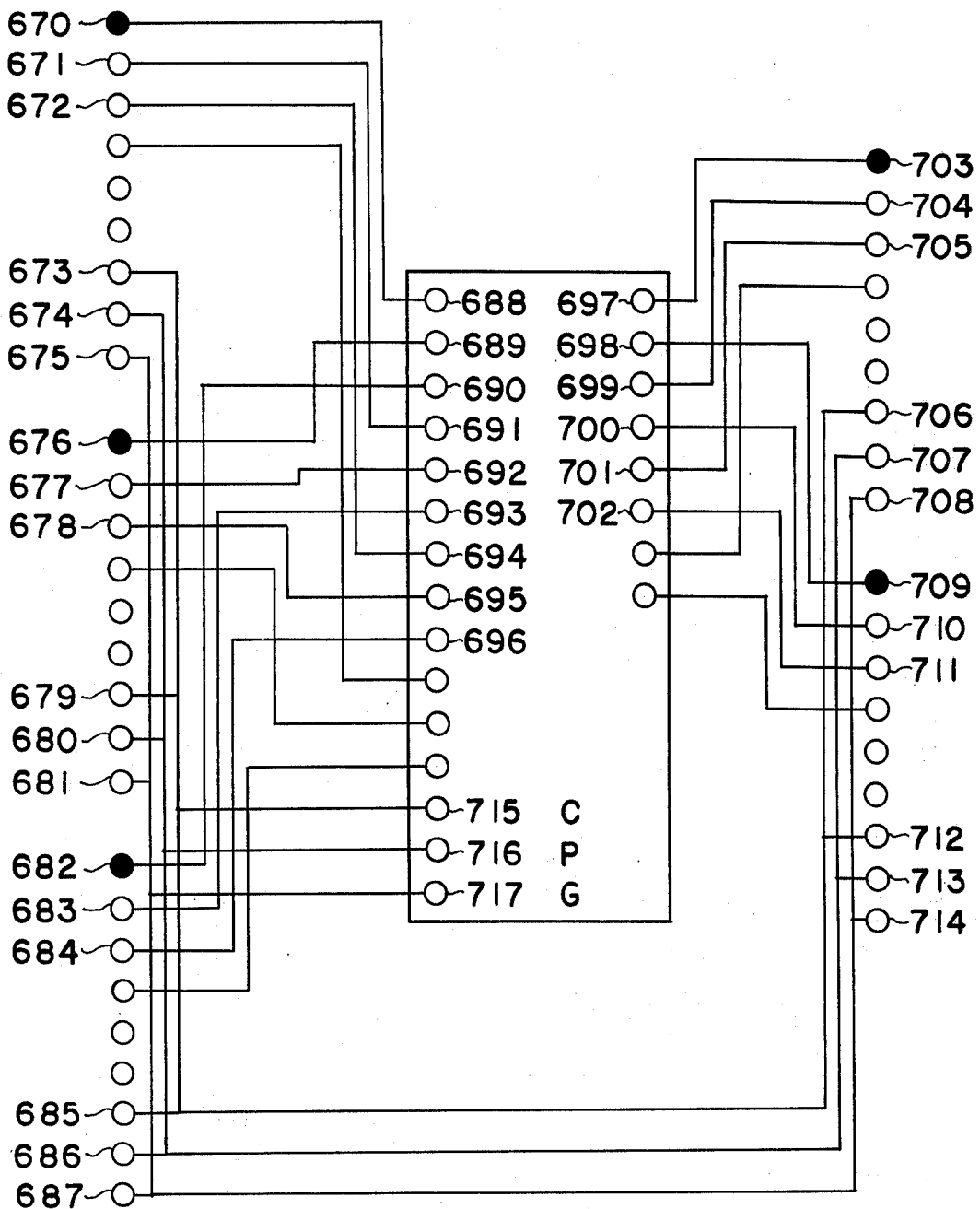
FIG. 33 illustrates a three input and two output module with interwoven inputs and outputs.
Figure 34:
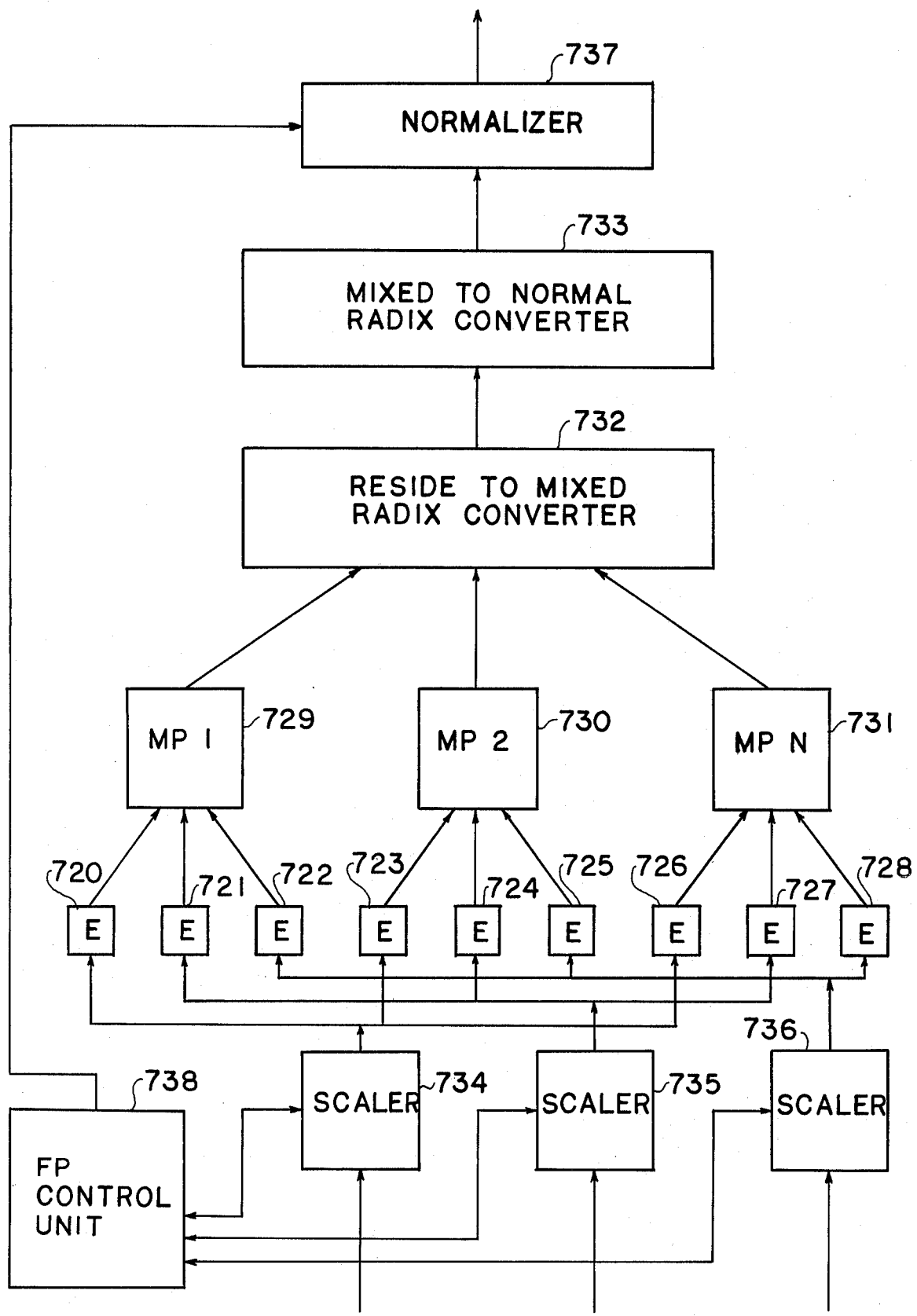
FIG. 34 is a block diagram illustrating a number theoretic processor which processes floating point numbers.

The explanation begins with an introduction to the mathematics. FIGS. 2-5 are then used to explain various approaches to encoding. Different types of modular processors are then discussed. A version to compute an inner product is shown in FIG. 7. Modular processors to perform summation, summation of multiple products, and summation of the square of differences are shown in FIGS. 6, 8, and 9 respectively. FIGS. 11 and 12 are used to explain the residue to mixed radix conversion unit. FIGS. 13-19 are used to show the various sections of a mixed radix to normal radix converter. FIG. 20 is used to demonstrate how the vector processors can be pipelined. An asynchronous version of the same processor is shown in FIG. 21. A node of a dynamically re-configurable processor is shown in FIG. 22. Various approaches to constructing such processors are shown in FIGS. 27-33. A floating point version of the processor is shown in FIG. 34.

To aid in clarifying the subsequent disclosure a few conventions are used. Bits are labeled $b_n, \ldots, b_1, b_0$ where $b_0$ is the least significant bit. The actions of the various nodes used to construct the processor are specified in an ALGOL like programming language. All the variables are assumed to be integers. The bits within a variable are specified by [m:n] where X[4:0] would denote bits $b_4, b_3, b_2, b_1,$ and $b_0$ of a variable X. Similarly X[m] would be used to denote bit $b_m$ of the variable X. The MOD(A, B) function which computes the remainder of A when divided by B is not consistently defined in the literature for negative values of A. To avoid ambiguity we will define it as shown in Table 1.

TABLE 1

Definition of the MOD Function

FUNCTION MOD (A, B)
INTEGER A, B, X;
X: = A − ((A/B)*B);
IF A <0 THEN X: = X + B;
MOD: = X;
RETURN

The residue number system is based on a n-tuple of integers $m_1, m_2, \ldots, m_n$ each of which is called a modulus. There can be any number of moduli and they can be of any size. They need only have no common factors. If M is defined as the product of the moduli then only between 0 and M-1 are the results of the arithmetic unique, otherwise an overflow would occur. For simplicity the moduli 5, 7, and 8 will be used for discussion.

TABLE 2

Equivalent Modular Expressions

MOD(A + B,MI) = MOD(A + MOD(B,MI),MI)
            = MOD(MOD(A,MI) + B,MI)
            = MOD(MOD(A,MI) + MOD(B,MI),MI)
            = MOD(MOD(A + B,MI),MI)

In the subsequent discussion several modular equivalents are used. The expressional equivalents of modular addition are shown in Table 2. The modular equivalent of the sum of A and B is equal to the modular equivalent of the sum of A and the modular equivalent of B; the modular equivalent of the sum of the modular equivalent of A and B; the modular equivalent of the sum of the modular equivalent of A and the modular equivalent of B; and the modular equivalent of the modular equivalent of the sum of A and B. These equivalents can and will be used interchangeably. The same types of equivalents exist for the operations of subtraction and multiplication.

The nodes which are the building blocks of the processor can be implemented with tables stored in memories. For this discussion memories of 64 words each 4 bits long will be used. Such a memory would have six input address lines and four output lines. The nodes either perform modular arithmetic, store constants, or perform three operand binary addition. Bits which are not used are marked with a X for clarity.

Nodes which perform modular arithmetic are implemented in the following manner. A modular 5 addition table is shown in Table 3.

TABLE 3

Modulus 5 Addition

|   | 0 | 1 | 2 | 3 | 4 |
|---|---|---|---|---|---|
| 0 | 0 | 1 | 2 | 3 | 4 |
| 1 | 1 | 2 | 3 | 4 | 0 |
| 2 | 2 | 3 | 4 | 0 | 1 |
| 3 | 3 | 4 | 0 | 1 | 2 |
| 4 | 4 | 0 | 1 | 2 | 3 |

This table is different from a conventional arithmetic table in that none of the operands or the sums ever exceed the value 4. The operands or sums can thus each be represented by 3 bits. This table can be stored in a memory. The 3 bits representing each operand can be combined to form an address as to where the associated sum can be stored. An algorithm to do this is shown in Table 4.

TABLE 4

Modulus 5 Addition Table

MI: = 5;
FOR ADDR: = 0 STEP 1 UNTIL 63 DO
BEGIN
OP1: = ADDR [2:0];
OP2: = ADDR[5:3];
IF OP1 <MI AND OP2 <MI THEN
MEM (ADDR): = MOD (OP1 + OP2, MI);
END;

MI is used to denote the modulus. It is set to 5. Each location of the memory is visited. Bits $b_5-b_3$ of the address are assumed to represent one operand, OP2, while bits $b_2-b_0$ are assumed to represent, OP1. If the operands are valid for the modulus, in other words OP1 and OP2 are each less than the modulus, then the modular equivalent of the sum of the operands is placed in the location.

Such a modulus 5 addition table is shown in Table 5. The addresses of the various locations are given in the first, third, and fifth columns. The contents corresponding to these locations are given in the second, fourth, and sixth columns. "XXXX" is used to denote the locations which have not been used.

TABLE 5

Modulus 5 Addition

| ADDRESS | CONT | ADDRESS | CONT | ADDRESS | CONT |
|---------|------|---------|------|---------|------|
| 000000 | X000 | 010101 | XXXX | 101010 | XXXX |
| 000001 | X001 | 010110 | XXXX | 101011 | XXXX |
| 000010 | X010 | 010111 | XXXX | 101100 | XXXX |
| 000011 | X011 | 011000 | X011 | 101101 | XXXX |
| 000100 | X100 | 011001 | X100 | 101110 | XXXX |
| 000101 | XXXX | 011010 | X000 | 101111 | XXXX |
| 000110 | XXXX | 011011 | X001 | 110000 | XXXX |
| 000111 | XXXX | 011100 | X010 | 110001 | XXXX |
| 001000 | X001 | 011101 | XXXX | 110010 | XXXX |
| 001001 | X010 | 011110 | XXXX | 110011 | XXXX |
| 001010 | X011 | 011111 | XXXX | 110100 | XXXX |
| 001011 | X100 | 100000 | X100 | 110101 | XXXX |
| 001100 | X000 | 100001 | X000 | 110110 | XXXX |
| 001101 | XXXX | 100010 | X001 | 110111 | XXXX |
| 001110 | XXXX | 100011 | X010 | 111000 | XXXX |
| 001111 | XXXX | 100100 | X011 | 111001 | XXXX |
| 010000 | X010 | 100101 | XXXX | 111010 | XXXX |
| 010001 | X011 | 100110 | XXXX | 111011 | XXXX |
| 010010 | X100 | 100111 | XXXX | 111100 | XXXX |
| 010011 | X000 | 101000 | XXXX | 111101 | XXXX |
| 010100 | X001 | 101001 | XXXX | 111110 | XXXX |
|        |      |        |      | 111111 | XXXX |

A table for modulus 7 addition can be generated with the algorithm shown in Table 4 by instead setting MI to 7. Such a table is shown in Table 6.

TABLE 6

Modulus 7 Addition

| ADDRESS | CONT | ADDRESS | CONT | ADDRESS | CONT |
|---------|------|---------|------|---------|------|
| 000000 | X000 | 010101 | X000 | 101010 | X000 |
| 000001 | X001 | 010110 | X001 | 101011 | X001 |
| 000010 | X010 | 010111 | XXXX | 101100 | X010 |
| 000011 | X011 | 011000 | X011 | 101101 | X011 |
| 000100 | X100 | 011001 | X100 | 101110 | X100 |
| 000101 | X101 | 011010 | X101 | 101111 | XXXX |
| 000110 | X110 | 011011 | X110 | 110000 | X110 |
| 000111 | XXXX | 011100 | X000 | 110001 | X000 |

TABLE 6-continued

Modulus 7 Addition

| ADDRESS | CONT | ADDRESS | CONT | ADDRESS | CONT |
|---------|------|---------|------|---------|------|
| 001000 | X001 | 011101 | X001 | 110010 | X001 |
| 001001 | X010 | 011110 | X010 | 110011 | X010 |
| 001010 | X011 | 011111 | XXXX. | 110100 | X011 |
| 001011 | X100 | 100000 | X100 | 110101 | X100 |
| 001100 | X101 | 100001 | X101 | 110110 | X101 |
| 001101 | X110 | 100010 | X110 | 110111 | XXXX |
| 001110 | X000 | 100011 | X000 | 111000 | XXXX |
| 001111 | XXXX | 100100 | X001 | 111001 | XXXX |
| 010000 | X010 | 100101 | X010 | 111010 | XXXX |
| 010001 | X011 | 100110 | X011 | 111011 | XXXX |
| 010010 | X100 | 100111 | XXXX | 111100 | XXXX |
| 010011 | X101 | 101000 | X101 | 111101 | XXXX |
| 010100 | X110 | 101001 | X110 | 111110 | XXXX |
|  |  |  |  | 111111 | XXXX |

A table for modulus 8 addition can be generated by setting MI to 8. Such a table is shown in Table 7.

TABLE 7

Modulus 8 Addition

| ADDRESS | CONT | ADDRESS | CONT | ADDRESS | CONT |
|---------|------|---------|------|---------|------|
| 000000 | X000 | 010101 | X111 | 101010 | X111 |
| 000001 | X001 | 010110 | X000 | 101011 | X000 |
| 000010 | X010 | 010111 | X001 | 101100 | X001 |
| 000011 | X011 | 011000 | X011 | 101101 | X010 |
| 000100 | X100 | 011001 | X100 | 101110 | X011 |
| 000101 | X101 | 011010 | X101 | 101111 | X100 |
| 000110 | X110 | 011011 | X110 | 110000 | X110 |
| 000111 | X111 | 011100 | X111 | 110001 | X111 |
| 001000 | X001 | 011101 | X000 | 110010 | X000 |
| 001001 | X010 | 011110 | X001 | 110011 | X001 |
| 001010 | X011 | 011111 | X010 | 110100 | X010 |
| 001011 | X100 | 100000 | X100 | 110101 | X011 |
| 001100 | X101 | 100001 | X101 | 110110 | X100 |
| 001101 | X110 | 100010 | X110 | 110111 | X101 |
| 001110 | X111 | 100011 | X111 | 111000 | X111 |
| 001111 | X000 | 100100 | X000 | 111001 | X000 |
| 010000 | X010 | 100101 | X001 | 111010 | X001 |
| 010001 | X011 | 100110 | X010 | 111011 | X010 |
| 010010 | X100 | 100111 | X011 | 111100 | X011 |
| 010011 | X101 | 101000 | X101 | 111101 | X100 |
| 010100 | X110 | 101001 | X110 | 111110 | X101 |
|  |  |  |  | 111111 | X110 |

A table can be generated to perform modulus 5 subtraction. An algorithm to accomplish this is shown in Table 8.

TABLE 8

Algorithm for Modulus 5 Subtraction Table

MI: = 5;
FOR ADDR: = 0 STEP 1 UNTIL 63 DO
BEGIN
OP1: = ADDR[2:0];
OP2: = ADDR[5:3];
IF OP1<MI AND OP2<MI THEN
MEM(ADDR): = MOD (OP1 − OP2, MI);
END;

MI which denotes the modulus is set to 5. Every location of the memory is visited. Bits $b_5$–$b_3$ of the address are assumed to represent the operand, OP2, the subtrahend, while bits $b_2$–$b_0$ represent OP1, the minuend. If these operands are valid for the modulus MI then the modular difference of the operands is stored at this location. Such a table is shown in Table 9.

TABLE 9

Modulus 5 Subtraction

| ADDRESS | CONT | ADDRESS | CONT | ADDRESS | CONT |
|---------|------|---------|------|---------|------|
| 000000 | X000 | 010101 | XXXX | 101010 | XXXX |

TABLE 9-continued

Modulus 5 Subtraction

| ADDRESS | CONT | ADDRESS | CONT | ADDRESS | CONT |
|---------|------|---------|------|---------|------|
| 000001 | X001 | 010110 | XXXX | 101011 | XXXX |
| 000010 | X010 | 010111 | XXXX | 101100 | XXXX |
| 000011 | X011 | 011000 | X010 | 101101 | XXXX |
| 000100 | X100 | 011001 | X011 | 101110 | XXXX |
| 000101 | XXXX | 011010 | X100 | 101111 | XXXX |
| 000110 | XXXX | 011011 | X000 | 110000 | XXXX |
| 000111 | XXXX | 011100 | X001 | 110001 | XXXX |
| 001000 | X100 | 011101 | XXXX | 110010 | XXXX |
| 001001 | X000 | 011110 | XXXX | 110011 | XXXX |
| 001010 | X001 | 011111 | XXXX | 110100 | XXXX |
| 001011 | X010 | 100000 | X001 | 110101 | XXXX |
| 001100 | X011 | 100001 | X010 | 110110 | XXXX |
| 001101 | XXXX | 100010 | X011 | 110111 | XXXX |
| 001110 | XXXX | 100011 | X100 | 111000 | XXXX |
| 001111 | XXXX | 100100 | X000 | 111001 | XXXX |
| 010000 | X011 | 100101 | XXXX | 111010 | XXXX |
| 010001 | X100 | 100110 | XXXX | 111011 | XXXX |
| 010010 | X000 | 100111 | XXXX | 111100 | XXXX |
| 010011 | X001 | 101000 | XXXX | 111101 | XXXX |
| 010100 | X010 | 101001 | XXXX | 111110 | XXXX |
|  |  |  |  | 111111 | XXXX |

A table for modulus 7 subtraction can be generated with the algorithm shown in Table 8 by setting MI to 7. Such a table is shown in Table 10.

TABLE 10

Modulus 7 Subtraction

| ADDRESS | CONT | ADDRESS | CONT | ADDRESS | CONT |
|---------|------|---------|------|---------|------|
| 000000 | X000 | 010101 | X011 | 101010 | X100 |
| 000001 | X001 | 010110 | X100 | 101011 | X101 |
| 000010 | X010 | 010111 | XXXX | 101100 | X110 |
| 000011 | X011 | 011000 | X100 | 101101 | X000 |
| 000100 | X100 | 011001 | X101 | 101110 | X001 |
| 000101 | X101 | 011010 | X110 | 101111 | XXXX |
| 000110 | X110 | 011011 | X000 | 110000 | X001 |
| 000111 | XXXX | 011100 | X001 | 110001 | X010 |
| 001000 | X110 | 011101 | X010 | 110010 | X011 |
| 001001 | X000 | 011110 | X011 | 110011 | X100 |
| 001010 | X001 | 011111 | XXXX | 110100 | X101 |
| 001011 | X010 | 100000 | X011 | 110101 | X110 |
| 001100 | X011 | 100001 | X100 | 110110 | X000 |
| 001101 | X100 | 100010 | X101 | 110111 | XXXX |
| 001110 | X101 | 100011 | X110 | 111000 | XXXX |
| 001111 | XXXX | 100100 | X000 | 111001 | XXXX |
| 010000 | X101 | 100101 | X001 | 111010 | XXXX |
| 010001 | X110 | 100110 | X010 | 111011 | XXXX |
| 010010 | X000 | 100111 | XXXX | 111100 | XXXX |
| 010011 | X001 | 101000 | X010 | 111101 | XXXX |
| 010100 | X010 | 101001 | X011 | 111110 | XXXX |
|  |  |  |  | 111111 | XXXX |

A table for modulus 8 subtraction can also be generated by setting MI to 8. Such a table is shown in Table 11.

TABLE 11

Modulus 8 Subtraction

| ADDRESS | CONT | ADDRESS | CONT | ADDRESS | CONT |
|---------|------|---------|------|---------|------|
| 000000 | X000 | 010101 | X011 | 101010 | X101 |
| 000001 | X001 | 010110 | X100 | 101011 | X110 |
| 000010 | X010 | 010111 | X101 | 101100 | X111 |
| 000011 | X011 | 011000 | X101 | 101101 | X000 |
| 000100 | X100 | 011001 | X110 | 101110 | X001 |
| 000101 | X101 | 011010 | X111 | 101111 | X010 |
| 000110 | X110 | 011011 | X000 | 110000 | X010 |
| 000111 | X111 | 011100 | X001 | 110001 | X011 |
| 001000 | X111 | 011101 | X010 | 110010 | X100 |
| 001001 | X000 | 011110 | X011 | 110011 | X101 |
| 001010 | X001 | 011111 | X100 | 110100 | X110 |
| 001011 | X010 | 100000 | X100 | 110101 | X111 |
| 001100 | X011 | 100001 | X101 | 110110 | X000 |
| 001101 | X100 | 100010 | X110 | 110111 | X001 |
| 001110 | X101 | 100011 | X111 | 111000 | X001 |

TABLE 11-continued

| Modulus 8 Subtraction | | | | | |
|---|---|---|---|---|---|
| ADDRESS | CONT | ADDRESS | CONT | ADDRESS | CONT |
| 001111 | X110 | 100100 | X000 | 111001 | X010 |
| 010000 | X110 | 100101 | X001 | 111010 | X011 |
| 010001 | X111 | 100110 | X010 | 111011 | X100 |
| 010010 | X000 | 100111 | X011 | 111100 | X101 |
| 010011 | X001 | 101000 | X011 | 111101 | X110 |
| 010100 | X010 | 101001 | X100 | 111110 | X111 |
| | | | | 111111 | X000 |

A table can be generated to perform modular 5 multiplication. An algorithm to accomplish this is shown in Table 12.

TABLE 12

A Modulus 5 Multiplication Table

```
MI: = 5;
FOR ADDR: = 0 STEP 1 UNTIL 63 DO
  BEGIN
    OP1: = ADDR[2:0];
    OP2: = ADDR [5:3];
    IF OP1<MI AND OP2<MI THEN
      MEM(ADDR): = MOD (OP1*OP2, MI);
  END;
```

MI which denotes the modulus is set to 5. Every location of the memory is visited. Bits $b_5$–$b_3$ of the address are assumed to represent operand OP2 while bits $b_2$–$b_0$ represent OP1. If these operands are valid for the modulus MI then the modular product of the operands is stored in this location. Such a table is shown in Table 13.

TABLE 13

| Modulus 5 Multiplication | | | | | |
|---|---|---|---|---|---|
| ADDRESS | CONT | ADDRESS | CONT | ADDRESS | CONT |
| 000000 | X000 | 010101 | XXXX | 101010 | XXXX |
| 000001 | X000 | 010110 | XXXX | 101011 | XXXX |
| 000010 | X000 | 010111 | XXXX | 101100 | XXXX |
| 000011 | X000 | 011000 | X000 | 101101 | XXXX |
| 000100 | X000 | 011001 | X011 | 101110 | XXXX |
| 000101 | XXXX | 011010 | X001 | 101111 | XXXX |
| 000110 | XXXX | 011011 | X100 | 110000 | XXXX |
| 000111 | XXXX | 011100 | X010 | 110001 | XXXX |
| 001000 | X000 | 011101 | XXXX | 110010 | XXXX |
| 001001 | X001 | 011110 | XXXX | 110011 | XXXX |
| 001010 | X010 | 011111 | XXXX | 110100 | XXXX |
| 001011 | X011 | 100000 | X000 | 110101 | XXXX |
| 001100 | X100 | 100001 | X100 | 110110 | XXXX |
| 001101 | XXXX | 100010 | X011 | 110111 | XXXX |
| 001110 | XXXX | 100011 | X010 | 111000 | XXXX |
| 001111 | XXXX | 100100 | X001 | 111001 | XXXX |
| 010000 | X000 | 100101 | XXXX | 111010 | XXXX |
| 010001 | X010 | 100110 | XXXX | 111011 | XXXX |
| 010010 | X100 | 100111 | XXXX | 111100 | XXXX |
| 010011 | X001 | 101000 | XXXX | 111101 | XXXX |
| 010100 | X011 | 101001 | XXXX | 111110 | XXXX |
| | | | | 111111 | XXXX |

A table for modulus 7 multiplication can be generated with the algorithm shown in Table 12 by setting MI to 7. Such a table is shown in Table 14.

TABLE 14

| Modulus 7 Multiplication | | | | | |
|---|---|---|---|---|---|
| ADDRESS | CONT | ADDRESS | CONT | ADDRESS | CONT |
| 000000 | X000 | 010101 | X011 | 101010 | X011 |
| 000001 | X000 | 010110 | X101 | 101011 | X001 |
| 000010 | X000 | 010111 | XXXX | 101100 | X110 |
| 000011 | X000 | 011000 | X000 | 101101 | X100 |
| 000100 | X000 | 011001 | X011 | 101110 | X010 |
| 000101 | X000 | 011010 | X110 | 101111 | XXXX |
| 000110 | X000 | 011011 | X010 | 110000 | X000 |

TABLE 14-continued

| Modulus 7 Multiplication | | | | | |
|---|---|---|---|---|---|
| ADDRESS | CONT | ADDRESS | CONT | ADDRESS | CONT |
| 000111 | XXXX | 011100 | X101 | 110001 | X110 |
| 001000 | X000 | 011101 | X001 | 110010 | X101 |
| 001001 | X001 | 011110 | X100 | 110011 | X100 |
| 001010 | X010 | 011111 | XXXX | 110100 | X011 |
| 001011 | X011 | 100000 | X000 | 110101 | X010 |
| 001100 | X100 | 100001 | X100 | 110110 | X001 |
| 001101 | X101 | 100010 | X001 | 110111 | XXXX |
| 001110 | X110 | 100011 | X101 | 111000 | XXXX |
| 001111 | XXXX | 100100 | X010 | 111001 | XXXX |
| 010000 | X000 | 100101 | X110 | 111010 | XXXX |
| 010001 | X010 | 100110 | X011 | 111011 | XXXX |
| 010010 | X100 | 100111 | XXXX | 111100 | XXXX |
| 010011 | X110 | 101000 | X000 | 111101 | XXXX |
| 010100 | X001 | 101001 | X101 | 111110 | XXXX |
| | | | | 111111 | XXXX |

A table for modulus 8 multiplication can also be generated by setting MI to 8. Such a table is shown in Table 15.

TABLE 15

| Modulus 8 Multiplication | | | | | |
|---|---|---|---|---|---|
| ADDRESS | CONT | ADDRESS | CONT | ADDRESS | CONT |
| 000000 | X000 | 010101 | X010 | 101010 | X010 |
| 000001 | X000 | 010110 | X100 | 101011 | X111 |
| 000010 | X000 | 010111 | X110 | 101100 | X100 |
| 000011 | X000 | 011000 | X000 | 101101 | X001 |
| 000100 | X000 | 011001 | X011 | 101110 | X110 |
| 000101 | X000 | 011010 | X110 | 101111 | X011 |
| 000110 | X000 | 011011 | X001 | 110000 | X000 |
| 000111 | X000 | 011100 | X100 | 110001 | X110 |
| 001000 | X000 | 011101 | X111 | 110010 | X100 |
| 001001 | X001 | 011110 | X010 | 110011 | X010 |
| 001010 | X010 | 011111 | X101 | 110100 | X000 |
| 001011 | X011 | 100000 | X000 | 110101 | X110 |
| 001100 | X100 | 100001 | X100 | 110110 | X100 |
| 001101 | X101 | 100010 | X000 | 110111 | X010 |
| 001110 | X110 | 100011 | X100 | 111000 | X000 |
| 001111 | X111 | 100100 | X000 | 111001 | X111 |
| 010000 | X000 | 100101 | X100 | 111010 | X110 |
| 010001 | X010 | 100110 | X000 | 111011 | X101 |
| 010010 | X100 | 100111 | X100 | 111100 | X100 |
| 010011 | X110 | 101000 | X000 | 111101 | X011 |
| 010100 | X000 | 101001 | X101 | 111110 | X010 |
| | | | | 111111 | X001 |

Tables can also be constructed to perform integer polynomial transforms. The polynomials can be of any degree, however the coefficients and exponents must be integers. The polynomials can be single variabled such as $P(x) = x^3 - 2x^2 + 5$ or multi-variabled such as $P(x,y) = x^2 - xy + y^2$. The limit on the number of variables is the address space. There must be sufficient room to represent each operand. For the moduli 5, 7, and 8 each operand requires 3 bits thus a single operand transforms requires only 3 bits of address while a double operand transform would require 6 bits. The algorithm to generate a modulus 5 table for the polynomial transform $P(x) = (x-y)^2 = x^2 - 2xy + y^2$ is shown in Table 16.

TABLE 16

A Polynomial Transform for Modulus 5.

```
MI: = 5;
FOR ADDR: = 0 STEP 1 UNTIL 63 DO
BEGIN
  OP1: = ADDR[2:0];
  OP2: = ADDR [5:3];
  IF OP1<MI AND OP2<MI THEN
    MEM(ADDR): = MOD (OP2**2 - 2*OP1*OP2 + OP1**2, MI);
```

TABLE 16-continued

A Polynomial Transform for Modulus 5.

END;

MI which denotes the modulus is set to 5. Every location of the memory is visited. Bits $b_5$–$b_3$ of the address are assumed to represent, x, the operand OP2; while bits $b_2$–$b_0$ represent y, the operand OP1. If the operands are valid for modulus MI then the modular equivalent of the sum of OP2 squared minus twice the product of OP1 and OP2 plus OP1 squared is stored at that location in memory. Such a table is shown in Table 17.

TABLE 17

Square of the Difference for Modulus 5

| ADDRESS | CONT | ADDRESS | CONT | ADDRESS | CONT |
|---|---|---|---|---|---|
| 000000 | X000 | 010101 | XXXX | 101010 | XXXX |
| 000001 | X001 | 010110 | XXXX | 101011 | XXXX |
| 000010 | X100 | 010111 | XXXX | 101100 | XXXX |
| 000011 | X100 | 011000 | X100 | 101101 | XXXX |
| 000100 | X001 | 011001 | X100 | 101110 | XXXX |
| 000101 | XXXX | 011010 | X001 | 101111 | XXXX |
| 000110 | XXXX | 011011 | X000 | 110000 | XXXX |
| 000111 | XXXX | 011100 | X001 | 110001 | XXXX |
| 001000 | X001 | 011101 | XXXX | 110010 | XXXX |
| 001001 | X000 | 011110 | XXXX | 110011 | XXXX |
| 001010 | X001 | 011111 | XXXX | 110100 | XXXX |
| 001011 | X100 | 100000 | X001 | 110101 | XXXX |
| 001100 | X100 | 100001 | X100 | 110110 | XXXX |
| 001101 | XXXX | 100010 | X100 | 110111 | XXXX |
| 001110 | XXXX | 100011 | X001 | 111000 | XXXX |
| 001111 | XXXX | 100100 | X000 | 111001 | XXXX |
| 010000 | X100 | 100101 | XXXX | 111010 | XXXX |
| 010001 | X001 | 100110 | XXXX | 111011 | XXXX |
| 010010 | X000 | 100111 | XXXX | 111100 | XXXX |
| 010011 | X001 | 101000 | XXXX | 111101 | XXXX |
| 010100 | X100 | 101001 | XXXX | 111110 | XXXX |
|  |  |  |  | 111111 | XXXX |

A table for modulus 7 version for the same polynomial transform can be generated by the algorithm shown in Table 16 by setting MI to 7. Such a table is shown in Table 18.

TABLE 18

Square of the Difference for Modulus 7

| ADDRESS | CONT | ADDRESS | CONT | ADDRESS | CONT |
|---|---|---|---|---|---|
| 000000 | X000 | 010101 | X010 | 101010 | X010 |
| 000001 | X001 | 010110 | X010 | 101011 | X100 |
| 000010 | X100 | 010111 | XXXX | 101100 | X001 |
| 000011 | X010 | 011000 | X010 | 101101 | X000 |
| 000100 | X010 | 011001 | X100 | 101110 | X001 |
| 000101 | X100 | 011010 | X001 | 101111 | XXXX |
| 000110 | X001 | 011011 | X000 | 110000 | X001 |
| 000111 | XXXX | 011100 | X001 | 110001 | X100 |
| 001000 | X001 | 011101 | X100 | 110010 | X010 |
| 001001 | X000 | 011110 | X010 | 110011 | X010 |
| 001010 | X001 | 011111 | XXXX | 110100 | X100 |
| 001011 | X100 | 100000 | X010 | 110101 | X001 |
| 001100 | X010 | 100001 | X010 | 110110 | X000 |
| 001101 | X010 | 100010 | X100 | 110111 | XXXX |
| 001110 | X100 | 100011 | X001 | 111000 | XXXX |
| 001111 | XXXX | 100100 | X000 | 111001 | XXXX |
| 010000 | X100 | 100101 | X001 | 111010 | XXXX |
| 010001 | X001 | 100110 | X100 | 111011 | XXXX |
| 010010 | X000 | 100111 | XXXX | 111100 | XXXX |
| 010011 | X001 | 101000 | X100 | 111101 | XXXX |
| 010100 | X100 | 101001 | X010 | 111110 | XXXX |
|  |  |  |  | 111111 | XXXX |

A table for a modular 8 version of the same polynomial transform can also be generated by the algorithm shown in Table 16 by setting MI to 8. Such a table is shown in Table 19.

TABLE 19

Square of the Difference for Modulus 8

| ADDRESS | CONT | ADDRESS | CONT | ADDRESS | CONT |
|---|---|---|---|---|---|
| 000000 | X000 | 010101 | X001 | 101010 | X001 |
| 000001 | X001 | 010110 | X000 | 101011 | X100 |
| 000010 | X100 | 010111 | X001 | 101100 | X001 |
| 000011 | X001 | 011000 | X001 | 101101 | X000 |
| 000100 | X000 | 011001 | X100 | 101110 | X001 |
| 000101 | X001 | 011010 | X001 | 101111 | X100 |
| 000110 | X100 | 011011 | X000 | 110000 | X100 |
| 000111 | X001 | 011100 | X001 | 110001 | X001 |
| 001000 | X001 | 011101 | X100 | 110010 | X000 |
| 001001 | X000 | 011110 | X001 | 110011 | X001 |
| 001010 | X001 | 011111 | X000 | 110100 | X100 |
| 001011 | X100 | 100000 | X000 | 110101 | X001 |
| 001100 | X001 | 100001 | X001 | 110110 | X000 |
| 001101 | X000 | 100010 | X100 | 110111 | X001 |
| 001110 | X001 | 100011 | X001 | 111000 | X001 |
| 001111 | X100 | 100100 | X000 | 111001 | X100 |
| 010000 | X100 | 100101 | X001 | 111010 | X001 |
| 010001 | X001 | 100110 | X100 | 111011 | X000 |
| 010010 | X000 | 100111 | X001 | 111100 | X001 |
| 010011 | X001 | 101000 | X001 | 111101 | X100 |
| 010100 | X100 | 101001 | X000 | 111110 | X001 |
|  |  |  |  | 111111 | X000 |

Modular arithmetic tables for moduli 5, 7, and 8 have been constructed. This procedure can be extended to other polynomials, moduli and memory sizes.

In some implementations of this processor delay nodes are necessary. Such a node would just replicate its input at its output at a later time. This can be performed by a polynomial transform of the type $P(x)=x$. The algorithm associated with such a node for modulus 5 is shown in Table 20.

TABLE 20

Delay Node for Modulus 5

MI: = 5;
FOR ADDR: = 0 STEP 1 UNTIL 63 DO
  BEGIN
  OP1: = ADDR[2:0];
  DC: = ADDR[5:3];
  IF DC = 0 AND OP1 < MI THEN
  M(ADDR): = OP1;
  END;

MI is set to 5. The memory is scanned. Bits $b_2$–$b_0$ of the address are assumed to represent the operand OP1. Bits $b_5$–$b_3$ of the address labeled DC are not needed and are assumed to be 0 for clarity. If the DC is 0 and OP1 is a proper operand for the modulus then OP1 is placed in this location. Such a table is shown in Table 21.

TABLE 21

Delay Unit for Modulus 5

| ADDRESS | CONT | ADDRESS | CONT | ADDRESS | CONT |
|---|---|---|---|---|---|
| 000000 | X000 | 010101 | XXXX | 101010 | XXXX |
| 000001 | X001 | 010110 | XXXX | 101011 | XXXX |
| 000010 | X010 | 010111 | XXXX | 101100 | XXXX |
| 000011 | X011 | 011000 | XXXX | 101101 | XXXX |
| 000100 | X100 | 011001 | XXXX | 101110 | XXXX |
| 000101 | XXXX | 011010 | XXXX | 101111 | XXXX |
| 000110 | XXXX | 011011 | XXXX | 110000 | XXXX |
| 000111 | XXXX | 011100 | XXXX | 110001 | XXXX |
| 001000 | XXXX | 011101 | XXXX | 110010 | XXXX |
| 001001 | XXXX | 011110 | XXXX | 110011 | XXXX |
| 001010 | XXXX | 011111 | XXXX | 110100 | XXXX |
| 001011 | XXXX | 100000 | XXXX | 110101 | XXXX |
| 001100 | XXXX | 100001 | XXXX | 110110 | XXXX |
| 001101 | XXXX | 100010 | XXXX | 110111 | XXXX |
| 001110 | XXXX | 100011 | XXXX | 111000 | XXXX |
| 001111 | XXXX | 100100 | XXXX | 111001 | XXXX |

TABLE 21-continued

| Delay Unit for Modulus 5 | | | | | |
|---|---|---|---|---|---|
| ADDRESS | CONT | ADDRESS | CONT | ADDRESS | CONT |
| 010000 | XXXX | 100101 | XXXX | 111010 | XXXX |
| 010001 | XXXX | 100110 | XXXX | 111011 | XXXX |
| 010010 | XXXX | 100111 | XXXX | 111100 | XXXX |
| 010011 | XXXX | 101000 | XXXX | 111101 | XXXX |
| 010100 | XXXX | 101001 | XXXX | 111110 | XXXX |
| | | | | 111111 | XXXX |

This approach can be extended to other moduli by appropriately setting MI in the algorithm of Table 20.

In the previous approach different delay nodes would be needed for different moduli. A delay node can be implemented which can handle many different moduli. The approach involves duplicating exactly what is in the operand field of the address regardless of the fact it might not be a valid operand for a particular modulus. An algorithm to generate a delay table for all moduli expressible with 3 bits is shown in Table 21A.

TABLE 21A

| Delay Node for 3 Bit Moduli |
|---|
| FOR ADDR: = 0 STEP 1 UNITL 63 DO |
|    BEGIN |
|      OP1: = ADDR[2:0]; |
|      M(ADDR): = OP1; |
|    END; |

The memory is scanned. The operand field, bits $b_2$–$b_0$ of the address is placed in each location. Such a table is shown in Table 22. It will act as a delay node for any modulus less or equal to 8.

TABLE 22

| Delay Unit for Any Modulus Less or Equal to 8 | | | | | |
|---|---|---|---|---|---|
| ADDRESS | CONT | ADDRESS | CONT | ADDRESS | CONT |
| 000000 | X000 | 010101 | XXXX | 101010 | XXXX |
| 000001 | X001 | 010110 | XXXX | 101011 | XXXX |
| 000010 | X010 | 010111 | XXXX | 101100 | XXXX |
| 000011 | X011 | 011000 | XXXX | 101101 | XXXX |
| 000100 | X100 | 011001 | XXXX | 101110 | XXXX |
| 000101 | X101 | 011010 | XXXX | 101111 | XXXX |
| 000110 | X110 | 011011 | XXXX | 110000 | XXXX |
| 000111 | X111 | 011100 | XXXX | 110001 | XXXX |
| 001000 | XXXX | 011101 | XXXX | 110010 | XXXX |
| 001001 | XXXX | 011110 | XXXX | 110011 | XXXX |
| 001010 | XXXX | 011111 | XXXX | 110100 | XXXX |
| 001011 | XXXX | 100000 | XXXX | 110101 | XXXX |
| 001100 | XXXX | 100001 | XXXX | 110110 | XXXX |
| 001101 | XXXX | 100010 | XXXX | 110111 | XXXX |
| 001110 | XXXX | 100011 | XXXX | 111000 | XXXX |
| 001111 | XXXX | 100100 | XXXX | 111001 | XXXX |
| 010000 | XXXX | 100101 | XXXX | 111010 | XXXX |
| 010001 | XXXX | 100110 | XXXX | 111011 | XXXX |
| 010010 | XXXX | 100111 | XXXX | 111100 | XXXX |
| 010011 | XXXX | 101000 | XXXX | 111101 | XXXX |
| 010100 | XXXX | 101001 | XXXX | 111110 | XXXX |
| | | | | 111111 | XXXX |

As an example 111 of modulus 8 produces an address of 000111 when combined with the unused bits which are assumed to be 0. Stored at this location in Table 22 is 111.

These tables are quite sparse. This is due to the fact that half of the address space is not used. Suppose that each location of the memory was 6 bits long instead of 4. Half of the address space such as bits $b_5$–$b_3$ could be used to represent the operand of one delay node while bits $b_5$–$b_3$ of the output could represent its output. Bits $b_2$–$b_0$ of the address and bits $b_2$–$b_0$ of the output could function as another completely independent delay node or polynomial transform. The algorithm to generate such a table is shown in Table 23.

TABLE 23

| Two Co-habitating Delay Nodes |
|---|
| FOR ADDR: = 0 STEP 1 UNTIL 63 DO |
|    BEGIN |
|      OP1: = ADDR[5:3]; |
|      OP2: = ADDR[2:0]; |
|      MEM(ADDR) [5:3]: = OP1; |
|      MEM(ADDR) [2:0]: = OP2; |
|    END; |

The memory is scanned. Bits $b_5$–$b_3$ of the address are replicated in bits $b_5$–$b_3$ of the corresponding location. Bits $b_2$–$b_0$ of the address are replicated in bits $b_2$–$b_0$ of the corresponding location. Such a table is shown in Table 24.

TABLE 24

| Co-habitating Delay Nodes | | | | | |
|---|---|---|---|---|---|
| ADDRESS | CONT | ADDRESS | CONT | ADDRESS | CONT |
| 000000 | 000000 | 010101 | 010101 | 101010 | 101010 |
| 000001 | 000001 | 010110 | 010110 | 101011 | 101011 |
| 000010 | 000010 | 010111 | 010111 | 101100 | 101100 |
| 000011 | 000011 | 011000 | 011000 | 101101 | 101101 |
| 000100 | 000100 | 011001 | 011001 | 101110 | 101110 |
| 000101 | 000101 | 011010 | 011010 | 101111 | 101111 |
| 000110 | 000110 | 011011 | 011011 | 110000 | 110000 |
| 000111 | 000111 | 011100 | 011100 | 110001 | 110001 |
| 001000 | 001000 | 011101 | 011101 | 110010 | 110010 |
| 001001 | 001001 | 011110 | 011110 | 110011 | 110011 |
| 001010 | 001010 | 011111 | 011111 | 110100 | 110100 |
| 001011 | 001011 | 100000 | 100000 | 110101 | 110101 |
| 001100 | 001100 | 100001 | 100001 | 110110 | 110110 |
| 001101 | 001101 | 100010 | 100010 | 110111 | 110111 |
| 001110 | 001110 | 100011 | 100011 | 111000 | 111000 |
| 001111 | 001111 | 100100 | 100100 | 111001 | 111001 |
| 010000 | 010000 | 100101 | 100101 | 111010 | 111010 |
| 010001 | 010001 | 100110 | 100110 | 111011 | 111011 |
| 010010 | 010010 | 100111 | 100111 | 111100 | 111100 |
| 010011 | 010011 | 101000 | 101000 | 111101 | 111101 |
| 010100 | 010100 | 101001 | 101001 | 111110 | 111110 |
| | | | | 111111 | 111111 |

This technique is referred to as parallel co-habitation. The approach is not limited to only delay nodes. The co-habitating nodes could perform polynomial transforms, modular arithmetic, or storage. There can be any number of such nodes sharing the same memory. They can be constructed for any modulus. The only requirement is that there is sufficient address space to accommodate the different operand fields and sufficient output space to represent the different result fields.

It is also possible to co-habitate in a serial manner. In this approach different portions of the memory would hold different tables. Bits of the address would be used to select which portion is applicable. The algorithm to generate the tables for the polynomial transforms $P(x)=x^2+3x+3$ and $P(x)=x^3-4x+5$ and $P(x)=x^2$ for modulus 5 is shown in Table 25.

TABLE 25

| Serial Co-habitation |
|---|
| MI: = 5; |
| FOR ADDR: = 0 STEP 1 UNTIL 63 DO |
|    BEGIN |
|      SELECT: = ADDR[5:3]; |
|      OP1: = ADDR[2:0]; |
|      IF SELECT = 0 AND OP1 < MI THEN |
|      MEM(ADDR): = MOD(OP1*OP1 + 3*OP1 + 3, MI); |
|      IF SELECT = 1 AND OP1 < MI THEN |
|      MEM(ADDR): = MOD(OP1*OP1*OP1 − 4*OP1 + 5, MI); |
|      IF SELECT = 2 AND OP1 < MI THEN |
|      MEM(ADDR): = MOD(OP1*OP1, MI); |

TABLE 25-continued

Serial Co-habitation

END;

MI is set to 5. The memory is scanned. Bits $b_5$–$b_3$ of the address are used to represent the select bits. Bits $b_2$–$b_0$ are used to represent the operand OP1. Dependent on the value of the select bits the location is loaded with the modular result of the different integer polynomial transforms. Such a table is shown in Table 26.

TABLE 26

Selectable Polynomial Transforms for Modulus 5

| ADDRESS | CONT | ADDRESS | CONT | ADDRESS | CONT |
|---|---|---|---|---|---|
| 000000 | X011 | 010101 | XXXX | 101010 | XXXX |
| 000001 | X010 | 010110 | XXXX | 101011 | XXXX |
| 000010 | X011 | 010111 | XXXX | 101100 | XXXX |
| 000011 | X001 | 011000 | XXXX | 101101 | XXXX |
| 000100 | X001 | 011001 | XXXX | 101110 | XXXX |
| 000101 | XXXX | 011010 | XXXX | 101111 | XXXX |
| 000110 | XXXX | 011011 | XXXX | 110000 | XXXX |
| 000111 | XXXX | 011100 | XXXX | 110001 | XXXX |
| 001000 | X000 | 011101 | XXXX | 110010 | XXXX |
| 001001 | X010 | 011110 | XXXX | 110011 | XXXX |
| 001010 | X000 | 011111 | XXXX | 110100 | XXXX |
| 001011 | X000 | 100000 | XXXX | 110101 | XXXX |
| 001100 | X011 | 100001 | XXXX | 110110 | XXXX |
| 001101 | XXXX | 100010 | XXXX | 110111 | XXXX |
| 001110 | XXXX | 100011 | XXXX | 111000 | XXXX |
| 001111 | XXXX | 100100 | XXXX | 111001 | XXXX |
| 010000 | X000 | 100101 | XXXX | 111010 | XXXX |
| 010001 | X001 | 100110 | XXXX | 111011 | XXXX |
| 010010 | X100 | 100111 | XXXX | 111100 | XXXX |
| 010011 | X100 | 101000 | XXXX | 111101 | XXXX |
| 010100 | X001 | 101001 | XXXX | 111110 | XXXX |
|  |  |  |  | 111111 | XXXX |

Such a table can be generated for different moduli by appropriately setting MI in the algorithm shown in Table 25.

This approach can be used to implement selectable modular arithmetic tables. In this case the address must have room to represent all the operands and the select bits.

These modular arithmetic nodes can be combined with storage nodes to form encoders which translate a normal radix number into its various modular equivalents.

Figure 2:
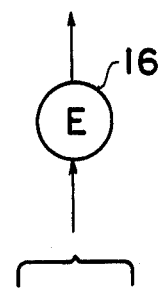
FIG. 2 illustrates a node used for direct encoding.

There are three basic approaches to encoding. The direct approach involves storing the modular equivalent of each possible input. If the input were 10 bits long then a memory with 10 bits of address would be needed. The modular equivalents associated with different moduli could be stored in different memories or packed together in the same memory if each location had sufficient space. Such a direct encoding approach is shown in FIG. 2. An input number is used as an address of a node 16. Stored at this location would be the modular equivalent or modular equivalents of the input number. An algorithm to generate a direct encoding table for modulus 5 is shown in Table 27.

TABLE 27

Direct Encoding into Modulus 5

MI: = 5;
FOR ADDR: = 0 STEP 1 UNTIL 63 DO
    BEGIN
    OP1: = ADDR[5:0];
    MEM(ADDR): = MOD(OP1, MI);
    END;

MI is used to denote the modulus and is set to 5. The entire memory is scanned. The modular equivalent of the address is stored at each location. Such a table is shown in Table 28.

TABLE 28

Direct Encoding for Modulus 5

| ADDRESS | CONT | ADDRESS | CONT | ADDRESS | CONT |
|---|---|---|---|---|---|
| 000000 | X000 | 010101 | X001 | 101010 | X010 |
| 000001 | X001 | 010110 | X010 | 101011 | X011 |
| 000010 | X010 | 010111 | X011 | 101100 | X100 |
| 000011 | X011 | 011000 | X100 | 101101 | X000 |
| 000100 | X100 | 011001 | X000 | 101110 | X001 |
| 000101 | X000 | 011010 | X001 | 101111 | X010 |
| 000110 | X001 | 011011 | X010 | 110000 | X011 |
| 000111 | X010 | 011100 | X011 | 110001 | X100 |
| 001000 | X011 | 011101 | X100 | 110010 | X000 |
| 001001 | X100 | 011110 | X000 | 110011 | X001 |
| 001010 | X000 | 011111 | X001 | 110100 | X010 |
| 001011 | X001 | 100000 | X010 | 110101 | X011 |
| 001100 | X010 | 100001 | X011 | 110110 | X100 |
| 001101 | X011 | 100010 | X100 | 110111 | X000 |
| 001110 | X100 | 100011 | X000 | 111000 | X001 |
| 001111 | X000 | 100100 | X001 | 111001 | X010 |
| 010000 | X001 | 100101 | X010 | 111010 | X011 |
| 010001 | X010 | 100110 | X011 | 111011 | X100 |
| 010010 | X011 | 100111 | X100 | 111100 | X000 |
| 010011 | X100 | 101000 | X000 | 111101 | X001 |
| 010100 | X000 | 101001 | X001 | 111110 | X010 |
|  |  |  |  | 111111 | X011 |

As an example 14 in binary is 1110. This is translated by Table 28 into 100 which is the modulus 5 equivalent of 14.

Such tables can be generated by this algorithm for the other moduli by appropriately setting MI.

One difficulty with the direct encoding approach is that the larger the number to be encoded, the larger the memory address space must be.

Figure 3:
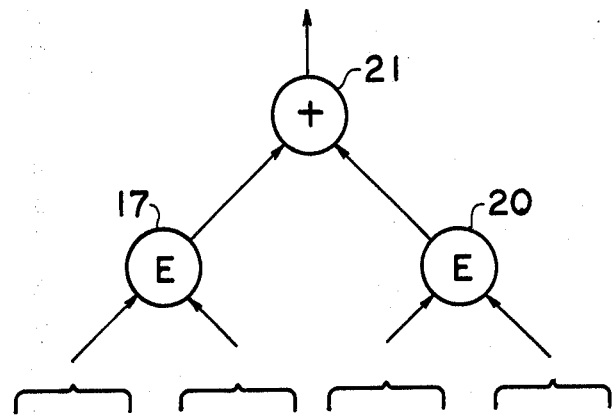
FIG. 3 illustrates nodes organized in a network to perform parallel encoding.

A second basic approach to encoding involves encoding portions of a number into their modular equivalents with direct encoding and then adding these equivalents in a modular manner. This approach is called parallel encoding. The structure of such an encoder is shown in FIG. 3. Node 17 encodes a portion of a number while node 20 encodes the rest. The modular equivalents of each portion are then added together in a modular manner by node 21. An algorithm to generate such a table for bits $b_{11}$–$b_6$ of a number, for modulus 5 is shown in Table 29.

TABLE 29

Parallel Encoding of bits $b_{11}$–$b_6$ for Modulus 5.

MI: = 5;
WF: = 2**6;
FOR ADDR: = 0 STEP 1 UNTIL 63 DO
    BEGIN
    OP1: = ADDR[5:0];
    MEM(ADDR): = MOD(OP1*WF, MI);
    END;

MI denotes the modulus which in this case is 5. WF represents the weighting factor of the bits of the number to be encoded. It is used to produce the numeric equivalent of the bits to be encoded. The numeric equivalent of some bits is equivalent to the sum of the products of each bit and its associated weighting factor. In this case only one weighting factor is needed since the bits are contiguous. Bits $b_{11}$ through $b_6$ have a weighting factor of 2**6. The entire memory is visited. Bits $b_5$–$b_0$ of the address are assumed to represent the bits $b_{11}$–$b_6$ of the number to be encoded. The modulus MI equivalent of the numeric equivalent of these bits is stored at each location. Such a table is shown in Table 30.

TABLE 30

| Parallel Encoding [11:6] for Modulus 5 | | | | | |
|---|---|---|---|---|---|
| ADDRESS | CONT | ADDRESS | CONT | ADDRESS | CONT |
| 000000 | X000 | 010101 | X100 | 101010 | X011 |
| 000001 | X100 | 010110 | X011 | 101011 | X010 |
| 000010 | X011 | 010111 | X010 | 101100 | X001 |
| 000011 | X010 | 011000 | X001 | 101101 | X000 |
| 000100 | X001 | 011001 | X000 | 101110 | X100 |
| 000101 | X000 | 011010 | X100 | 101111 | X011 |
| 000110 | X100 | 011011 | X011 | 110000 | X010 |
| 000111 | X011 | 011100 | X010 | 110001 | X001 |
| 001000 | X010 | 011101 | X001 | 110010 | X000 |
| 001001 | X001 | 011110 | X000 | 110011 | X100 |
| 001010 | X000 | 011111 | X100 | 110100 | X011 |
| 001011 | X100 | 100000 | X011 | 110101 | X010 |
| 001100 | X011 | 100001 | X010 | 110110 | X001 |
| 001101 | X010 | 100010 | X001 | 110111 | X000 |
| 001110 | X001 | 100011 | X000 | 111000 | X100 |
| 001111 | X000 | 100100 | X100 | 111001 | X011 |
| 010000 | X100 | 100101 | X011 | 111010 | X010 |
| 010001 | X011 | 100110 | X010 | 111011 | X001 |
| 010010 | X010 | 100111 | X001 | 111100 | X000 |
| 010011 | X001 | 101000 | X000 | 111101 | X100 |
| 010100 | X000 | 101001 | X100 | 111110 | X011 |
| | | | | 111111 | X010 |

A similar table can be generated to encode bits $b_5-b_0$ of a number into its modular 5 equivalent. The algorithm would be the same as that shown in Table 29, however the weighting factor WF would be 1 for these bits. Such a table is shown in Table 31.

TABLE 31

| Parallel Encoding [5:0] for Modulus 5 | | | | | |
|---|---|---|---|---|---|
| ADDRESS | CONT | ADDRESS | CONT | ADDRESS | CONT |
| 000000 | X000 | 010101 | X001 | 101010 | X010 |
| 000001 | X001 | 010110 | X010 | 101011 | X011 |
| 000010 | X010 | 010111 | X011 | 101100 | X100 |
| 000011 | X011 | 011000 | X100 | 101101 | X000 |
| 000100 | X100 | 011001 | X000 | 101110 | X001 |
| 000101 | X000 | 011010 | X001 | 101111 | X010 |
| 000110 | X001 | 011011 | X010 | 110000 | X011 |
| 000111 | X010 | 011100 | X011 | 110001 | X100 |
| 001000 | X011 | 011101 | X100 | 110010 | X000 |
| 001001 | X100 | 011110 | X000 | 110011 | X001 |
| 001010 | X000 | 011111 | X001 | 110100 | X010 |
| 001011 | X001 | 100000 | X010 | 110101 | X011 |
| 001100 | X010 | 100001 | X011 | 110110 | X100 |
| 001101 | X011 | 100010 | X100 | 110111 | X000 |
| 001110 | X100 | 100011 | X000 | 111000 | X001 |
| 001111 | X000 | 100100 | X001 | 111001 | X010 |
| 010000 | X001 | 100101 | X010 | 111010 | X011 |
| 010001 | X010 | 100110 | X011 | 111011 | X100 |
| 010010 | X011 | 100111 | X100 | 111100 | X000 |
| 010011 | X100 | 101000 | X000 | 111101 | X001 |
| 010100 | X000 | 101001 | X001 | 111110 | X010 |
| | | | | 111111 | X011 |

As an example of parallel encoding for modulus 5, bits $b_{11}-b_6$ of a number such as 101010011111 which is 2719 would be translated into 011 by Table 30 while bits $b_5-b_0$ would be translated by Table 31 into 001. These values would then be added in a modular manner by a modulus 5 adder as shown in Table 5. The two results 011 and 001 combine to form an address of 011001. This produces a result of 100 which is the modulus 5 equivalent of 2719.

The parallel encoding approach can be extended to encode even larger numbers. The same algorithm can be applied to different moduli by appropriately setting MI.

Figure 4:
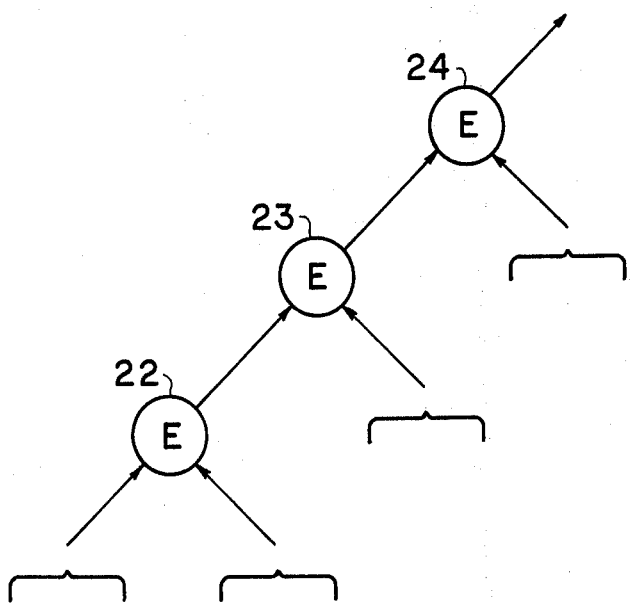
FIG. 4 illustrates nodes organized in a network to perform cascaded encoding.

A third basic approach to encoding is called cascaded encoding. The basic structure of such an encoder is shown in FIG. 4. A portion of the number is encoded by direct encoding by node 22. Its modular equivalent is passed to another node 23. This node translates another portion of the number into its modular equivalent and adds this in a modular manner to the result from the previous node which in this case is node 22. This result can be passed to another which would incorporate in a similar manner another portion of the number to be encoded. This chaining procedure can be continued until the entire number is encoded.

An algorithm to directly encode bits $b_5$ through $b_0$ of a number into its modular equivalent is shown in Table 32.

TABLE 32

Direct Encoding of Bits $b_5-b_0$ into Modulus 5

```
MI: = 5;
WF: = 1;
FOR ADDR: = 0 STEP 1 UNTIL 63 DO
    BEGIN
        OP1: = ADDR[5:0];
        MEM(ADDR): = MOD(OP1*WF, MI);
    END;
```

MI is set to 5. The weighting factor associated with these bits $b_5$ through $b_0$ is $2**0$. Bits $b_5-b_0$ of the address are assumed to represent bits $b_5-b_0$ of a number to be encoded. The entire memory is scanned. The modular equivalent of the numeric equivalent of these bits is stored at each location. Such a table is shown in Table 33. Different bits can be directly encoded by appropriately changing the weighting factor.

TABLE 33

| Cascaded Encoding [5:0] for Modulus 5 | | | | | |
|---|---|---|---|---|---|
| ADDRESS | CONT | ADDRESS | CONT | ADDRESS | CONT |
| 000000 | X000 | 010101 | X001 | 101010 | X010 |
| 000001 | X001 | 010110 | X010 | 101011 | X011 |
| 000010 | X010 | 010111 | X011 | 101100 | X100 |
| 000011 | X011 | 011000 | X100 | 101101 | X000 |
| 000100 | X100 | 011001 | X000 | 101110 | X001 |
| 000101 | X000 | 011010 | X001 | 101111 | X010 |
| 000110 | X001 | 011011 | X010 | 110000 | X011 |
| 000111 | X010 | 011100 | X011 | 110001 | X100 |
| 001000 | X011 | 011101 | X100 | 110010 | X000 |
| 001001 | X100 | 011110 | X000 | 110011 | X001 |
| 001010 | X000 | 011111 | X001 | 110100 | X010 |
| 001011 | X001 | 100000 | X010 | 110101 | X011 |
| 001100 | X010 | 100001 | X011 | 110110 | X100 |
| 001101 | X011 | 100010 | X100 | 110111 | X000 |
| 001110 | X100 | 100011 | X000 | 111000 | X001 |
| 001111 | X000 | 100100 | X001 | 111001 | X010 |
| 010000 | X001 | 100101 | X010 | 111010 | X011 |
| 010001 | X010 | 100110 | X011 | 111011 | X100 |
| 010010 | X011 | 100111 | X100 | 111100 | X000 |
| 010011 | X100 | 101000 | X000 | 111101 | X001 |
| 010100 | X000 | 101001 | X001 | 111110 | X010 |
| | | | | 111111 | X011 |

An algorithm to perform cascaded encoding of bits $b_8-b_6$ of a number for modulus 5 by translating a portion of a number into its modular equivalent and adding this in a modular manner to another modular result is shown in Table 34.

TABLE 34

Cascaded Encoding of Bits $b_8-b_6$ for Modulus 5

```
MI: = 5;
WF: = 2**6;
FOR ADDR: = 0 STEP 1 UNTIL 63 DO
    BEGIN
        OP1: = ADDR[5:3];
        OP2: = ADDR[2:0];
        IF OP1 < MI THEN
```

TABLE 34-continued

Cascaded Encoding of Bits $b_8-b_6$ for Modulus 5

```
    MEM(ADDR): = MOD(OP1 + OP2*WF, MI);
    END;
```

MI, the modulus is set to 5. The weighting factor associated with the bits $b_8-b_6$ is 2**6. The entire memory is scanned. Bits $b_5-b_3$ of the address are used as OP1 which represents the modular result passed from a previous node. The bits $b_2-b_0$ of the address, OP2, represent the new portion of the number to be encoded. If OP1 corresponds to a valid operand for the modulus, MI, then the modular equivalent of the sum of the previous modular result and the numeric equivalent of the bits to be encoded is placed in the location. Such a table is shown in Table 35.

TABLE 35

Cascaded Encoding [8:6] for Modulus 5

| ADDRESS | CONT | ADDRESS | CONT | ADDRESS | CONT |
|---------|------|---------|------|---------|------|
| 000000  | X000 | 010101  | X010 | 101010  | XXXX |
| 000001  | X100 | 010110  | X001 | 101011  | XXXX |
| 000010  | X011 | 010111  | X000 | 101100  | XXXX |
| 000011  | X010 | 011000  | X011 | 101101  | XXXX |
| 000100  | X001 | 011001  | X010 | 101110  | XXXX |
| 000101  | X000 | 011010  | X001 | 101111  | XXXX |
| 000110  | X100 | 011011  | X000 | 110000  | XXXX |
| 000111  | X011 | 011100  | X100 | 110001  | XXXX |
| 001000  | X001 | 011101  | X011 | 110010  | XXXX |
| 001001  | X000 | 011110  | X010 | 110011  | XXXX |
| 001010  | X100 | 011111  | X001 | 110100  | XXXX |
| 001011  | X011 | 100000  | X100 | 110101  | XXXX |
| 001100  | X010 | 100001  | X011 | 110110  | XXXX |
| 001101  | X001 | 100010  | X010 | 110111  | XXXX |
| 001110  | X000 | 100011  | X001 | 111000  | XXXX |
| 001111  | X100 | 100100  | X000 | 111001  | XXXX |
| 010000  | X010 | 100101  | X100 | 111010  | XXXX |
| 010001  | X001 | 100110  | X011 | 111011  | XXXX |
| 010010  | X000 | 100111  | X010 | 111100  | XXXX |
| 010011  | X100 | 101000  | XXXX | 111101  | XXXX |
| 010100  | X011 | 101001  | XXXX | 111110  | XXXX |
|         |      |         |      | 111111  | XXXX |

A similar algorithm to that shown in Table 34 can be used to generate a table for a cascaded encoder of bits $b_{11}$ through $b_9$ of a number for modulus 5. The weighting factor in this case would be 2**9. Such a table is shown in Table 36.

TABLE 36

Cascaded Encoding [11:9] for Modulus 5

| ADDRESS | CONT | ADDRESS | CONT | ADDRESS | CONT |
|---------|------|---------|------|---------|------|
| 000000  | X000 | 010101  | X010 | 101010  | XXXX |
| 000001  | X010 | 010110  | X100 | 101011  | XXXX |
| 000010  | X100 | 010111  | X001 | 101100  | XXXX |
| 000011  | X001 | 011000  | X011 | 101101  | XXXX |
| 000100  | X011 | 011001  | X000 | 101110  | XXXX |
| 000101  | X000 | 011010  | X010 | 101111  | XXXX |
| 000110  | X010 | 011011  | X100 | 110000  | XXXX |
| 000111  | X100 | 011100  | X001 | 110001  | XXXX |
| 001000  | X001 | 011101  | X011 | 110010  | XXXX |
| 001001  | X011 | 011110  | X000 | 110011  | XXXX |
| 001010  | X000 | 011111  | X010 | 110100  | XXXX |
| 001011  | X010 | 100000  | X100 | 110101  | XXXX |
| 001100  | X100 | 100001  | X001 | 110110  | XXXX |
| 001101  | X001 | 100010  | X011 | 110111  | XXXX |
| 001110  | X011 | 100011  | X000 | 111000  | XXXX |
| 001111  | X000 | 100100  | X010 | 111001  | XXXX |
| 010000  | X010 | 100101  | X100 | 111010  | XXXX |
| 010001  | X100 | 100110  | X001 | 111011  | XXXX |
| 010010  | X001 | 100111  | X011 | 111100  | XXXX |
| 010011  | X011 | 101000  | XXXX | 111101  | XXXX |
| 010100  | X000 | 101001  | XXXX | 111110  | XXXX |
|         |      |         |      | 111111  | XXXX |

As an example bits $b_5-b_0$ of a number such as 101010011111, which is 2719, would be translated into 001 by Table 33. This result along with bits $b_8-b_6$ of the number to be encoded would be used to form an address of 001010. Table 35 translates this result into 100. This result along with bits $b_{11}-b_9$ of the number to be encoded, 101, would be used to form an address of 100101 for Table 36. This produces a result of 100 which is the modulus 5 equivalent of 2719.

The cascaded approach can be extended to encode even larger numbers. The same algorithm can be applied to another moduli by appropriately setting MI.

Approaches to encoding in a direct, parallel, and cascaded manner have been presented. As presented these techniques can only encode non-negative numbers. This would be restrictive and exclude a large class of computational problems. The encoding algorithms can be modified to handle negative numbers. The necessary modifications depend on how the negative numbers are represented. Negative numbers are usually represented in either sign magnitude or two's complement form.

In sign magnitude format a bit is used to represent the sign of the number. For discussion we will assume a sign bit of 1 is used to indicate a negative number.

If the sign bit is 0, indicating that the number is positive the encoding can proceed as discussed, however if the number is negative then the portions of the number excluding the sign bit must be subtracted from 0 before it is encoded. In modular arithmetic this is equivalent to encoding the portion excluding the sign bit and subtracting this equivalent in a modular manner from the modular equivalent of 0. Since the modular equivalent of 0 is 0 this subtraction is equivalent performing a modular complement.

Figure 5:
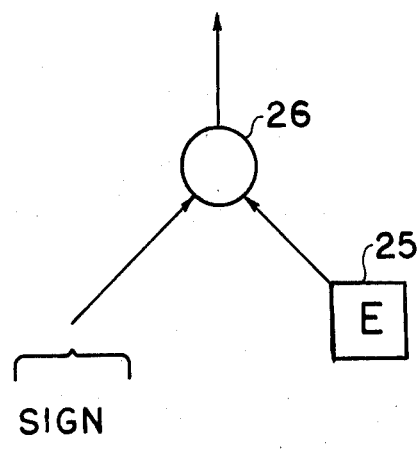
FIG. 5 illustrates a node which modifies encoded values to incorporate sign information.

One approach to encoding a number in sign magnitude format is shown in FIG. 5. The non sign portion would be encoded by either a direct, parallel, or cascaded encoder shown as 25. This result along with the sign bit would be feed to a node 26. If the sign indicates that the number was positive then the output of node 26 would be the same as the input from the encoder 25. If the number is negative then the output of node 26 would be the modular complement of the input from encoder 25. An algorithm to perform this operation for modulus 5 is shown in Table 37.

TABLE 37

Modified Encoding for Sign Magnitude Format

```
MI: = 5;
FOR ADDR: = 0 STEP 1 UNTIL 63 DO
BEGIN
  SIGN: = ADDR[3];
  OP1: = ADDR[2:0];
  DC: = ADDR[5:4];
  IF DC = 0 AND OP1<MI THEN
  BEGIN
    IF SIGN = 1 THEN
    MEM(ADDR): = MOD(MI - OP1, MI);
    IF SIGN = 0 THEN
    MEM(ADDR): = OP1;
  END;
END;
```

MI is used to represent the modulus. It is set to 5. The entire memory is visited. Bit $b_3$ of the address is assumed to represent the sign bit. Bits $b_2-b_0$ represent the modular equivalent of the non-sign portion of the number to be encoded, OP1. Bits $b_5$ and $b_4$ of the address are not used. These don't care bits are assumed to be 0 for clarity. If the don't care bits are 0 and OP1 is a proper operand for the modulus, MI, then the following occurs. If the sign bit is 1 indicating a negative number then the modular complement of OP1, which is the modular equivalent of OP1 subtracted from the modulus, MI, is placed at this location. If the sign bit indicates that the number is non-negative then OP1 is placed at this location. Such a table is shown in Table 38.

TABLE 38

Modified Encoding of Sign Magnitude for Modulus 5

| ADDRESS | CONT | ADDRESS | CONT | ADDRESS | CONT |
|---|---|---|---|---|---|
| 000000 | X000 | 010101 | XXXX | 101010 | XXXX |
| 000001 | X001 | 010110 | XXXX | 101011 | XXXX |
| 000010 | X010 | 010111 | XXXX | 101100 | XXXX |
| 000011 | X011 | 011000 | XXXX | 101101 | XXXX |
| 000100 | X100 | 011001 | XXXX | 101110 | XXXX |
| 000101 | XXXX | 011010 | XXXX | 101111 | XXXX |
| 000110 | XXXX | 011011 | XXXX | 110000 | XXXX |
| 000111 | XXXX | 011100 | XXXX | 110001 | XXXX |
| 001000 | X000 | 011101 | XXXX | 110010 | XXXX |
| 001001 | X100 | 011110 | XXXX | 110011 | XXXX |
| 001010 | X011 | 011111 | XXXX | 110100 | XXXX |
| 001011 | X010 | 100000 | XXXX | 110101 | XXXX |
| 001100 | X001 | 100001 | XXXX | 110110 | XXXX |
| 001101 | XXXX | 100010 | XXXX | 110111 | XXXX |
| 001110 | XXXX | 100011 | XXXX | 111000 | XXXX |
| 001111 | XXXX | 100100 | XXXX | 111001 | XXXX |
| 010000 | XXXX | 100101 | XXXX | 111010 | XXXX |
| 010001 | XXXX | 100110 | XXXX | 111011 | XXXX |
| 010010 | XXXX | 100111 | XXXX | 111100 | XXXX |
| 010011 | XXXX | 101000 | XXXX | 111101 | XXXX |
| 010100 | XXXX | 101001 | XXXX | 111110 | XXXX |
| | | | | 111111 | XXXX |

As an example, if the number to be encoded was 1101010011111 which is $-2719$ and if the most significant bit was the sign bit then the number is negative and the non-sign bit portion 101010011111 would be encoded first. This number was used in a previous example to demonstrate cascaded encoding and was shown for modulus 5 to be 100. The sign and this result are used to form an address 1100. Referring to Table 38 this results in 001 which is the modular complement of 100 for modulus 5.

The same algorithm as shown in Table 37 can be used for other moduli by appropriately setting MI.

A sign magnitude number can also be directly encoded into its modular equivalent. If the number is negative then the non-sign bit portion of the number can be subtracted from 0 and the modular equivalent of this difference can be stored at the corresponding location. If the number is non-negative then the usual modular equivalent can be stored. An algorithm for generating a table for direct encoding of a sign magnitude number for modulus 5 is shown in Table 39.

TABLE 39

Direct Encoding of Sign Magnitude Number for Modulus 5
MI: = 5;
FOR ADDR: = 0 STEP 1 UNTIL 63 DO
BEGIN
SIGN: = ADDR[5];
OP1: = ADDR[4:0];
IF SIGN = 1 THEN MEM(ADDR): = MOD(0 - OP1, MI);
IF SIGN = 0 THEN MEM(ADDR): = MOD(OP1, MI);
END;

MI is set to 5. The memory is scanned. Bits $b_5$ of the address is assumed to represent the sign. Bits $b_4$ through $b_0$ of the address represent the non sign portion of the number. If the number is negative then the modular equivalent of, OP1 subtracted from 0 is placed into the location. If the number is non-negative the modular equivalent of the non sign portion of the number is placed into the location. Such a table is shown in Table 40.

TABLE 40

Direct Encoding of Sign Magnitude for Mod 5

| ADDRESS | CONT | ADDRESS | CONT | ADDRESS | CONT |
|---|---|---|---|---|---|
| 000000 | X000 | 010101 | X001 | 101010 | X000 |
| 000001 | X001 | 010110 | X010 | 101011 | X100 |
| 000010 | X010 | 010111 | X011 | 101100 | X011 |
| 000011 | X011 | 011000 | X100 | 101101 | X010 |
| 000100 | X100 | 011001 | X000 | 101110 | X001 |
| 000101 | X000 | 011010 | X001 | 101111 | X000 |
| 000110 | X001 | 011011 | X010 | 110000 | X100 |
| 000111 | X010 | 011100 | X011 | 110001 | X011 |
| 001000 | X011 | 011101 | X100 | 110010 | X010 |
| 001001 | X100 | 011110 | X000 | 110011 | X001 |
| 001010 | X000 | 011111 | X001 | 110100 | X000 |
| 001011 | X001 | 100000 | X000 | 110101 | X100 |
| 001100 | X010 | 100001 | X100 | 110110 | X011 |
| 001101 | X011 | 100010 | X011 | 110111 | X010 |
| 001110 | X100 | 100011 | X010 | 111000 | X001 |
| 001111 | X000 | 100100 | X001 | 111001 | X000 |
| 010000 | X001 | 100101 | X000 | 111010 | X100 |
| 010001 | X010 | 100110 | X100 | 111011 | X011 |
| 010010 | X011 | 100111 | X011 | 111100 | X010 |
| 010011 | X100 | 101000 | X010 | 111101 | X001 |
| 010100 | X000 | 101001 | X001 | 111110 | X000 |
| | | | | 111111 | X100 |

As an example, suppose the number to be encoded was $-4$ and the most significant bit represented the sign. This would be 100100 in sign magnitude. At this location in Table 40 the contents is 001 which is the modulus 5 equivalent of $-4$.

A sign magnitude number can also be encoded in a parallel manner. The structure of such a encoder would resemble FIG. 3. The non sign portion of the number can be partitioned into several sections. The sign bit would be distributed with each section to different nodes. Conditioned on the sign bit each section can be translated by table lookup. If the sign bit indicates that the number is non-negative then that portion of the number would be translated into its modular equivalent. If the number is negative then that portion would be translated into its modular complement. The modular equivalents to the different sections would then be added in a modular manner. An algorithm to generate a table for parallel encoding of a sign magnitude number into modulus 5 is shown in Table 41.

TABLE 41

Parallel Encoding of a Sign Magnitude Number [9:5]
MI: = 5;
WF: = 2**5;
FOR ADDR: = 0 STEP 1 UNTIL 63 DO
BEGIN
SIGN: = ADDR[5];
OP1: = ADDR[4:0];
IF SIGN = 0 THEN
MEM(ADDR): = MOD(OP1*WF, MI);
IF SIGN = 1 THEN
MEM(ADDR): = MOD(MI - MOD(OP1*WF, MI), MI);
END;

MI is used as the modulus and is set to 5. Bits $b_9$–$b_5$ of the number are to be encoded so the weighting factor is 2**5. The memory is scanned. Bit $b_5$ of the address is assumed to represent the sign bit. Bits $b_4$–$b_0$ are to represent bits $b_9$–$b_5$ of the number to be encoded. If the sign is 0 then the number is assumed to be non-negative and the modular equivalent of the numeric equivalent of OP1 is placed at this location. If the sign is 1 then the number is negative and the modular complement of the modular equivalent of the numeric equivalent of OP1 is placed at this location. Such a table is shown in Table 42.

TABLE 42

Parallel Encoding of a Sign Magnitude Number [9:5]

| ADDRESS | CONT | ADDRESS | CONT | ADDRESS | CONT |
|---|---|---|---|---|---|
| 000000 | X000 | 010101 | X010 | 101010 | X000 |
| 000001 | X010 | 010110 | X100 | 101011 | X011 |
| 000010 | X100 | 010111 | X001 | 101100 | X001 |
| 000011 | X001 | 011000 | X011 | 101101 | X100 |
| 000100 | X011 | 011001 | X000 | 101110 | X010 |
| 000101 | X000 | 011010 | X010 | 101111 | X000 |
| 000110 | X010 | 011011 | X100 | 110000 | X011 |
| 000111 | X100 | 011100 | X001 | 110001 | X001 |
| 001000 | X001 | 011101 | X011 | 110010 | X100 |
| 001001 | X011 | 011110 | X000 | 110011 | X010 |
| 001010 | X000 | 011111 | X010 | 110100 | X000 |
| 001011 | X010 | 100000 | X000 | 110101 | X011 |
| 001100 | X100 | 100001 | X011 | 110110 | X001 |
| 001101 | X001 | 100010 | X001 | 110111 | X100 |
| 001110 | X011 | 100011 | X100 | 111000 | X010 |
| 001111 | X000 | 100100 | X010 | 111001 | X000 |
| 010000 | X010 | 100101 | X000 | 111010 | X011 |
| 010001 | X100 | 100110 | X011 | 111011 | X001 |
| 010010 | X001 | 100111 | X001 | 111100 | X100 |
| 010011 | X011 | 101000 | X100 | 111101 | X010 |
| 010100 | X000 | 101001 | X010 | 111110 | X000 |
|  |  |  |  | 111111 | X011 |

The same algorithm can be used to generate a table to encode bits $b_4$–$b_0$ of a number. The only modification is that the weighting factor in this case would be 1. Such a table is shown in Table 43.

TABLE 43

Parallel Encoding of a Sign Magnitude Number [4:0]

| ADDRESS | CONT | ADDRESS | CONT | ADDRESS | CONT |
|---|---|---|---|---|---|
| 000000 | X000 | 010101 | X001 | 101010 | X000 |
| 000001 | X001 | 010110 | X010 | 101011 | X100 |
| 000010 | X010 | 010111 | X011 | 101100 | X011 |
| 000011 | X011 | 011000 | X100 | 101101 | X010 |
| 000100 | X100 | 011001 | X000 | 101110 | X001 |
| 000101 | X000 | 011010 | X001 | 101111 | X000 |
| 000110 | X001 | 011011 | X010 | 110000 | X100 |
| 000111 | X010 | 011100 | X011 | 110001 | X011 |
| 001000 | X011 | 011101 | X100 | 110010 | X010 |
| 001001 | X100 | 011110 | X000 | 110011 | X001 |
| 001010 | X000 | 011111 | X001 | 110100 | X000 |
| 001011 | X001 | 100000 | X000 | 110101 | X100 |
| 001100 | X010 | 100001 | X100 | 110110 | X011 |
| 001101 | X011 | 100010 | X011 | 110111 | X010 |
| 001110 | X100 | 100011 | X010 | 111000 | X001 |
| 001111 | X000 | 100100 | X001 | 111001 | X000 |
| 010000 | X001 | 100101 | X000 | 111010 | X100 |
| 010001 | X010 | 100110 | X100 | 111011 | X011 |
| 010010 | X011 | 100111 | X011 | 111100 | X010 |
| 010011 | X100 | 101000 | X010 | 111101 | X001 |
| 010100 | X000 | 101001 | X001 | 111110 | X000 |
|  |  |  |  | 111111 | X100 |

As an example to encode a sign magnitude number such as 10010100111 which is −167 where $b_{10}$ represents the sign bit, the number would first be partitioned into 1, 00101, and 00111. The sign bit along with bits $b_9$–$b_5$ would be combined to form an address 100101 for Table 42. The result is 000. The sign bit along with bits $b_4$–$b_0$ would be combined to from an address 100111 for Table 43. This results in 011. The two results are combined to from an address of 000011 for Table 5, a modulus 5 adder. The result is 011 which is the modulus equivalent of −167 for modulus 5.

Tables can be constructed for other moduli with the algorithm shown in Table 41. The modulus variable MI need only be changed.

A sign magnitude number can also be encoded in a cascaded manner. The nodal structure would be similar to FIG. 4. The number to be encoded is partitioned into several sections. The section containing the sign bit must be the last section to be processed in the cascade. All the other portions are encoded in a normal cascaded manner. The last node in the cascade translates the non-sign portion of the section into its modular equivalent. This is added in a modular manner to the modular result from the previous node in the cascade. If the sign bit indicates that the number is non-negative then this modular sum is the output. If the sign bit indicates that the number is negative then the modular complement of this modular sum is used as the output. An algorithm to generate a table to encode in a cascade manner bits $b_{11}$–$b_9$ of a sign magnitude number is shown in Table 44.

TABLE 44

Cascaded Encoding of a Sign magnitude Number [11:9]

MI: = 5;
WF: = 2**9;
FOR ADDR: = 0 STEP 1 UNTIL 63 DO
BEGIN
SIGN: = ADDR[2];
OP1: = ADDR[1:0];
OP2: = ADDR[5:3];
IF SIGN = THEN
MEM(ADDR): = MOD(OP1*WF + OP2, MI);
IF SIGN = THEN
MEM(ADDR): = MOD(MI - MOD(OP1*WF + OP2, MI), MI);
END;

MI is set to 5. Bit $b_{11}$ of the number is assumed to be the sign bit. The non sign bits to be encoded by the final node of the cascade are $b_{10}$–$b_9$. The weighting factor associated with these bits is 2**9. The memory is scanned. Bit $b_2$ of the address is assumed to represent the sign bit. The non sign portion of the final section to be encoded, OP1, is represented by bits $b_1$–$b_0$ of the address. The modular result from the previous node is represented by bits $b_5$–$b_3$ of the address and used as OP2. If the sign is 0 then the number is assumed to be non-negative and the modular equivalent of the sum of the numeric equivalent of the new bits to be encoded and the previously derived modular result is placed in this location. If the number is negative then the modular complement of the modular equivalent of the sum of the numeric equivalent and the previous modular result is stored in the location. Such a table is shown in Table 45.

TABLE 45

Cascaded Encoding of Sign Magnitude [11:9]

| ADDRESS | CONT | ADDRESS | CONT | ADDRESS | CONT |
|---|---|---|---|---|---|
| 000000 | X000 | 010101 | X001 | 101010 | XXXX |
| 000001 | X010 | 010110 | X100 | 101011 | XXXX |
| 000010 | X100 | 010111 | X010 | 101100 | XXXX |
| 000011 | X001 | 011000 | X011 | 101101 | XXXX |
| 000100 | X000 | 011001 | X000 | 101110 | XXXX |
| 000101 | X011 | 011010 | X010 | 101111 | XXXX |
| 000110 | X001 | 011011 | X100 | 110000 | XXXX |
| 000111 | X100 | 011100 | X010 | 110001 | XXXX |
| 001000 | X001 | 011101 | X000 | 110010 | XXXX |
| 001001 | X011 | 011110 | X011 | 110011 | XXXX |
| 001010 | X000 | 011111 | X001 | 110100 | XXXX |
| 001011 | X010 | 100000 | X100 | 110101 | XXXX |
| 001100 | X100 | 100001 | X001 | 110110 | XXXX |
| 001101 | X010 | 100010 | X011 | 110111 | XXXX |
| 001110 | X000 | 100011 | X000 | 111000 | XXXX |
| 001111 | X011 | 100100 | X001 | 111001 | XXXX |
| 010000 | X010 | 100101 | X100 | 111010 | XXXX |

TABLE 45-continued

| Cascaded Encoding of Sign Magnitude [11:9] | | | | | |
|---|---|---|---|---|---|
| ADDRESS | CONT | ADDRESS | CONT | ADDRESS | CONT |
| 010001 | X100 | 100110 | X010 | 111011 | XXXX |
| 010010 | X001 | 100111 | X000 | 111100 | XXXX |
| 010011 | X011 | 101000 | XXXX | 111101 | XXXX |
| 010100 | X011 | 101001 | XXXX | 111110 | XXXX |
| | | | | 111111 | XXXX |

The tables required to encode bits $b_8$–$b_6$ and $b_5$–$b_0$ in a cascaded manner are the same as ordinary cascaded encoding. The algorithm needed are shown in Tables 34 and 32 respectively. The tables that would be generated are shown in Tables 35 and 33 respectively.

As an example suppose that the sign magnitude number was 100010100111 which is $-167$. Assume $b_{11}$ is the sign bit. The number can be partitioned into 100, 010, and 100111. Bits $b_5$–$b_0$ are used to address Table 33. The result is 100. This combined with bits $b_8$–$b_6$ to form the address 100010. Table 35 translates this into 010. This is combined with $b_{11}$–$b_9$ to form the address 010100 for Table 45. The result is 011 which is the modulus 5 equivalent of $-167$.

This approach can be extended to other moduli by appropriately changing the modulus variable MI in the algorithms.

A negative number can also be represented in a two's complement form. In this method the top half of the range is reserved to represent negative numbers. The usual approach to convert a number into its two's complement is to do a bitwise complement and then increment the number by 1. As an example 001 bitwise complemented is 110. This is then incremented by one resulting in 111 which is the 3 bit two's complement representation of $-1$. In this representation a negative number can be identified by examining the most significant bit. If the bit is 1 then the number is in the top half of the range and is thus regarded as negative. The range is dependent on the number of bits used by the representation. To convert a negative number in two's complement form into the actual negative number the range must be subtracted from it.

In the previous example 111 was shown to represent $-1$. Three bits are used to represent the number. The range is thus $2^3$ which in binary is 1000. The result of 1000 subtracted from 111 also represents $-1$. This technique can be used to encode a number represented in two's complement into its modular equivalent. If the most significant bit is 1 then the range is subtracted and the modular equivalent of the result is used. Equivalently due to modular arithmetic, if the most significant bit is 1 then the modular equivalent of the range can be subtracted in a modular manner from the modular equivalent of the number to be encoded.

One approach to encoding a two's complement number would be to use a structure as shown in FIG. 5. The number can be processed by encoder 25 in either the direct, parallel, or cascaded manner. This result along with a duplicate of the most significant bit of the original number would be fed to node 26. If this bit was a 0 indicating that the number was non-negative then node 26 would just duplicate the input from encoder 25. If the most significant bit was 1 indicating that the number was negative, the node would subtract in a modular manner the modular equivalent of the range from the result of encoder 25. An algorithm to generate a table for a modified encoding for a 12 bit two's complement number into modulus 5 is shown in Table 46.

TABLE 46

Modified Encoding of Two's Complement

MI: = 5;
RANGE: = 2**12;
FOR ADDR: = 0 STEP 1 UNTIL 63 DO
BEGIN
MSB: = ADDR[3];
OP1: = ADDR[2:0];
DC: = ADDR[5:4];
IF MSB = 0 AND OP1<MI AND DC = 0 THEN
MEM(ADDR): = OP1;
IF MSB = 1 AND OP1<MI AND DC = 0 THEN
MEM(ADDR): = MOD(OP1 - MOD(2**12, MI), MI);
END;

MI is set to 5. The numbers to be encoded are up to 12 bits long. The range is thus $2^{12}$. The memory is scanned. Bits $b_3$ of the address is assumed to represent the most significant bit. Bits $b_2$–$b_0$ are assumed to be the result from the previous encoder. Bits $b_5$–$b_4$ of the address are not needed. These don't care bits are set to 0 for clarity. If the most significant bit indicates that the number is non-negative and that OP1 is valid operand and that the don't care bits $b_5$–$b_4$ are 0 then the location is set equal to OP1. If the most significant bit is 1 indicating that the number is negative and OP1 is a valid operand and the don't care bits are 0 then the modular equivalent of the subtraction of the modular equivalent of the range from the previously encoded result is stored at this location.

A two's complement number can also be directly encoded into its modular equivalent. If the most significant bit is 0 then the number is non-negative and it is translated into its modular equivalent. If the number is negative then the range is subtracted from the number and this result is translated into its modular equivalent. An algorithm to generate a table to directly encode a 6 bit two's complement number into modulus 5 is shown in Table 47.

TABLE 47

Direct Encoding of a Two's Complement Number

MI: = 5;
RANGE: = 2**6;
WF: = 1;
FOR ADDR: = 0 STEP 1 UNTIL 63 DO
    BEGIN
    MSB: = ADDR[5];
    OP1: = ADDR[5:0];
    IF MSB = 0 THEN
        MEM(ADDR): = MOD(OP1*WF, MI);
    IF MSB = 1 THEN
        MEM(ADDR): = MOD(OP1*WF - RANGE, MI);
    END;

MI is set to 5. The number to be encoded is up to 6 bits long. The range is thus $2^6$ and the weighting factor is 1. The memory is scanned. Bits $b_5$–$b_0$ of the address are assumed to represent the number to be encoded, OP1. If the most significant bit of OP1 is 0 then the modular equivalent of the numeric equivalent of OP1 is placed at this location. If the most significant bit is 1 then the modular equivalent of the range is subtracted from the numeric equivalent of OP1 and placed at this location. Such a table is shown in Table 48.

TABLE 48

Direct Encoding of Two's Complements for Modulus 5

| ADDRESS | CONT | ADDRESS | CONT | ADDRESS | CONT |
|---------|------|---------|------|---------|------|
| 000000 | X000 | 010101 | X001 | 101010 | X011 |
| 000001 | X001 | 010110 | X010 | 101011 | X100 |
| 000010 | X010 | 010111 | X011 | 101100 | X000 |
| 000011 | X011 | 011000 | X100 | 101101 | X001 |
| 000100 | X100 | 011001 | X000 | 101110 | X010 |
| 000101 | X000 | 011010 | X001 | 101111 | X011 |
| 000110 | X001 | 011011 | X010 | 110000 | X100 |
| 000111 | X010 | 011100 | X011 | 110001 | X000 |
| 001000 | X011 | 011101 | X100 | 110010 | X001 |
| 001001 | X100 | 011110 | X000 | 110011 | X010 |
| 001010 | X000 | 011111 | X001 | 110100 | X011 |
| 001011 | X001 | 100000 | X011 | 110101 | X100 |
| 001100 | X010 | 100001 | X100 | 110110 | X000 |
| 001101 | X011 | 100010 | X000 | 110111 | X001 |
| 001110 | X100 | 100011 | X001 | 111000 | X010 |
| 001111 | X000 | 100100 | X010 | 111001 | X011 |
| 010000 | X001 | 100101 | X011 | 111010 | X100 |
| 010001 | X010 | 100110 | X100 | 111011 | X000 |
| 010010 | X011 | 100111 | X000 | 111100 | X001 |
| 010011 | X100 | 101000 | X001 | 111101 | X010 |
| 010100 | X000 | 101001 | X010 | 111110 | X011 |
|        |      |         |      | 111111 | X100 |

As an example, suppose the number to be encoded was 111111 which represents −1 in 6 bit two's complement. This would be encoded by Table 48 as 100 which is the modulus 5 equivalent of −1.

Tables can be generated by the algorithm shown in Table 47 for other moduli by appropriately setting MI. Such a table for modulus 7 is shown in Table 49. A table for modulus 8 is shown in Table 50.

TABLE 49

Direct Encoding of Two's Complements for Modulus 7

| ADDRESS | CONT | ADDRESS | CONT | ADDRESS | CONT |
|---------|------|---------|------|---------|------|
| 000000 | X000 | 010101 | X000 | 101010 | X110 |
| 000001 | X001 | 010110 | X001 | 101011 | X000 |
| 000010 | X010 | 010111 | X010 | 101100 | X001 |
| 000011 | X011 | 011000 | X011 | 101101 | X010 |
| 000100 | X100 | 011001 | X100 | 101110 | X011 |
| 000101 | X101 | 011010 | X101 | 101111 | X100 |
| 000110 | X110 | 011011 | X110 | 110000 | X101 |
| 000111 | X000 | 011100 | X000 | 110001 | X110 |
| 001000 | X001 | 011101 | X001 | 110010 | X000 |
| 001001 | X010 | 011110 | X010 | 110011 | X001 |
| 001010 | X011 | 011111 | X011 | 110100 | X010 |
| 001011 | X100 | 100000 | X011 | 110101 | X011 |
| 001100 | X101 | 100001 | X100 | 110110 | X100 |
| 001101 | X110 | 100010 | X101 | 110111 | X101 |
| 001110 | X000 | 100011 | X110 | 111000 | X110 |
| 001111 | X001 | 100100 | X000 | 111001 | X000 |
| 010000 | X010 | 100101 | X001 | 111010 | X001 |
| 010001 | X011 | 100110 | X010 | 111011 | X010 |
| 010010 | X100 | 100111 | X011 | 111100 | X011 |
| 010011 | X101 | 101000 | X100 | 111101 | X100 |
| 010100 | X110 | 101001 | X101 | 111110 | X101 |
|        |      |         |      | 111111 | X110 |

TABLE 50

Direct Encoding of Two's Complement for Modulus 8

| ADDRESS | CONT | ADDRESS | CONT | ADDRESS | CONT |
|---------|------|---------|------|---------|------|
| 000000 | X000 | 010101 | X101 | 101010 | X010 |
| 000001 | X001 | 010110 | X110 | 101011 | X011 |
| 000010 | X010 | 010111 | X111 | 101100 | X100 |
| 000011 | X011 | 011000 | X000 | 101101 | X101 |
| 000100 | X100 | 011001 | X001 | 101110 | X110 |
| 000101 | X101 | 011010 | X010 | 101111 | X111 |
| 000110 | X110 | 011011 | X011 | 110000 | X000 |
| 000111 | X111 | 011100 | X100 | 110001 | X001 |
| 001000 | X000 | 011101 | X101 | 110010 | X010 |
| 001001 | X001 | 011110 | X110 | 110011 | X011 |
| 001010 | X010 | 011111 | X111 | 110100 | X100 |
| 001011 | X011 | 100000 | X000 | 110101 | X101 |

TABLE 50-continued

Direct Encoding of Two's Complement for Modulus 8

| ADDRESS | CONT | ADDRESS | CONT | ADDRESS | CONT |
|---------|------|---------|------|---------|------|
| 001100 | X100 | 100001 | X001 | 110110 | X110 |
| 001101 | X101 | 100010 | X010 | 110111 | X111 |
| 001110 | X110 | 100011 | X011 | 111000 | X000 |
| 001111 | X111 | 100100 | X100 | 111001 | X001 |
| 010000 | X000 | 100101 | X101 | 111010 | X010 |
| 010001 | X001 | 100110 | X110 | 111011 | X011 |
| 010010 | X010 | 100111 | X111 | 111100 | X100 |
| 010011 | X011 | 101000 | X000 | 111101 | X101 |
| 010100 | X100 | 101001 | X001 | 111110 | X110 |
|        |      |         |      | 111111 | X111 |

A two's complement number can also be encoded with a modified parallel approach by partitioning the number into several sections. Such a structure is shown in FIG. 3. All sections other than that which contains the most significant bit can be translated with the previously discussed parallel encoding technique. The translation of the section containing the most significant bit is modified. If the most significant bit is 0 then the section would be translated as usual. If the most significant bit is 1 indicating that the number is negative, then the section would be translated into the modular equivalent of the range subtracted from the numeric equivalent of the bits in that section. The modular equivalents of the various sections would then be added together in a modular manner. An algorithm to generate a table to encode in a parallel manner bits $b_{11}-b_6$ of a 12 bit two's complement number into modulus 5 is shown in Table 51.

TABLE 51

Parallel Encoding of a 12 Bit Two's Complement Number [1

```
MI : = 5;
WF : = 2**6;
RANGE : = 2**12;
FOR ADDR = 0 STEP 1 UNTIL 63 DO
BEGIN
MSB : = ADDR[5];
OP1 : = ADDR[5:0];
IF MSB = 0 THEN
MEM(ADDR) = MOD(OP1*WF, MI);
IF MSB = 1 THEN
MEM(ADDR) : = MOD(OP1*WF - RANGE, MI);
END;
```

MI is set to 5. Since the number to be encoded can be up to 12 bits long the range is $2^{12}$. The bits to be encoded in this section are $b_{11}-b_6$. The weighting factor associated with these bits is $2^6$. The memory is scanned. Bit $b_5$ of the address is assumed to represent the most significant bit $b_{11}$ of the number to be encoded. OP1 is set to bits $b_{11}-b_6$ of the number to be encoded. If the most significant bit is 0 then the modular equivalent of the numeric equivalent of the section to be encoded is placed in this location. If the most significant bit is 1 then the modular equivalent of the range subtracted from the numeric equivalent of the bits to be encoded is placed in this location. Such a table is shown in Table 52.

TABLE 52

Parallel Encoding [11:6] of 2's Complements for Modulus 5

| ADDRESS | CONT | ADDRESS | CONT | ADDRESS | CONT |
|---------|------|---------|------|---------|------|
| 000000 | X000 | 010101 | X100 | 101010 | X010 |
| 000001 | X100 | 010110 | X011 | 101011 | X001 |
| 000010 | X011 | 010111 | X010 | 101100 | X000 |
| 000011 | X010 | 011000 | X001 | 101101 | X100 |
| 000100 | X001 | 011001 | X000 | 101110 | X011 |

TABLE 52-continued

Parallel Encoding [11:6] of 2's Complements for Modulus 5

| ADDRESS | CONT | ADDRESS | CONT | ADDRESS | CONT |
|---------|------|---------|------|---------|------|
| 000101  | X000 | 011010  | X100 | 101111  | X010 |
| 000110  | X100 | 011011  | X011 | 110000  | X001 |
| 000111  | X011 | 011100  | X010 | 110001  | X000 |
| 001000  | X010 | 011101  | X001 | 110010  | X100 |
| 001001  | X001 | 011110  | X000 | 110011  | X011 |
| 001010  | X000 | 011111  | X100 | 110100  | X010 |
| 001011  | X100 | 100000  | X010 | 110101  | X001 |
| 001100  | X011 | 100001  | X001 | 110110  | X000 |
| 001101  | X010 | 100010  | X000 | 110111  | X100 |
| 001110  | X001 | 100011  | X100 | 111000  | X011 |
| 001111  | X000 | 100100  | X011 | 111001  | X010 |
| 010000  | X100 | 100101  | X010 | 111010  | X001 |
| 010001  | X011 | 100110  | X001 | 111011  | X000 |
| 010010  | X010 | 100111  | X000 | 111100  | X100 |
| 010011  | X001 | 101000  | X100 | 111101  | X011 |
| 010100  | X000 | 101001  | X011 | 111110  | X010 |
|         |      |         |      | 111111  | X001 |

Bits $b_5$–$b_0$ of the number would be encoded in the usual manner for parallel encoding as shown in Table 31.

As an example to encode a two's complement number such as 111111111110 which is −2 into its modulus 5 equivalent. It would first be partitioned into 111111 and 111110. 111111 would be translated by Table 52 into 001. 111110 would be translated by Table 31 into 010. These results would be combined to form an address of 001010 for a modulus 5 addition table, Table 5. The result would be 011 which is the modulus 5 equivalent of −2.

Tables for the encoding for other moduli can be accomplished with the algorithm shown in Table 51 by appropriately changing the value of MI. Numbers of different bit lengths can also be handled by modifying the RANGE variable.

A two's complement number can also encoded with a modified cascaded approach. The basic structure of the nodes is shown in FIG. 4. The number to be encoded is partitioned into several sections. All sections which do not contain the most significant bit are handled in the usual manner. The node which encodes and incorporates the section containing the most significant bit into the cascade must be modified. If the most significant bit is 1 indicating that the number is negative then the numeric equivalent of the section would be converted into its modular equivalent. The modular equivalent to the range would then be subtracted from this in a modular manner and the modular result from the previous node would be added to this in a modular manner. If the most significant bit is 0 then the numeric equivalent of the section would be converted into its modular equivalent and this would be added in a modular manner to the modular result from the previous node. The algorithm for generating a table for encoding of bits $b_{11}$–$b_9$ of a 12 bit number into its modulus 5 equivalent is shown in Table 53.

TABLE 53

Cascaded Encoding for a Two's Complement Number [11:9]

```
MI : = 5;
RANGE : = 2**12;
WF : = 2**9;
FOR ADDR : = 0 STEP 1 UNTIL 63 DO
BEGIN
MSB : = ADDR[2];
OP1 : = ADDR[2:0];
OP2 : = ADDR[5:3];
IF MSB = 0 AND OP2<MI THEN
```

TABLE 53-continued

Cascaded Encoding for a Two's Complement Number [11:9]

```
MEM(ADDR) : =
MOD(MOD(OP1*WF,MI) + OP2, MI);
IF MSB = 1 AND OP2<MI THEN
MEM(ADDR) : =
MOD(MOD(OP1*WF, MI) - MOD(RANGE, MI) + OP2, MI);
END;
```

MI is set to 5. Since the number to be encoded can be up to 12 bits long the range is $2^{12}$. Since the bits to be encoded are $b_{11}$–$b_9$ the weighting factor is $2^9$. The memory is scanned. Bit $b_2$ of the address is assumed to be be the most significant bit. Bits $b_2$–$b_0$ is the section to be encoded, OP1. Bits $b_5$–$b_3$ represents the modular result from the previous node of the cascade, OP2. If the most significant bit is 0 then the modular equivalent of the numeric equivalent of the bits to be encoded is added in a modular manner to the result from the previous node. If the most significant bit is 1 then the modular equivalent of the range is subtracted in a modular manner from the modular equivalent of the numeric equivalent of the bits to be encoded. The result is then added in a modular manner with the modular result from the previous node. Such a table is shown in Table 54.

TABLE 54

Cascaded Encoding for a Two's Complement Number [11:9]

| ADDRESS | CONT | ADDRESS | CONT | ADDRESS | CONT |
|---------|------|---------|------|---------|------|
| 000000  | 0000 | 010101  | 0001 | 101010  | XXXX |
| 000001  | 0010 | 010110  | 0011 | 101011  | XXXX |
| 000010  | 0100 | 010111  | 0000 | 101100  | XXXX |
| 000011  | 0001 | 011000  | 0011 | 101101  | XXXX |
| 000100  | 0010 | 011001  | 0000 | 101110  | XXXX |
| 000101  | 0100 | 011010  | 0010 | 101111  | XXXX |
| 000110  | 0001 | 011011  | 0100 | 110000  | XXXX |
| 000111  | 0011 | 011100  | 0000 | 110001  | XXXX |
| 001000  | 0001 | 011101  | 0010 | 110010  | XXXX |
| 001001  | 0011 | 011110  | 0100 | 110011  | XXXX |
| 001010  | 0000 | 011111  | 0001 | 110100  | XXXX |
| 001011  | 0010 | 100000  | 0100 | 110101  | XXXX |
| 001100  | 0011 | 100001  | 0001 | 110110  | XXXX |
| 001101  | 0000 | 100010  | 0011 | 110111  | XXXX |
| 001110  | 0010 | 100011  | 0000 | 111000  | XXXX |
| 001111  | 0100 | 100100  | 0001 | 111001  | XXXX |
| 010000  | 0010 | 100101  | 0011 | 111010  | XXXX |
| 010001  | 0100 | 100110  | 0000 | 111011  | XXXX |
| 010010  | 0001 | 100111  | 0010 | 111100  | XXXX |
| 010011  | 0011 | 101000  | XXXX | 111101  | XXXX |
| 010100  | 0100 | 101001  | XXXX | 111110  | XXXX |
|         |      |         |      | 111111  | XXXX |

The tables needed to encode bits $b_8$–$b_6$ and $b_5$–$b_0$ are the same as those needed for regular cascaded encoding. The algorithms needed are shown in Tables 34 and 32 while the actual tables associated with $b_8$–$b_6$ and $b_5$–$b_0$ as shown in Tables 35 and 33 respectively.

As an example, to encode 111111111110 into modulus 5 the number could be partitioned into 111, 111, and 111110. 111110 would be translated by Table 33 into 010. This and bits $b_8$–$b_6$111, would be used to form the address 010111. Table 35 would translate this into 000. This and bits $b_{11}$–$b_9$ would form the address 000111. Table 54 would translate this into 011 which is the modulus 5 equivalent of −2.

The most significant bit could also be in the section directly encoded by the first node in the cascade if desired. The approach would be the same as that of direct encoding from two's complement shown in Table 47, however the weighting factor would have to be adjusted for the section of bits to be encoded.

The cascaded approach to encoding of two's complement can be applied to other moduli by appropriately adjusting MI. This approach can be extended to encode any number of bits.

The modular arithmetic nodes such as modular addition, modular subtraction, modular multiplication, and modular integer polynomial transforms can be combined to perform various calculations in a modular manner.

A modular processor to perform a summation in a modular manner is shown in FIG. 6. Nodes 45–61 are modular addition nodes. The numbers to be summed are first encoded. The modular equivalents of these numbers are distributed to inputs 27–44. Node 45 adds input 27 and 28. Nodes 46–52 add the other inputs in a similar manner. Node 53 adds the outputs of nodes 45 and 46. Nodes 54–56 handle the outputs of nodes 47–52 in a similar manner. Node 57 adds the outputs of nodes 53 and 54. Node 60 adds the outputs of nodes 55 and 56. Node 61 adds the outputs of nodes 57 and 60. The result of node 61 is the modular equivalent of the desired summation.

As an example suppose this modular processor was for modulus 5. Nodes 45–61 would be represented by Table 5. For simplicity suppose that the numbers to be added were all equal to 2. These inputs would be translated into their modular equivalents by an encoder such as that represented by Table 48. 000010 translates into 010. This would be applied to inputs 27–44. Node 45 would have 010 and 010 as operands. This forms an address of 010010. Table 5 translates this into 100. Nodes 46–52 produce similar results. Node 53 would have 100 and 100 as operands. This forms and address of 100100. Table 5 translates this into 011. Nodes 54–56 produces similar results. Node 57 has as operands 011 and 011. This forms an address of 011011. Table 5 translates this into 001. Node 60 produces a similar result. Node 61 has as operands 001 and 001. This forms an address of 001001. Table 5 translates this into 010 which is the modular 5 equivalent of the sum which is 32 in decimal.

This calculation can be performed for modulus 7 by using Tables 49 and 6. The result would be 100.

The calculation can also be performed for modulus 8 by using Tables 50 and 7. The result would be 000.

A similar structure can be constructed for any modulus. The structure can be adapted to sum any number of inputs of any accuracy.

A modular processor to perform an inner product in a modular manner is shown in FIG. 7. An inner product is fundamental in the computation of matrix arithmetic, correlation, convolutions, etc. The nodes 68, 69, and 70 are modular multiplication nodes. Nodes 71 and 73 are modular addition nodes. Node 72 is a delay node. Boxes 62–67 represent encoders and are included for completeness. The elements of a vector Z are converted into their modular equivalents by encoders 62, 64, and 66. The element of vector Y are converted by encoders 63, 65, and 67. Node 68 multiplies in a modular manner the outputs of encoders 62 and 63. Nodes 69 and 70 process the other modular equivalents in a similar manner. Node 71 sums the results of nodes 68 and 69. Node 73 sums the results from node 71 and node 70 which had been delayed by node 72. The result of node 73 is the modular equivalent of the desired inner product. Node 72 was inserted to synchronize the arrival of the operands to node 73.

As an example suppose the modular inner product processor were for modulus 5. If the vector $Z = (-2, -2, 2)$ and $Y = (3, 3, 3)$. The vector Z in 6 bit two's complement form would be (111110, 111110, 000010). This would be translated by an encoder such as that represented by Table 48 into 011, 011, and 010. The vector Y would be encoded into 011, 011, and 011. Node 68 would have as operands 011 and 011. These would form an address of 011011. Node 68 would perform modular 5 multiplication. This is accomplished by a table such as Table 13. the result is 100. Nodes 68 and 70 would produce 100 and 001 respectively. Node 71 adds the results from nodes 68 and 69. In this case it has as operands 100 and 100. Modulus 5 addition is performed by Table 5. The operands form an address of 100100. The result is 011. The result of node 70 is fed to a delay node 72 which is represented by a table such as Table 22. The result of node 70 which is 001 is used to form an address of 000001. The result is 001 which is the same as the input but delayed. Node 73 performs modular addition of the results from node 71 and 72. The operands are 011 and 001. They form an address of 011001. The operation of node 73 is performed by Table 5. The result is 100 which is the modular 5 equivalent of $-2*3 + -2*3 + 2*3 = -6$.

The calculation can also be performed for modulus 7 by using Tables 49, 14, and 6. The result would be 001.

The calculation can also be performed for modulus 8 by using Tables 50, 15, and 7. The result would be 010.

Such a modular inner product processor can be constructed for other moduli. It can be adapted to perform an inner product of vectors of any length and accuracy.

A modular processor to perform the summation of multiple products in a modular manner is shown in FIG. 8. The summation of multiple products is useful in computing determinants of a matrix. Determinants are useful in computing the inverses of matrixes. The inverse of a matrix is useful in solving simultaneous linear equations. Squares 74–85 represent encoders which feed the modular equivalents of the input numbers of the modular processor. They are included for completeness. Nodes 86–94 are modular multiplication nodes. Nodes 96 is a delay node. Nodes 95 and 97 are modular addition nodes. Node 86 multiplies the results from encoders 74 and 75. Nodes 86–91 process the results from encoders 76–85 in a similar manner. Node 92 multiplies the results from nodes 86 and 87. Nodes 93 and 94 process the results from nodes 88–91 in a similar manner. Node 95 adds the results from nodes 92 and 93. Node 96 delays the result from node 94. Node 97 adds the results from node 95 and 96. The result from node 97 is the modular equivalent of the desired summation of multiple products.

As an example suppose that the modular processor were for modulus 5. And suppose that the inputs to encoders 74–85 were 1, 2, 3, 4, $-1$, 2, 3, 4, 1, $-2$, 3, and 4. In 6 bit two's complement this would be 000001, 000010, 000011, 000100, 111111, 000010, 000011, 000100, 000001, 111110, 000011, and 000100. When this is translated by an encoder such as that represented by Table 48 this becomes 001, 010, 011, 100, 100, 010, 011, 100, 001, 011, 011, and 100. Node 86 multiplies the results from encoders 74 and 75. These results 001 and 010 form an address of 001010 for Table 13. The result is 010. Nodes 87–91 behave in a similar manner and produce 010, 011, 010, 011, and 010. Node 92 multiplies the results from nodes 86 and 87. The results 010 and 010 form the address 010010. Modular multiplication Table 13 translates this into 100. Nodes 93 and 94 act in a similar manner producing 001 and 001. Node 95 adds the results of nodes 92 and 93. The results 100 and 001 form an address of 100001 for Table 5. The result is 000. Node 96 is a delay node. The result from node 94 which is 001 is used to form an address 000001 for Table 22. The result is 001. Node 97 adds the result of nodes 95 and 96. The results 000 and 001 form an address of 000001 for Table 5. The result is 001 which is the modulus 5 equivalent of the calculation $1*2*3*4 + -1*2*3*4 + 1* - 2*3*4 = -24$.

The calculation can also be performed for modulus 7 by using Tables 49, 14, and 6. The result would be 100.

The calculation can also be performed for modulus 8 by using Tables 50, 15, and 7. The result would be 000.

Such a modular processor to compute the summation of multiple products can be constructed for other moduli. It can be adapted to handle multiple products of any order. It can also be adapted to handle any number of inputs of any accuracy.

A modular processor to compute the summation of the squares of differences is shown in FIG. 9. Such a calculation is useful in computing vector distances which are useful as estimators to control various systems. The squares 100-102 represent encoders which translate the input numbers and feed them to the modular processor. They are included for completeness. Node 108 performs the integer polynomial transform $P(x,y) = (x-y)^2$. It computes the square of the difference in the results from encoders 100 and 101. Nodes 109-111 perform the same computation for the results of encoders 102-107. Node 112 adds the results from nodes 108 and 109. Nodes 113 adds the results from nodes 110 and 111. Node 114 adds the results from nodes 112 and 113. The result of node 114 is the modular equivalent of the sum of the square of the differences.

As an example suppose that the modular processor were for modulus 5. And suppose the input to encoders 100-107 were 1, −2, −3, −4, 5, 6, 7, and 9. In 6 bit two's complement this would be 000001, 111110, 111101, 111100, 000101, 000110, 000111, and 001001. An encoder such as that represented by Table 48 would translate this into 001, 011, 010, 001, 000, 001, 010, and 100. Node 108 computes the square of the differences of the results from encoders 100 and 101. The results 001 and 011 are used to from an address 001011. The table which performs the transform of node 108 is shown in Table 17. The result is 100. Nodes 109-111 process the results from encoders 102-107 in a similar manner to produce 001, 001, and 100. Node 112 adds the results from nodes 108 and 109. Node 112 is represented by Table 5. The results 100 and 001 form the address 100001. The table translates this into 000. Node 113 adds the results from nodes 110 and 111. The result is 000. Node 114 adds the results from nodes 112 and 113. The results 000 and 000 form an address of 000000. Table 5 translates this into 000 which is the modulus 5 equivalent of the calculation $(1 - -2)^2 + (-3 - -4)^2 + (5-6)^2 + (7-9)^2 = 9+1+1+4 = 15$.

The calculation can be performed for modulus 7 by using Tables 49, 18, and 6. The result would be 001.

The calculation can also be performed for modulus 8 by using Tables 50, 19, and 7. The result would be 111.

Such a modular processor to compute the modular equivalent of the sum of the squares of differences can be constructed for other moduli. It can be adapted for any number of inputs and any accuracy.

Figure 10:
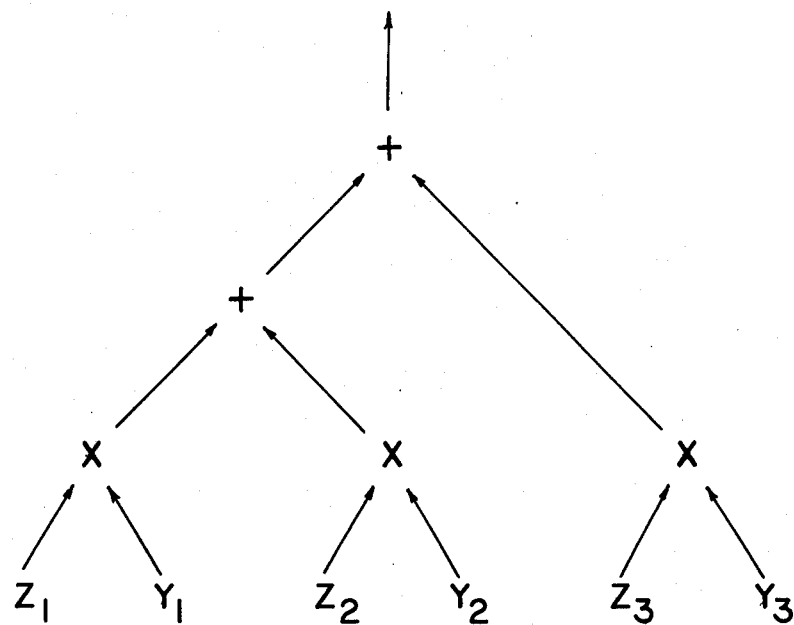
FIG. 10 illustrates a expression evaluation tree for an inner product.

A modular processor can be designed for any computation involving addition, subtraction, multiplication, or integer polynomial transorms. Nodes can be constructed to perform each of these operations in a modular manner. The nodes are then interconnected in a manner dictated by an expression evaluation tree of the desired computation. Such a diagram shows the interrelationship between the operands and operations. The expression evaluation tree associated with the modular inner product processor in FIG. 7 is shown in FIG. 10. The diagram shows where, which, and how operands interact. The flow of computation information is patterned after an expression evaluation tree. The only difference between the structures in FIGS. 7 and 10 is that a delay node 72 has been inserted. Its purpose was to equalize the branch length or nodal distance from each leaf node to the root node. This synchronizes the flow of computational information as it flows through the structure.

The general procedure for designing a modular processor would be to construct an expression evaluation tree of the desired computation; insert delay nodes to equalize the branch lengths between all the leaf nodes and the root node; implement each node with a suitable table; and interconnect the nodes in a manner prescribed by the expression evaluation tree.

When a number is expressed in a modular form it is difficult to determine relative magnitudes and sign information. These difficulties can be overcome by converting the modular equivalents into a mixed radix number. This conversion process is discussed in detail in U.S. Pat. No. 4,107,783 and in the book by Szabo and Tanaka. For completeness it will be reviewed briefly.

Suppose we wish to express a number X in terms of the coefficients $a_2$, $a_1$, and $a_0$ with the weighting factors 7*5, 5, and 1. This is shown in the following equation:

$$X = a_2(7*5) + a_1(5) + a_0$$

X can be divided by 5 giving:

$$X/5 = a_2(7) + a_1 \text{ with a remainder of } a_0$$

The remainder of the division is coefficient $a_0$. $a_0$ can then be subtracted from the original equation giving:

$$X - a_0 = a_2(7*5) + a_1(5)$$

This equation is now exactly divisible by 5 giving:

$$(X - a_0)/5 = a_2(7) + a_1$$

For clarity X' can be substituted for $(X-a_0)/5$ giving:

$$X' = a_2(7) + a_1$$

$a_1$ can be extracted for X' in the same way as $a_0$ was extracted from X. This process is repeated until all the coefficients are extracted. This process of dividing by a number; subtracting the remainder from the original equation; and dividing this by the same number to form a new equation is known as Euclid's base conversion algorithm. A specialized version of this is commonly used to convert from decimal to binary.

These coefficients can be viewed as the digits of a mixed radix number. The weighting factors associated with the coefficients are (7*5), (5), and (1). This number system is known as a mixed radix system because the weighting factors are not powers of the same radix such as $10^2$, $10^1$, and $10^0$ in a decimal system. The weighting factors are arranged in ascending order of magnitude for relative magnitude comparisons. Mixed radix digits need only be compared in descending order of significance. These particular weighting factors are chosen because they will allow the conversion process to be accomplished with only residue arithmetic.

The algorithm is slightly modified if the number to be converted is in residue form. In this case the modular 5 equivalent, or remainder after division by 5, is immediately available giving $a_0$. This modular equivalent is then subtracted in a modular manner from the residue digits of the number. The modular 5 digit would then be 0 indicating that the residue number is exactly divisible by 5. The modulus 5 digit is no longer required and can be dropped at this point. To divide by 5 we multiply each of the other residue digits by the multiplicative inverse of 5 for the corresponding modulus. The modulus 7 equivalent of this result gives $a_1$. This is then subtracted from the digits of the remaining moduli. The modulus 7 is no longer needed and can be dropped. The result is now exactly divisible by 7. The digits of the remaining moduli are multiplied by the multiplicative inverse of 7. This procedure is continued until all the coefficients have been derived.

The multiplicative inverse, MINV, of a number A for a modulus MI is the smallest positive number such that MOD( A*MINV, MI)=1. An algorithm for finding the multiplicative inverse of 5 for modulus 8 is shown in Table 55.

TABLE 55

Algorithm to Find Multiplicative Inverse

MI: = 8;
DIV: = 5;
FOR I: = 0 STEP 1 UNTIL MI-1 DO
    IF MOD(DIV*I, MI) = 1 THEN MINV: = I;

The modulus MI is set to 8. The divisor is 5. All the modulus 8 digits are tested to see if when they are multiplied in a modular manner by the divisor, 5, the result is a 1. The digit which does is the multiplicative inverse of the divisor for modulus 8. It can be shown that in this case the multiplicative inverse is 5 thus MOD (5*5, 8)=1.

An example of converting a residue number 4 3 6 into its mixed radix equivalent is shown in Table 56.

TABLE 56

| MODULUS | 5 | 7 | 8 |
|---|---|---|---|
| $a_0$ → | 4 | 3 | 6 |
| | −4 | −4 | −4 |
| | 0 | 6 | 2 |
| | | X3 | X5 |
| $a_1$ → | | 4 | 2 |
| | | −4 | −4 |
| | | 0 | 6 |
| | | | X7 |
| $a_2$ → | | | 2 |

Conversion to Mixed Radix

The modulus 5 result is 4 and thus $a_0$ is 4. This is subtracted from all the residue digits. The result is 0 6 2. The modulus 7 result, 6, is multiplied by 3 which is the multiplicative inverse of 5 for modulus 7. The modulus 8 result, 2, is multiplied by 5 which is the multiplicative inverse of 5 for modulus 8. The result is 4 2. The modulus 7 portion of this result is 4 and gives $a_1$. This is subtracted from the remaining residue digit. The modulus 8 result, 6, is then multiplied by the 7 which is the multiplicative inverse of 7 for modulus 8. The result is 2 which is $a_2$. The mixed radix coefficients $a_2$, $a_1$, and $a_0$ are thus 2, 4, and 4. These coefficients when associated with their appropriate weighting factors give $2(7*5)+4(5)+4(1)=94$. Thus 4 3 6 in residues corresponds to 244 in mixed radix which corresponds to 94 in decimal.

The weighting factor associated with a particular mixed radix coefficient is the product of 1 and all the moduli which have been used as divisors. In the case of $a_2$, moduli 5 and 7 had been used previously as divisors thus the weighting factor should be 1*5*7.

The basic operation in the conversion process is a subtraction and then multiplication by a multiplicative inverse. This operation can be viewed as a simple integer polynomial transform and can thus be represented as a table.

The algorithm to subtract $a_0$ from the modulus 7 equivalent and multiply the result by 3 which is the multiplicative inverse of 5 for modulus 7 is shown in Table 57.

TABLE 57

MI : = 7;
MA : = 5;
MINV : = 3;
FOR ADDR : = 0 STEP 1 UNTIL 63 DO
    BEGIN
    OP1 : = ADDR [2:0];
    OP2 : = ADDR [5:3];
    IF OP1<MI AND OP2<MA THEN
        MEM(ADDR) : = MOD( (OP1 − OP2) *MINV, MI);
    END;

Polynomial Transform for Mixed Radix Conversion

The modulus, MI is set to 7. The modulus of the coefficient to be subtracted, MA is set to 5. The multiplicative inverse of 5 for modulus 7 can be found to be 3. The memory is scanned. Bits $b_2$–$b_0$ of the address are assumed to represent the modular result of the modulus 7, OP1. Bits $b_5$–$b_3$ are assumed to represent the coefficient to be subtracted, OP2. If OP1 and OP2 are valid operands for their associated moduli then the modular equivalent of the product of the multiplicative inverse and the coefficient subtracted from the modulus 7 result is stored at the corresponding location. Such a table is shown in Table 58.

TABLE 58

| ADDRESS | CONT | ADDRESS | CONT | ADDRESS | CONT |
|---|---|---|---|---|---|
| 000000 | X000 | 010101 | X010 | 101010 | XXXX |
| 000001 | X011 | 010110 | X101 | 101011 | XXXX |
| 000010 | X110 | 010111 | XXXX | 101100 | XXXX |
| 000011 | X010 | 011000 | X101 | 101101 | XXXX |
| 000100 | X101 | 011001 | X001 | 101110 | XXXX |
| 000101 | X001 | 011010 | X100 | 101111 | XXXX |
| 000110 | X100 | 011011 | X000 | 110000 | XXXX |
| 000111 | XXXX | 011100 | X011 | 110001 | XXXX |
| 001000 | X100 | 011101 | X110 | 110010 | XXXX |
| 001001 | X000 | 011110 | X010 | 110011 | XXXX |
| 001010 | X011 | 011111 | XXXX | 110100 | XXXX |
| 001011 | X110 | 100000 | X010 | 110101 | XXXX |
| 001100 | X010 | 100001 | X101 | 110110 | XXXX |
| 001101 | X101 | 100010 | X001 | 110111 | XXXX |
| 001110 | X001 | 100011 | X100 | 111000 | XXXX |
| 001111 | XXXX | 100100 | X000 | 111001 | XXXX |
| 010000 | X001 | 100101 | X011 | 111010 | XXXX |
| 010001 | X100 | 100110 | X110 | 111011 | XXXX |
| 010010 | X000 | 100111 | XXXX | 111100 | XXXX |
| 010011 | X011 | 101000 | XXXX | 111101 | XXXX |
| 010100 | X110 | 101001 | XXXX | 111110 | XXXX |

TABLE 58-continued

| ADDRESS | CONT | ADDRESS | CONT | ADDRESS | CONT |
|---------|------|---------|------|---------|------|
|         |      |         |      | 111111  | XXXX |

P (x) = (mod 7 − mod 5) * 3 for Conversion to Mixed Radix

A similar table can be constructed to subtract $a_0$ from the modulus 8 equivalent and multiply the result by 5 which is the multiplicative inverse of 5 for modulus 8. The algorithm in Table 57 would be modified by changing MI to 8 and MINV to 5. Such a table is shown in Table 59.

TABLE 59

| ADDRESS | CONT | ADDRESS | CONT | ADDRESS | CONT |
|---------|------|---------|------|---------|------|
| 000000  | X000 | 010101  | X111 | 101010  | XXXX |
| 000001  | X101 | 010110  | X100 | 101011  | XXXX |
| 000010  | X010 | 010111  | X001 | 101100  | XXXX |
| 000011  | X111 | 011000  | X001 | 101101  | XXXX |
| 000100  | X100 | 011001  | X110 | 101110  | XXXX |
| 000101  | X001 | 011010  | X011 | 101111  | XXXX |
| 000110  | X110 | 011011  | X000 | 110000  | XXXX |
| 000111  | X011 | 011100  | X101 | 110001  | XXXX |
| 001000  | X011 | 011101  | X010 | 110010  | XXXX |
| 001001  | X000 | 011110  | X111 | 110011  | XXXX |
| 001010  | X101 | 011111  | X100 | 110100  | XXXX |
| 001011  | X010 | 100000  | X100 | 110101  | XXXX |
| 001100  | X111 | 100001  | X001 | 110110  | XXXX |
| 001101  | X100 | 100010  | X110 | 110111  | XXXX |
| 001110  | X001 | 100011  | X011 | 111000  | XXXX |
| 001111  | X110 | 100100  | X000 | 111001  | XXXX |
| 010000  | X110 | 100101  | X101 | 111010  | XXXX |
| 010001  | X011 | 100110  | X010 | 111011  | XXXX |
| 010010  | X000 | 100111  | X111 | 111100  | XXXX |
| 010011  | X101 | 101000  | XXXX | 111101  | XXXX |
| 010100  | X010 | 101001  | XXXX | 111110  | XXXX |
|         |      |         |      | 111111  | XXXX |

P (x) = (mod 8 − mod 5) * 5 for Conversion to Mixed Radix

A similar table can be constructed to subtract $a_1$ from the modulus 8 equivalent. The algorithm shown in Table 57 would be modified by changing MI to 8. The modulus of the coefficient to be subtracted, MA, is set to 7. The multiplicative inverse, MINV, is set to 7. Such a table is shown in Table 60.

TABLE 60

| ADDRESS | CONT | ADDRESS | CONT | ADDRESS | CONT |
|---------|------|---------|------|---------|------|
| 000000  | X000 | 010101  | X101 | 101010  | X011 |
| 000001  | X111 | 010110  | X100 | 101011  | X010 |
| 000010  | X110 | 010111  | X011 | 101100  | X001 |
| 000011  | X101 | 011000  | X011 | 101101  | X000 |
| 000100  | X100 | 011001  | X010 | 101110  | X111 |
| 000101  | X011 | 011010  | X001 | 101111  | X110 |
| 000110  | X010 | 011011  | X000 | 110000  | X110 |
| 000111  | X001 | 011100  | X111 | 110001  | X101 |
| 001000  | X001 | 011101  | X110 | 110010  | X100 |
| 001001  | X000 | 011110  | X101 | 110011  | X011 |
| 001010  | X111 | 011111  | X100 | 110100  | X010 |
| 001011  | X110 | 100000  | X100 | 110101  | X001 |
| 001100  | X101 | 100001  | X011 | 110110  | X000 |
| 001101  | X100 | 100010  | X010 | 110111  | X111 |
| 001110  | X011 | 100011  | X001 | 111000  | XXXX |
| 001111  | X010 | 100100  | X000 | 111001  | XXXX |
| 010000  | X010 | 100101  | X111 | 111010  | XXXX |
| 010001  | X001 | 100110  | X110 | 111011  | XXXX |
| 010010  | X000 | 100111  | X101 | 111100  | XXXX |
| 010011  | X111 | 101000  | X101 | 111101  | XXXX |
| 010100  | X110 | 101001  | X100 | 111110  | XXXX |
|         |      |         |      | 111111  | XXXX |

P (x) = (mod 8 − mod 7) * 7 for Conversion to Mixed Radix

The nodes containing these residue to mixed radix conversion tables would be interconnected as shown in FIG. 11. Node 115 represents the root node of a modular processor for modulus 5. Nodes 116 and 117 represent the root nodes of modular processors for moduli 7 and 8 respectively. Node 120 subtracts $a_0$ the modulus 5 result, from the modulus 7 result and multiples by a multiplicative inverse. This operation corresponds to Table 58. Node 121 subtracts $a_0$ from the modular 8 result and multiplies by a multiplicative inverse. This operation corresponds to Table 59. Node 122, subtracts $a_1$ from the modular 8 result and multiplies by a multiplicative inverse. This operation corresponds to Table 60. Nodes 123, 124, and 125 are delay nodes.

As an example of how the residue to mixed conversion process works, suppose the residue number to be converted was 4 3 6 for moduli 5, 7, and 8 respectively. The modulus 5 result, 4 which is $a_0$, would emerge from node 115 and be distributed to bits $b_2$-$b_0$ of the input of delay node 123, to input bits $b_5$-$b_3$ of nodes 120 and 121. The modulus 7 result, 3, from node 116 would be communicated to bits $b_2$-$b_0$ of the input of node 120. Node 120 subtracts the result of node 115 from that of node 116 and then multiplies the result in a modular manner by 3 which is the multiplicative inverse of 5 for modulus 7. The operands of node 120 namely 100 and 011 form an address of 100011 for Table 58. The result which is $a_1$ would be 100. The modulus 8 result, 5, from node 117 would be communicated to bits $b_2$-$b_0$ of the input of node 121. Node 121 subtracts the result of node 115 from that of node 117 and then multiplies the result in a modular manner by 5 which is the multiplicative inverse of 5 for modulus 8. The operands of node 121, namely 100 and 110 form the address 100110. The result from Table 59 is 010.

The result from delay node 123 is distributed to delay node 124. The result of node 120 is distributed to delay node 125 and to bits $b_5$-$b_3$ of the input of node 122. The result of node 121 is distributed to bits $b_2$-$b_0$ of the input of node 122. Node 122 subtracts the result of node 120 from that of node 121 and then multiplies the result by 7 which is the mutiplicative inverse of 7 for modulus 8. The operands of node 122, namely 100 and 010 form the address 100010. The result of Table 60 gives 010 which is $a_2$. Thus the mixed radix equivalent $a_2$ $a_1$ $a_0$ would be 2 4 4 which is the same as found in Table 56.

The computational structure of a residue to mixed radix converter becomes clear when more moduli are used. A unit which converts 4 moduli is shown in FIG. 12. The result of a modular processor MP1 is distributed to nodes where it interacts with the results from the other modular results. One of these new results is then distributed to the other nodes where it interacts with the other new results. This process is repeated until there is only one new result to be distributed. The results which were distributed are the mixed radix coefficients. They are derived sequentially. The delay nodes are used to synchronize the emergence of these coefficients from the converter. Such a residue to mixed radix converter can be extended to handle any number of moduli.

Once the answer has been converted into a mixed radix format it is in a form convenient for relative magnitude comparison or sign determination. It can be stored or encoded into residues for further processing if desired. While a mixed radix representation is sufficient in some situations the answers are still not in a form compatible with conventional computers.

Figure 13:
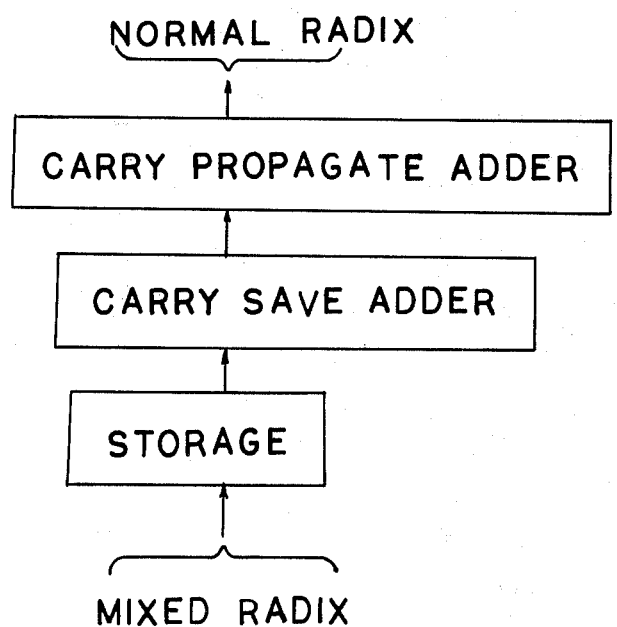
FIG. 13 is a block diagram illustrating a mixed to normal radix converter.

This conversion from mixed radix to normal radix can be performed by a unit shown in FIG. 13. Each possible mixed radix digit of each mixed radix place has associated with it a number in a normal radix. These numbers are stored in a unit 130. The number associated with each of the mixed radix coefficients to be converted is retrieved from this storage to be added together. If there are more than two numbers to be added then carry save adders 131 are used to add the numbers in parallel without carries. This can be done until the number of numbers to be added are reduced to only two. These numbers can then added with a carry propagate adder 132. The result of the carry propagate adder is a binary version of the answer of the desired computation. The storage, carry save adders, and carry propagate adder can be constructed from nodes which are implemented with memories.

Figure 14:
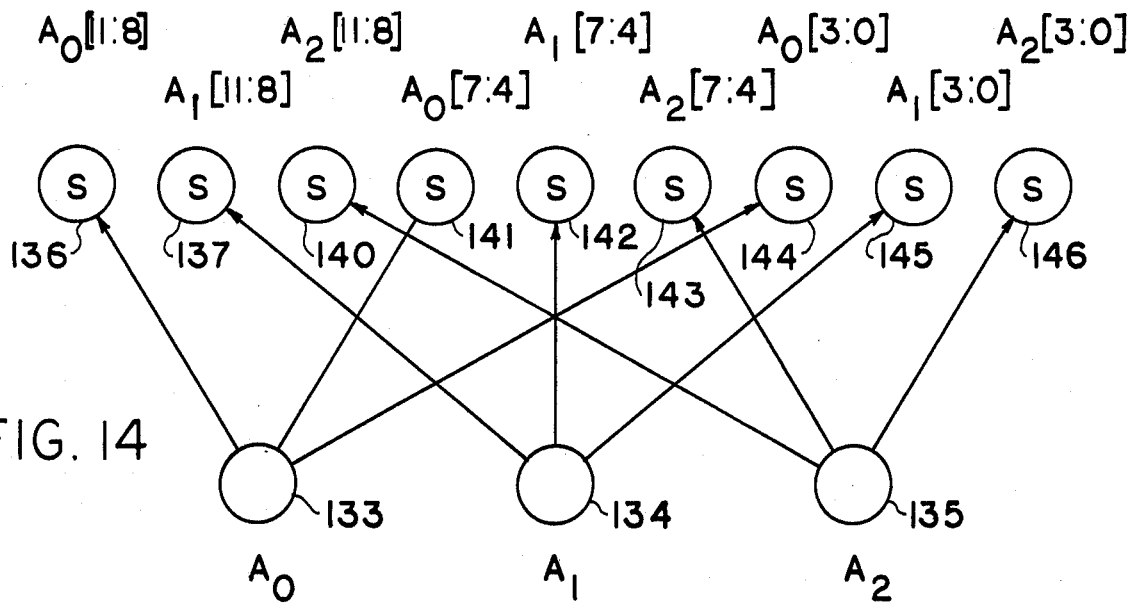
FIG. 14 illustrates the storage section of a mixed to normal radix converter which stores the normal radix equivalent of each mixed radix coefficient.

The normal radix equivalents of each possible mixed radix coefficient can be stored in a direct form as shown in FIG. 14. The normal radix equivalent of a coefficient is the product of the value of a coefficient and its weighting factor. Nodes 133, 134, and 135 are the output nodes of a residue to mixed radix converter such as 124, 125, and 122 as shown in FIG. 11. Nodes 136–146 hold multibit slices of the normal radix equivalents. Node 146 contains bits $b_3$–$b_0$ of the normal radix equivalent of each possible value of $a_2$. $a_2$ can have any value from 0 to 7. Node 143 contains bit $b_7$–$b_4$ and node 140 contains bits $b_{11}$–$b_8$. Nodes 145, 142, 137, and 144, 141, 136, do the same for each possible coefficient of $a_1$ and $a_0$ respectively.

The weighting factor associated with the coefficient $a_0$ is 1. The maximum value of the coefficient is 4. Thus the maximum normal radix equivalent of $a_0$ is 4. This can be expressed with only 3 bits. Bits $b_{11}$–$b_8$ and $b_7$–$b_4$ would be all 0's. Thus nodes 136 and 141 are not needed. Node 137 which holds bits $b_{11}b_8$ of coefficient $a_1$ is also just 0's can also be removed.

An algorithm to generate a table to store bits $b_7$–$b_4$ of the normal radix equivalent of $a_2$ for node 143 is shown in Table 61.

TABLE 61

```
MI : = 8;
WF : = 5*7;
B : = 7;
E : = 4;
FOR COEF : = 0 STEP 1 UNTIL MI − 1 DO
    BEGIN
        X : = WF*COEF;
        MEM(COEF) : = X [B:E];
    END;
```

Storage of [7:4] of Normal Equivalents of $a_2$

MI is the modulus from which the coefficient was derived. $a_2$ was derived from modulus 8. WF indicates the weighting factor associated with this coefficient In this case it is 5*7. B indicates at which bit the bit slice begins. E indicates at which bit the bit slice ends. All the possible values of the coefficient are considered. The normal radix equivalent of each value of the coefficient is calculated. Bits $b_7$–$b_4$ of this equivalent is stored in a location dependent on the value of the coefficient. Such a table is shown in Table 62.

TABLE 62

| ADDRESS | CONT | ADDRESS | CONT | ADDRESS | CONT |
|---------|------|---------|------|---------|------|
| 000000  | 0000 | 010101  | XXXX | 101010  | XXXX |
| 000001  | 0010 | 010110  | XXXX | 101011  | XXXX |
| 000010  | 0100 | 010111  | XXXX | 101100  | XXXX |
| 000011  | 0110 | 011000  | XXXX | 101101  | XXXX |
| 000100  | 1000 | 011001  | XXXX | 101110  | XXXX |
| 000101  | 1010 | 011010  | XXXX | 101111  | XXXX |
| 000110  | 1101 | 011011  | XXXX | 110000  | XXXX |
| 000111  | 1111 | 011100  | XXXX | 110001  | XXXX |

TABLE 62-continued

| ADDRESS | CONT | ADDRESS | CONT | ADDRESS | CONT |
|---------|------|---------|------|---------|------|
| 001000  | XXXX | 011101  | XXXX | 110010  | XXXX |
| 001001  | XXXX | 011110  | XXXX | 110011  | XXXX |
| 001010  | XXXX | 011111  | XXXX | 110100  | XXXX |
| 001011  | XXXX | 100000  | XXXX | 110101  | XXXX |
| 001100  | XXXX | 100001  | XXXX | 110110  | XXXX |
| 001101  | XXXX | 100010  | XXXX | 110111  | XXXX |
| 001110  | XXXX | 100011  | XXXX | 111000  | XXXX |
| 001111  | XXXX | 100100  | XXXX | 111001  | XXXX |
| 010000  | XXXX | 100101  | XXXX | 111010  | XXXX |
| 010001  | XXXX | 100110  | XXXX | 111011  | XXXX |
| 010010  | XXXX | 100111  | XXXX | 111100  | XXXX |
| 010011  | XXXX | 101000  | XXXX | 111101  | XXXX |
| 010100  | XXXX | 101001  | XXXX | 111110  | XXXX |
|         |      |         |      | 111111  | XXXX |

Normal Radix Equivalent of $a_2$ [7:4]

Similar tables can be generated for other multibit slices of the normal radix equivalents of $a_2$. The technique can be extended to generate the tables for the normal radix equivalents of the other coefficients $a_0$ and $a_1$. The table for coefficient $a_0$ is shown in Table 63.

TABLE 63

| ADDRESS | CONT | ADDRESS | CONT | ADDRESS | CONT |
|---------|------|---------|------|---------|------|
| 000000  | 0000 | 010101  | XXXX | 101010  | XXXX |
| 000001  | 0001 | 010110  | XXXX | 101011  | XXXX |
| 000010  | 0010 | 010111  | XXXX | 101100  | XXXX |
| 000011  | 0011 | 011000  | XXXX | 101101  | XXXX |
| 000100  | 0100 | 011001  | XXXX | 101110  | XXXX |
| 000101  | XXXX | 011010  | XXXX | 101111  | XXXX |
| 000110  | XXXX | 011011  | XXXX | 110000  | XXXX |
| 000111  | XXXX | 011100  | XXXX | 110001  | XXXX |
| 001000  | XXXX | 011101  | XXXX | 110010  | XXXX |
| 001001  | XXXX | 011110  | XXXX | 110011  | XXXX |
| 001010  | XXXX | 011111  | XXXX | 110100  | XXXX |
| 001011  | XXXX | 100000  | XXXX | 110101  | XXXX |
| 001100  | XXXX | 100001  | XXXX | 110110  | XXXX |
| 001101  | XXXX | 100010  | XXXX | 110111  | XXXX |
| 001110  | XXXX | 100011  | XXXX | 111000  | XXXX |
| 001111  | XXXX | 100100  | XXXX | 111001  | XXXX |
| 010000  | XXXX | 100101  | XXXX | 111010  | XXXX |
| 010001  | XXXX | 100110  | XXXX | 111011  | XXXX |
| 010010  | XXXX | 100111  | XXXX | 111100  | XXXX |
| 010011  | XXXX | 101000  | XXXX | 111101  | XXXX |
| 010100  | XXXX | 101001  | XXXX | 111110  | XXXX |
|         |      |         |      | 111111  | XXXX |

Normal Radix Equivalent of $a_0$[3:0]

Figure 15:
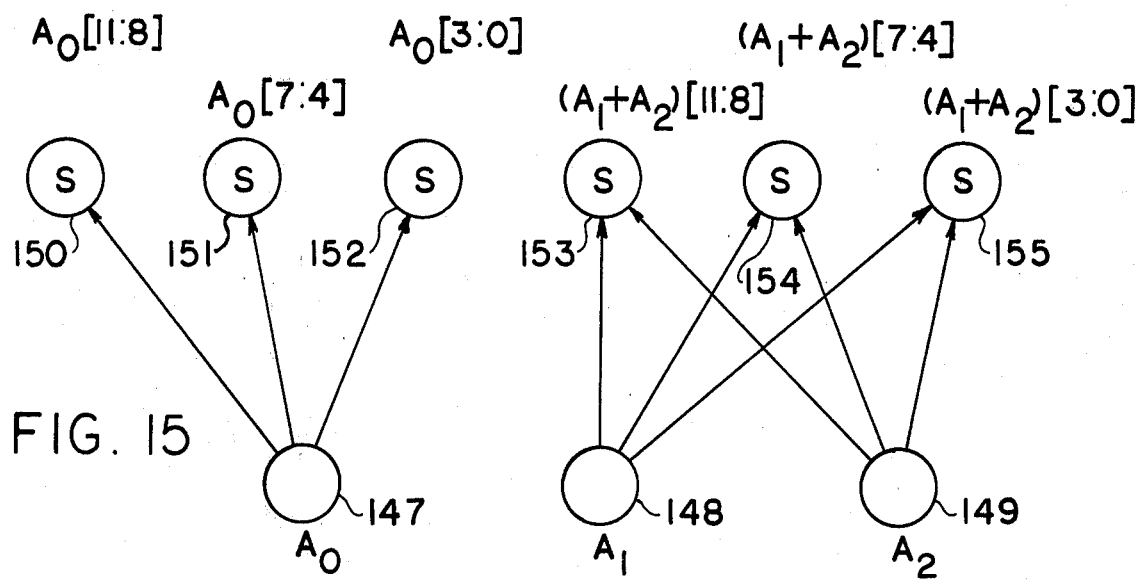
FIG. 15 illustrates the storage section of a mixed to normal radix converter which stores the sum of the normal radix equivalents of a pair of mixed radix coefficients.

It can be seen from Tables 62 and 63 that this direct approach of storage is very wasteful of space. The storage space can be used more effectively by storing the multibit slices of the sum of the normal radix equivalents associated with two mixed radix coefficients. Such an approach is shown in FIG. 15. Each value of $a_1$ and $a_2$ has a normal radix equivalent. Thus each possible combination of $a_1$ and $a_2$ has a normal radix sum associated with it. $a_1$ and $a_2$ can be combined to form an address. The multibit slice of the sum of the corresponding normal radix equivalents can be stored at this location.

An algorithm to generate a table to store bits $b_7$–$b_4$ of the sum of the of the normal radix equivalents of coefficients $a_2$ and $a_1$ is shown in Table 64.

TABLE 64

```
MI1 : = 7;
MI2 : = 8;
WF1 : = 5;
WF2 : = 5*7;
B : = 7;
E : = 4;
FOR ADDR : = 0 STEP 1 UNTIL 63 DO
    BEGIN
        OP1 : = ADDR [5:3];
        OP2 : = ADDR [2:0];
```

TABLE 64-continued

```
X1 : = WF1*OP1;
X2 : = WF2*OP2;
X : = X1 + X2;
IF OP1 < MI1 AND OP2 < MI2 THEN
    MEM(ADDR) : = X[B:E];
END;
```

Storage of [7:4] of the Sum of the Normal Equivalents of $a_2$ and $a_1$

The modulus, MI1, associated with coefficient $a_1$ is 7. The modulus MI2 associated with coefficient $a_2$ is 8. The weighting factor associated with coefficient $a_1$, WF1, is 5*1 while that for $a_2$, WF2, is 7*5*1. The multi-bit slice begins at bit $b_7$ and ends at $b_4$. The memory is scanned. Bits $b_5$-$b_3$ of the address are assumed to represent OP1 which is the value of the coefficient $a_1$. Bits $b_2$-$b_0$ represent OP2 which is the value of the coefficient $a_2$. X1 is the normal radix equivalent associated with the particular value of $a_1$. X2 is the normal radix equivalent associated with the particular value of $a_2$. X is the sum of the normal radix equivalents associated with the particular values of $a_1$ and $a_2$. If OP1 and OP2 are possible values of coefficients $a_1$ and $a_2$ then bits $b_7$-$b_4$ of the sum will be stored in the location. Such a table is shown in Table 65.

TABLE 65

| ADDRESS | CONT | ADDRESS | CONT | ADDRESS | CONT |
|---------|------|---------|------|---------|------|
| 000000 | 0000 | 010101 | 1011 | 101010 | 0101 |
| 000001 | 0010 | 010110 | 1101 | 101011 | 1000 |
| 000010 | 0100 | 010111 | 1111 | 101100 | 1010 |
| 000011 | 0110 | 011000 | 0000 | 101101 | 1100 |
| 000100 | 1000 | 011001 | 0111 | 101110 | 1110 |
| 000101 | 1010 | 011010 | 0101 | 101111 | 0000 |
| 000110 | 1101 | 011011 | 0111 | 110000 | 0001 |
| 000111 | 1111 | 011100 | 1001 | 110001 | 0100 |
| 001000 | 0000 | 011101 | 1011 | 110010 | 0110 |
| 001001 | 0010 | 011110 | 1110 | 110011 | 1000 |
| 001010 | 0100 | 011111 | 0000 | 110100 | 1010 |
| 001011 | 0110 | 100000 | 0001 | 110101 | 1100 |
| 001100 | 1001 | 100001 | 0011 | 110110 | 1111 |
| 001101 | 1011 | 100010 | 0101 | 110111 | 0001 |
| 001110 | 1101 | 100011 | 0111 | 111000 | XXXX |
| 001111 | 1111 | 100100 | 1010 | 111001 | XXXX |
| 010000 | 0000 | 100101 | 1100 | 111010 | XXXX |
| 010001 | 0010 | 100110 | 1110 | 111011 | XXXX |
| 010010 | 0101 | 100111 | 0000 | 111100 | XXXX |
| 010011 | 0111 | 101000 | 0001 | 111101 | XXXX |
| 010100 | 1001 | 101001 | 0011 | 111110 | XXXX |
|        |      |         |      | 111111 | XXXX |

Doubled-Up Mixed Radix $a_1 a_2$ [7:4]

Similar tables can be constructed for other pairs of coefficients. Tables can also be constructed for more than pairs of coefficients if sufficient address space exists to represent each coefficient.

In FIG. 15 nodes 147, 148, and 149 are the output nodes of a mixed converter such as 124, 125, and 122 shown in FIG. 11. Node 153 is constructed in accordance to the algorithm in Table 64 and shown in Table 65. Nodes 154 and 155 which store bits $b_7$-$b_4$ and $b_3$-$b_0$ can be constructed in a similar way. The coefficients $a_0$ from node 147 is without a partner. It can be stored in the manner as shown in the algorithm of Table 61. Another approach of storing $a_0$ or any unpaired coefficient is to assume a dummy coefficient with a constant value of 0. The algorithm shown in Table 64 can then be used. The dummy coefficient would have a normal radix equivalent of 0 and thus not contributed to the sum. Nodes 150 and 151 are to contain $a_0[11:8]$ and $a_0[7:4]$. As discussed previously these nodes are 0 and thus not needed.

Figure 16:
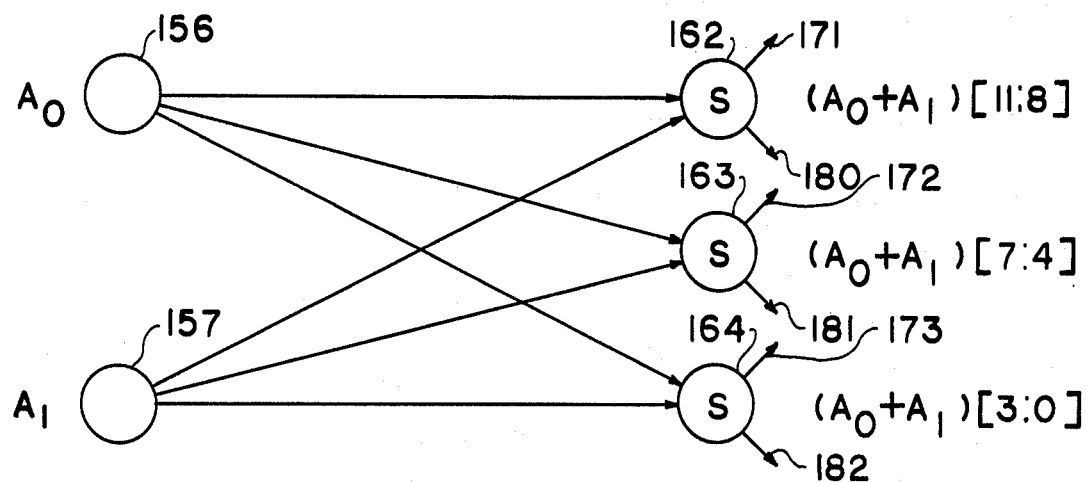
FIG. 16 illustrates the storage section of a mixed to normal radix converter for six moduli.
Figure 16:
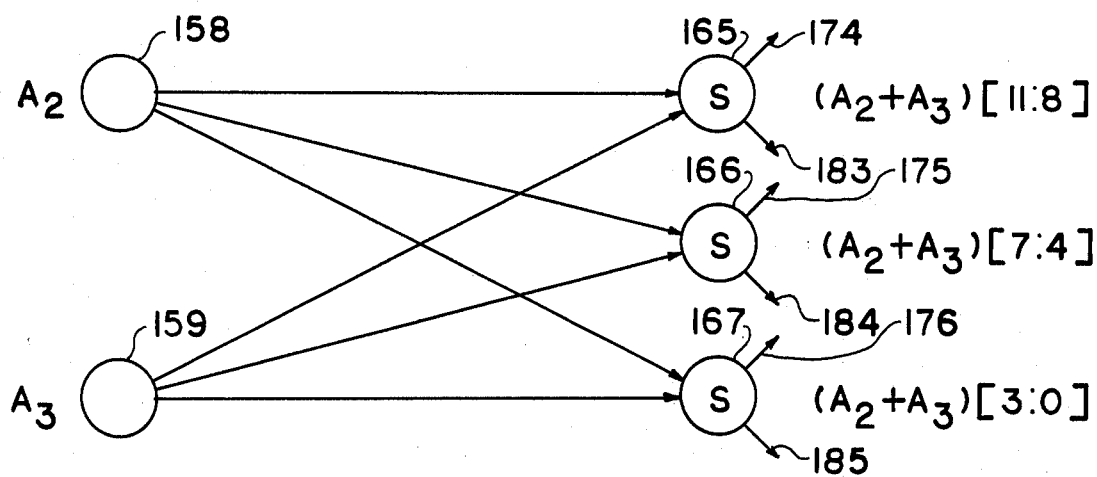
Figure 16:
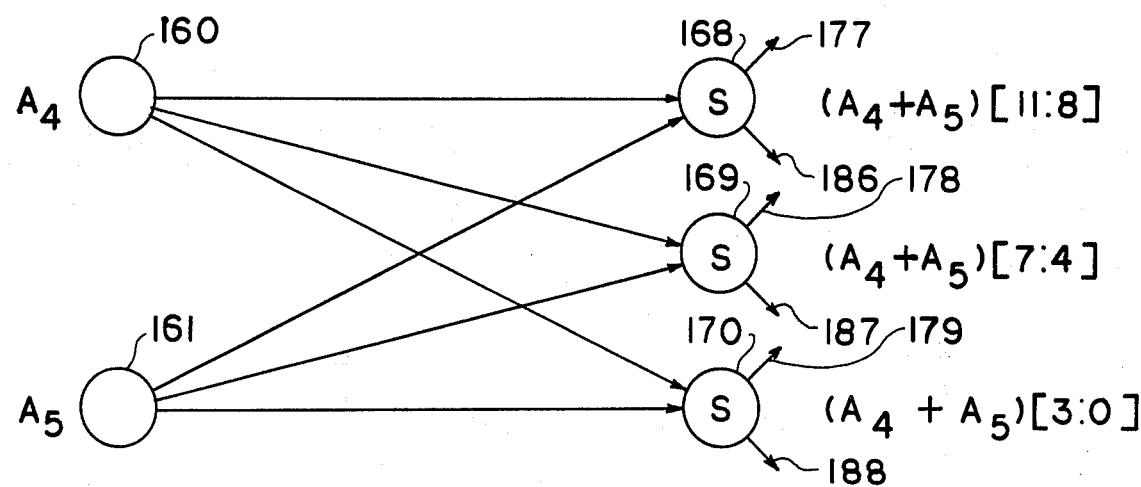

In addition to utilizing the memory space more efficiently the pairing up approach also reduces by about half the number of normal radix equivalents which have to be added. This simplifies the task of subsequent sections of the unit. This reduction is more apparent when more mixed radix coefficients have to be converted. The storage of the normal radix equivalents of six mixed radix coefficients is shown in FIG. 16. Nods 156-161 are the output nodes of a mixed radix converter. Assume the outputs are $a_0$-$a_5$ respectively. The mixed radix coefficients $a_0$ and $a_1$ are distributed pairwise to storage nodes 162-164. Nodes 162 contains bits $b_{11}$-$b_8$ of the sum of the normal radix equivalents associated with every possible combination of the values of the coefficients $a_0$ and $a_1$. Nodes 163-164 store other multi-bit slices of the possible sums. Nodes 165-167 store the sum of the normal radix equivalents of coefficients $a_2$ and $a_3$ in a similar manner. Nodes 168-170 do the same for coefficients $a_4$ and $a_5$. The outputs of nodes 162-164, 165-167, and 168-170 each form a 12 bit binary number. In a direct approach six mixed radix coefficients would result in six normal radix equivalents to be added. In this pairwise approach six coefficients results in only three normal radix equivalents to be added.

A particularly difficult problem is the handling of negative numbers. In the previous discussion the sign information in the residue number system has been represented implicity. In other words the top half of the range $M-1$ to $M/2$ are used to denote negative numbers where 0 to $M/2-1$ denote non-negative numbers. The same technique is used in conventional two's complement numbers. The encoding of sign magnitude or two's complement into modular equivalents consistent with this implicit representation has already been discussed. The processing by the modular processors or the conversion from residue to mixed radix is completely independent of whether the operands represented positive or negative numbers. However, the sign is crucial in the mixed to normal radix conversion process. The process further depends on whether the number is to be converted into a sign magnitude or two's complement number.

Either type of conversion depends on the determination of the sign of the number while it is in mixed radix form. This process is particularly easy if the most significant mixed radix coefficient evolved from an even modulus. If the value of this coefficient is in the upper half of its possible range then the number will be in the upper half of the range M and thus be a negative number. The sign of a number can be derived by inspection of just this one coefficient. In the examples a coefficient $a_2$ which evolves from an even modulus of 8 is used.

If the most significant mixed radix coefficient is not associated with an even modulus then there will be an odd number of possible values of the coefficient. One of the values will be a borderline case. In this situation the sign cannot be determined without inspecting the next to most significant coefficient. If this coefficient did not evolve from an even modulus then there will be a value of this coefficient which would also be a borderline case. This indecision will continue until a coefficient which evolved from an even modulus is encountered or all the coefficients have been inspected.

The design of a unit which produces the sign of a mixed radix number given the mixed radix coefficients is straight forward. It can be implemented with conventional logic or accomplished by table lookups. It need only recognize the values of the coefficient or coefficients associated with negative numbers.

To convert from mixed radix to two's complement form the normal radix equivalents of the coefficients must be added as before. However, if the number was determined to be negative then the normal radix equivalent of the range, M, must be subtracted. To accomplish this $-M$ can be expressed in two's complement form and added with the normal radix equivalents.

In the case where the most significant coefficient has evolved from an even modulus the values of the coefficient in the upper half of its possible range indicate that the number is negative and that the range, M, must be subtracted. M can be pre-subtracted from the normal radix equivalents of these coefficients. The algorithm shown in Table 64 to generate a table to store bits $b_{11}$–$b_8$ of the sum of the normal radix equivalents of coefficients $a_2$ and $a_1$ can be modified to do this. This modification to produce a table for conversion of mixed radix into two's complement is shown in Table 66.

TABLE 66

```
MI1 : = 7;
MI2 : = 8;
WF1 : = 5;
WF2 : = 5*7;
M : = 5*7*8;
B : = 11;
E : = 8;
FOR ADDR : = 0 STEP 1 UNTIL 63 DO
   BEGIN
   OP1 : = ADDR[5:3];
   OP2 : = ADDR[2:0];
   X1 : = WF1*OP1;
   X2 : = WF2*OP2;
   X : = X1 + X2;
   IF OP2 > = MI2/2 THEN
      X : = X - M;
   IF OP1 < MI1 AND OP2 < MI2 THEN
      MEM(ADDR) : = X[B:E];
   END;
```

Storage of Two's Complement of the Sum to Two Mixed Radix Equivalents

MI1 is the modulus of the coefficients $a_1$. MI2 is the modulus of $a_2$. WF1 is the weighting factor of the mixed radix coefficient $a_1$. While WF2 is the weighting factor of $a_2$. M is the range which is the product of the moduli used. B is the beginning bit of the multibit slice while E is the end bit. The memory is scanned. Bits $b_5$–$b_3$ of the address are assumed to represent coefficient $a_1$ while bits $b_2$–$b_0$ represent $a_2$. X1 and X2 are the normal radix equivalents of coefficients $a_1$ and $a_2$ respectively. X is the sum of these equivalents. If the value of $a_2$ is in the upper half of its range then the number is negative and the range, M, is subtracted from the sum of the equivalents, X. If OP1 and OP2 are valid operands for their associated moduli then bits B through E of X is placed in this location of memory. Such a table is shown in Table 67.

TABLE 67

| ADDRESS | CONT | ADDRESS | CONT | ADDRESS | CONT |
|---|---|---|---|---|---|
| 000000 | 0000 | 010101 | 1111 | 101010 | 0000 |
| 000001 | 0000 | 010110 | 1111 | 101011 | 0000 |
| 000010 | 0000 | 010111 | 1111 | 101100 | 1111 |
| 000011 | 0000 | 011000 | 0000 | 101101 | 1111 |
| 000100 | 1111 | 011001 | 0000 | 101110 | 1111 |
| 000101 | 1111 | 011010 | 0000 | 101111 | 1111 |
| 000110 | 1111 | 011011 | 0000 | 110000 | 0000 |
| 000111 | 1111 | 011100 | 1111 | 110001 | 0000 |
| 001000 | 0000 | 011101 | 1111 | 110010 | 0000 |
| 001001 | 0000 | 011110 | 1111 | 110011 | 0000 |
| 001010 | 0000 | 011111 | 1111 | 110100 | 1111 |
| 001011 | 0000 | 100000 | 0000 | 110101 | 1111 |

TABLE 67-continued

| ADDRESS | CONT | ADDRESS | CONT | ADDRESS | CONT |
|---|---|---|---|---|---|
| 001100 | 1111 | 100001 | 0000 | 110110 | 1111 |
| 001101 | 1111 | 100010 | 0000 | 110111 | 1111 |
| 001110 | 1111 | 100011 | 0000 | 111000 | XXXX |
| 001111 | 1111 | 100100 | 1111 | 111001 | XXXX |
| 010000 | 0000 | 100101 | 1111 | 111010 | XXXX |
| 010001 | 0000 | 100110 | 1111 | 111011 | XXXX |
| 010010 | 0000 | 100111 | 1111 | 111100 | XXXX |
| 010011 | 0000 | 101000 | 0000 | 111101 | XXXX |
| 010100 | 1111 | 101001 | 0000 | 111110 | XXXX |
|  |  |  |  | 111111 | XXXX |

Doubled-Up Normal Radix to Two's Complement $a_1a_2$[11:8]

Similar tables can be generated by the same algorithm for other multibit slices. A table which stores bits $b_7$–$b_4$ of the two's complement of the sum of the normal radix equivalents of coefficients $a_2$ and $a_1$ is shown in Table 68. A table for bits $b_3$–$b_0$ are shown in Table 69. Only the tables dealing with the sign determining most significant coefficient need by modified with this pre-subtraction of M. The other tables would be the same as those dictated by the algorithm shown in Table 64.

TABLE 68

| ADDRESS | CONT | ADDRESS | CONT | ADDRESS | CONT |
|---|---|---|---|---|---|
| 000000 | 0000 | 010101 | 1010 | 101010 | 0101 |
| 000001 | 0010 | 010110 | 1100 | 101011 | 1000 |
| 000010 | 0100 | 010111 | 1110 | 101100 | 1000 |
| 000011 | 0110 | 011000 | 0000 | 101101 | 1011 |
| 000100 | 0111 | 011001 | 0011 | 101110 | 1101 |
| 000101 | 1001 | 011010 | 0101 | 101111 | 1111 |
| 000110 | 1011 | 011011 | 0111 | 110000 | 0001 |
| 000111 | 1101 | 011100 | 1000 | 110001 | 0100 |
| 001000 | 0000 | 011101 | 1010 | 110010 | 0110 |
| 001001 | 0010 | 011110 | 1100 | 110011 | 1000 |
| 001010 | 0100 | 011111 | 1110 | 110100 | 1001 |
| 001011 | 0110 | 100000 | 0001 | 110101 | 1011 |
| 001100 | 0111 | 100001 | 0011 | 110110 | 1101 |
| 001101 | 1001 | 100010 | 0101 | 110111 | 1111 |
| 001110 | 1011 | 100011 | 0111 | 111000 | XXXX |
| 001111 | 1110 | 100100 | 1000 | 111001 | XXXX |
| 010000 | 0000 | 100101 | 1010 | 111010 | XXXX |
| 010001 | 0010 | 100110 | 1100 | 111011 | XXXX |
| 010010 | 0101 | 100111 | 1111 | 111100 | XXXX |
| 010011 | 0111 | 101000 | 0001 | 111101 | XXXX |
| 010100 | 0111 | 101001 | 0011 | 111110 | XXXX |
|  |  |  |  | 111111 | XXXX |

Doubled-Up Normal Radix to Two's Complement $a_1a_2$ [7:4]

TABLE 69

| ADDRESS | CONT | ADDRESS | CONT | ADDRESS | CONT |
|---|---|---|---|---|---|
| 000000 | 0000 | 010101 | 0001 | 101010 | 1111 |
| 000001 | 0011 | 010110 | 0100 | 101011 | 0010 |
| 000010 | 0110 | 010111 | 0111 | 101100 | 1101 |
| 000011 | 1001 | 011000 | 1111 | 101101 | 0000 |
| 000100 | 0100 | 011001 | 0010 | 101110 | 0011 |
| 000101 | 0111 | 011010 | 0101 | 101111 | 0110 |
| 000110 | 1010 | 011011 | 1000 | 110000 | 1110 |
| 000111 | 1101 | 011100 | 0011 | 110001 | 0001 |
| 001000 | 0101 | 011101 | 0110 | 110010 | 0100 |
| 001001 | 1000 | 011110 | 1001 | 110011 | 0111 |
| 001010 | 1011 | 011111 | 1100 | 110100 | 0010 |
| 001011 | 1110 | 100000 | 0100 | 110101 | 0101 |
| 001100 | 1001 | 100001 | 0111 | 110110 | 1000 |
| 001101 | 1100 | 100010 | 1010 | 110111 | 1011 |
| 001110 | 1111 | 100011 | 1101 | 111000 | XXXX |
| 001111 | 0010 | 100100 | 1000 | 111001 | XXXX |
| 010000 | 1010 | 100101 | 1011 | 111010 | XXXX |
| 010001 | 1101 | 100110 | 1110 | 111011 | XXXX |
| 010010 | 0000 | 100111 | 0001 | 111100 | XXXX |
| 010011 | 0011 | 101000 | 1001 | 111101 | XXXX |
| 010100 | 1110 | 101001 | 1100 | 111110 | XXXX |
|  |  |  |  | 111111 | XXXX |

Doubled-Up Normal Radix to Two's Complement $a_1a_2$ [3:0]

As an example suppose the mixed radix number to be converted into two's complement was 5 3 4. The structure of the unit would be that shown in FIG. 15. 5, 3, 4 would be $a_2$, $a_1$, and $a_0$ from the outputs of nodes 149, 148, and 147 respectively, which are the output nodes of a residue to mixed radix converter. Tables 67, 68, and 69 represent nodes 153, 154, and 155. Table 63 represents node 152. Nodes 150 and 151 contain zeroes so they are not needed. Coefficient $a_1$ is used as bits $b_5$–$b_3$ of an address while coefficient $a_2$ is used as bits $b_2$–$b_0$. This address, 011101, is used by nodes 153, and 154, and 155. These nodes produce. 1111, 1010, and 0110. This produces the number 111110100110 in two's complement. $a_0$ is used as bits $b_2$–$b_0$ of an address for node 152. At this address 000100 in Table 63 is 0100. If 111110100110 is added to 0100 it produces 111110101010 which represents −86 in two's complement. 5 3 4 in mixed radix is equal to $5*(5*7)+3*(5)+4=194$. However, since 5 is in the upperhalf of the range of possible values of $a_2$ the number represented is really negative so that the range, $M=5*7*8=280$, must be subtracted. This gives $194-280=-86$ which is the same as derived by the converter.

A positive number with mixed radix coefficients 2 3 4 would be converted in the same manner by these nodes. $a_1$ and $a_2$ would be combined to form an address of 011010. Nodes 153, 154, and 155 would translate this into 0000, 0101, and 0101. This forms a number 000001010101. $a_0$ forms an address of 000100 which node 152 translates into 0100. When 000001010101 is added to 0100 it produces 000001011001 which is 89. The mixed radix coefficients 2 3 4 when converted directly equals $2*(5*7)+3*(5)+4=89$ as expected.

A mixed radix number can be converted into its sign magnitude equivalent in a similar manner. The approach used is to first convert the mixed radix coefficients into their two's complement equivalent. The two's complement version can then be converted into sign magnitude format. To do this if the number is negative as determined by the mixed radix coefficients, the number if first converted into its two's complement equivalent as previously described. The number 1 is then subtracted from this two's complement version. The result is then complemented in a bitwise manner by replacing all 1's by 0's and vice versa. The sign bit is then set to indicate that the number is negative.

Figure 17:
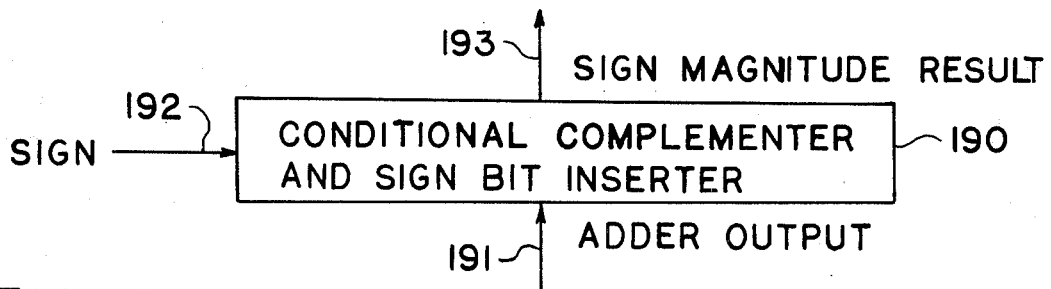
FIG. 17 illustrates a bitwise complementer and sign inserter used to convert the output of a mixed to normal radix converter into sign magnitude representation.

Such a unit 190 to perform the complementing is shown in FIG. 17. It receives as inputs the result at 191 and sign information at input 192. If the sign indicates the number is negative the result is complemented in a bitwise manner. If the number if non-negative the result is unaltered. The sign information is then placed in the sign position of the sign magnitude number. This number is then outputed at 193.

Rather than separately subtracting 1 from the sum of the two's complement equivalents the value $M+1$ could be presubtracted instead of just M as in the conversion from mixed radix to two's complement The algorithm shown in Table 66 to generate a table to store bits $b_{11}$–$b_8$ of the sum of the normal radix equivalents of coefficients $a_2$ and $a_1$ can be modified to accomplish this. The algorithm to produce tables to convert from mixed radix to sign magnitude is shown in Table 70.

TABLE 70

```
MI1 : = 7;
MI2 : = 8;
WF1 : = 5;
```

TABLE 70-continued

```
WF2 : = 5*7;
M : = 5*7*8;
MSM : = M + 1;
B : = 11;
E : = 8;
FOR ADDR : = 0 STEP 1 UNTIL 63 DO
    BEGIN
    OP1 : = ADDR[5:3];
    OP2 : = ADDR[2:0];
    X1 : = WF1*OP1;
    X2 : = WF2*OP2;
    X : = X1 + X2;
    IF OP2<MI2/2 THEN
        X : = X − MSM;
    IF OP1<MI1 AND OP2<MI2 THEN
        MEM(ADDR) : = X[B:E];
    END;
```

Storage of Mixed Radix Equivalents for Sign Magnitude

MI1 is the modulus of $a_1$. MI2 is the modulus of $a_2$. WF1 is the weighting factor associated with the coefficient $a_1$ while WF2 is the weighting factor associated with $a_2$. The range, M, is the product of the moduli used. MSM is the range modified for conversion to sign magnitude. B is the begin bit of the multibit slice while E is the end bit. The memory is scanned. Bits $b_5$–$b_3$ are assumed to represent coefficient $a_1$ while bits $b_2$–$b_0$ represent coefficient $a_2$. X1 is the normal radix equivalent of coefficient $a_1$ while X2 represents that of $a_2$. X is the sum of the equivalents. If the coefficient $a_2$ indicates that the number is negative then MSM, the range modified for conversion to sign magnitude, is subtracted from X. If the operand OP1 and OP2 correspond to proper operands for their respective moduli then bits B through E of X are stored in this location. Such a table is shown in Table 71.

TABLE 71

| ADDRESS | CONT | ADDRESS | CONT | ADDRESS | CONT |
|---|---|---|---|---|---|
| 000000 | 0000 | 010101 | 1111 | 101010 | 0000 |
| 000001 | 0000 | 010110 | 1111 | 101011 | 0000 |
| 000010 | 0000 | 010111 | 1111 | 101100 | 1111 |
| 000011 | 0000 | 011000 | 0000 | 101101 | 1111 |
| 000100 | 1111 | 011001 | 0000 | 101110 | 1111 |
| 000101 | 1111 | 011010 | 0000 | 101111 | 1111 |
| 000110 | 1111 | 011011 | 0000 | 110000 | 0000 |
| 000111 | 1111 | 011100 | 1111 | 110001 | 0000 |
| 001000 | 0000 | 011101 | 1111 | 110010 | 0000 |
| 001001 | 0000 | 011110 | 1111 | 110011 | 0000 |
| 001010 | 0000 | 011111 | 1111 | 110100 | 1111 |
| 001011 | 0000 | 100000 | 0000 | 110101 | 1111 |
| 001100 | 1111 | 100001 | 0000 | 110110 | 1111 |
| 001101 | 1111 | 100010 | 0000 | 110111 | 1111 |
| 001110 | 1111 | 100011 | 0000 | 111000 | XXXX |
| 001111 | 1111 | 100100 | 1111 | 111001 | XXXX |
| 010000 | 0000 | 100101 | 1111 | 111010 | XXXX |
| 010001 | 0000 | 100110 | 1111 | 111011 | XXXX |
| 010010 | 0000 | 100111 | 1111 | 111100 | XXXX |
| 010011 | 0000 | 101000 | 0000 | 111101 | XXXX |
| 010100 | 1111 | 101001 | 0000 | 111110 | XXXX |
|  |  |  |  | 111111 | XXXX |

Doubled-Up Mixed Radix to Sign Magnitude $a_2a_1$ [11:8]

TABLE 72

| ADDRESS | CONT | ADDRESS | CONT | ADDRESS | CONT |
|---|---|---|---|---|---|
| 000000 | 0000 | 010101 | 1010 | 101010 | 0101 |
| 000001 | 0010 | 010110 | 1100 | 101011 | 1000 |
| 000010 | 0100 | 010111 | 1110 | 101100 | 1000 |
| 000011 | 0110 | 011000 | 0000 | 101101 | 1010 |
| 000100 | 0111 | 011001 | 0011 | 101110 | 1101 |
| 000101 | 1001 | 011010 | 0101 | 101111 | 1111 |
| 000110 | 1011 | 011011 | 0111 | 110000 | 0001 |
| 000111 | 1101 | 011100 | 1000 | 110001 | 0100 |
| 001000 | 0000 | 011101 | 1010 | 110010 | 0110 |

TABLE 72-continued

| ADDRESS | CONT | ADDRESS | CONT | ADDRESS | CONT |
|---------|------|---------|------|---------|------|
| 001001 | 0010 | 011110 | 1100 | 110011 | 1000 |
| 001010 | 0100 | 011111 | 1110 | 110100 | 1001 |
| 001011 | 0110 | 100000 | 0001 | 110101 | 1011 |
| 001100 | 0111 | 100001 | 0011 | 110110 | 1101 |
| 001101 | 1001 | 100010 | 0101 | 110111 | 1111 |
| 001110 | 1011 | 100011 | 0111 | 111000 | XXXX |
| 001111 | 1110 | 100100 | 1000 | 111001 | XXXX |
| 010000 | 0000 | 100101 | 1010 | 111010 | XXXX |
| 010001 | 0010 | 100110 | 1100 | 111011 | XXXX |
| 010010 | 0101 | 100111 | 1111 | 111100 | XXXX |
| 010011 | 0111 | 101000 | 0001 | 111101 | XXXX |
| 010100 | 0111 | 101001 | 0011 | 111110 | XXXX |
|        |      |         |      | 111111 | XXXX |

Doubled-Up Mixed Radix to Sign Magnitude $a_2 a_1[7:4]$

TABLE 73

| ADDRESS | CONT | ADDRESS | CONT | ADDRESS | CONT |
|---------|------|---------|------|---------|------|
| 000000 | 0000 | 010101 | 0000 | 101010 | 1111 |
| 000001 | 0011 | 010110 | 0011 | 101011 | 0010 |
| 000010 | 0110 | 010111 | 0110 | 101100 | 1100 |
| 000011 | 1001 | 011000 | 1111 | 101101 | 1111 |
| 000100 | 0011 | 011001 | 0010 | 101110 | 0010 |
| 000101 | 0110 | 011010 | 0101 | 101111 | 0101 |
| 000110 | 1001 | 011011 | 1000 | 110000 | 1110 |
| 000111 | 1100 | 011100 | 0010 | 110001 | 0001 |
| 001000 | 0101 | 011101 | 0101 | 110010 | 0100 |
| 001001 | 1000 | 011110 | 1000 | 110011 | 0111 |
| 001010 | 1011 | 011111 | 1011 | 110100 | 0001 |
| 001011 | 1110 | 100000 | 0100 | 110101 | 0100 |
| 001100 | 1000 | 100001 | 0111 | 110110 | 0111 |
| 001101 | 1011 | 100010 | 1010 | 110111 | 1010 |
| 001110 | 1110 | 100011 | 1101 | 111000 | XXXX |
| 001111 | 0001 | 100100 | 0111 | 111001 | XXXX |
| 010000 | 1010 | 100101 | 1010 | 111010 | XXXX |
| 010001 | 1101 | 100110 | 1101 | 111011 | XXXX |
| 010010 | 0000 | 100111 | 0000 | 111100 | XXXX |
| 010011 | 0011 | 101000 | 1001 | 111101 | XXXX |
| 010100 | 1101 | 101001 | 1100 | 111110 | XXXX |
|        |      |         |      | 111111 | XXXX |

Doubled-Up Mixed Radix to Sign Magnitude $a_2 a_1[3:0]$

Similar tables can be generated for the other multibit slices by modifying the algorithm in Table 70. Such tables for bits $b_7-b_4$ and $b_3-b_0$ are shown in Tables 72 and 73. Only the tables representing coefficients which contain sign information have to be modified in this manner. In this case $a_2$ contains the sign information. Coefficient $a_1$ is affected only because it is paired up with $a_2$ in the table. The table for $a_0$ would not have to be modified since it contains no sign information. Such a table would be the same as that shown in Table 63.

As an example suppose that the mixed radix number to be converted into sign magnitude was 5 3 4. The structure of the unit would be that shown in FIG. 15. 5, 3, and 4 ($a_2$, $a_1$, and $a_0$) would be the outputs from nodes 149, 148, and 147 respectively, which are the output nodes of a residue to mixed radix converter Tables 73, 72, and 71 represent nodes 155, 154, and 153. Table 63 represents node 152. Nodes 150 and 151 contain only zeroes so they are not needed. Coefficient $a_1$ is used as bits $b_5-b_3$ of an address while coefficients $a_2$ is used as bits $b_2-b_0$. This address 011101 is used by nodes 153, 154, and 155. These nodes produce 1111, 1010, and 0101. This forms a number 111110100101. $a_0$ is used as bits $b_2-b_0$ of an address for node 152. At this address 000100 in Table 63 is 0100. If 111110100101 is added to 0100 this produces 111110101001. $a_2$ indicates that the number is negative. The sum must then be bitwise complemented. This produces 000001010110. Assuming $b_{11}$ is used as the sign bit, it is set to 1 to indicate that the number is negative. The result is 100001010110 which is −86 in sign magnitude.

A positive number with the mixed radix coefficients of 2 3 4 would be converted in the same manner by these nodes. $a_1$ and $a_2$ would be combined to form an address of 011010. Nodes 153, 154, and 155 would convert this into 0000, 0101, and 0101. This forms a number 000001010101. $a_0$ forms an address of 000100 which node 152 translates into 0100. When 000001010101 is added to 0100 the result is 000001011001. Since $a_2$ indicates the number is positive this result need not be bitwise complemented. If $b_{11}$ is the sign bit and 0 is used to indicate a positive number the result is 000001011001 which is 89 in sign magnitude format.

The numbers which emerge from the storage portion of the mixed to normal radix converters have to be added together. If there are more than 2 numbers to be added this process can be handled with a carry save adder. This approach relies on reducing three numbers to be added to only two numbers. This process can be accomplished in parallel. It is usually done in a bitwise manner with full adders. The corresponding bit in each of 3 numbers are used as either operand x, operand y, or the carry in of a full adder. All the bits of the numbers are processed in this manner simultaneously. The sum output of all the full adders are combined to form a number and the carry output of all the full adders are gathered to form the other number. The number composed from the carries is shifted to the left by one place with a zero inserted in the least significant digit. Three numbers to be added have thus been reduced to only two numbers. Rather than doing this in a bitwise manner with full adders it can be accomplished more efficiently in multibit slices with 3 operand multibit adders implemented with tables. If slices two bits long are used then six bits of address would be needed to represent all three operands. The maximum sum of three, two bit numbers is 1001. Thus all the possible sums can be expressed with four bits. The lower two bits $b_1-b_0$ of the output of these adders will be considered as the sum bits while the upper two bits $b_3-b_2$ will be considered the carry bits. An algorithm to generate such a table for a 3 operand multibit binary adder is shown in Table 74.

TABLE 74

```
FOR ADDR : = 0 STEP 1 UNTIL 63 DO
  BEGIN
    OP1 : = ADDR[1:0];
    OP2 : = ADDR[3:2];
    OP3 : = ADDR[5:4];
    MEM(ADDR) : = OP1 + OP2 + OP3;
  END;
```

3 Operand Multibit Binary Addition

The memory is scanned. Bits $b_1-b_0$ of the address are assumed to represent operand, OP1. Bits $b_3-b_2$ are assumed to represent operand, OP2. Bits $b_5-b_4$ are assumed to represent operand, OP3. The binary sum of the 3 operands is placed in that location of the memory. Such a table is shown in Table 75. Tables to add larger slices can be constructed in a similar manner.

TABLE 75

| ADDRESS | CONT | ADDRESS | CONT | ADDRESS | CONT |
|---------|------|---------|------|---------|------|
| 000000 | 0000 | 010101 | 0011 | 101010 | 0110 |
| 000001 | 0001 | 010110 | 0100 | 101011 | 0111 |
| 000010 | 0010 | 010111 | 0101 | 101100 | 0101 |
| 000011 | 0011 | 011000 | 0011 | 101101 | 0110 |
| 000100 | 0001 | 011001 | 0100 | 101110 | 0111 |
| 000101 | 0010 | 011010 | 0101 | 101111 | 1000 |

TABLE 75-continued

| ADDRESS | CONT | ADDRESS | CONT | ADDRESS | CONT |
|---------|------|---------|------|---------|------|
| 000110 | 0011 | 011011 | 0110 | 110000 | 0011 |
| 000111 | 0100 | 011100 | 0100 | 110001 | 0100 |
| 001000 | 0010 | 011101 | 0101 | 110010 | 0101 |
| 001001 | 0011 | 011110 | 0110 | 110011 | 0110 |
| 001010 | 0100 | 011111 | 0111 | 110100 | 0100 |
| 001011 | 0101 | 100000 | 0010 | 110101 | 0101 |
| 001100 | 0011 | 100001 | 0011 | 110110 | 0110 |
| 001101 | 0100 | 100010 | 0100 | 110111 | 0111 |
| 001110 | 0101 | 100011 | 0101 | 111000 | 0101 |
| 001111 | 0110 | 100100 | 0011 | 111001 | 0110 |
| 010000 | 0001 | 100101 | 0100 | 111010 | 0111 |
| 010001 | 0010 | 100110 | 0101 | 111011 | 1000 |
| 010010 | 0011 | 100111 | 0110 | 111100 | 0110 |
| 010011 | 0100 | 101000 | 0100 | 111101 | 0111 |
| 010100 | 0010 | 101001 | 0101 | 111110 | 1000 |
|        |      |         |      | 111111 | 1001 |

As an example if the multibit slices 11, 10, and 01 were to be added then they would be combined to form an address of 111001. The corresponding location of Table 75 produces 0110 which is the correct sum of the operands.

These 3 operand multibit binary adders can be used to construct a unit which adds in parallel 3 numbers and produces 2 numbers. Such a structure is shown in FIG. 18. Nodes 230-235 are 3 operand multibit binary adders as represented by Table 75. Inputs 200-205 each handle a two bit slice of one of the numbers, X, to be added. Inputs 206-211 and 212-217 handle the other two numbers Y and Z respectively. Node 235 has as inputs bits $b_1$-$b_0$ of numbers X, Y, and Z. It produces bits $b_1$-$b_0$ of a number S at 229 and bits $b_3$-$b_2$ of a number C at 223. Nodes 230-234 handle other slices of X, Y, and Z in a similar manner to produce the other slices of the S and C. Bits $b_1$-$b_0$ of C at 236 are assumed to be zero. Thus the sum of three 12 bit numbers have been converted in parallel into one 12 bit number and a 14 bit number. By using several such units any number of numbers to be added can be reduced in parallel into only two numbers to be added.

As an example nine numbers could be reduced into six numbers. These six numbers could be reduced into four. These four could be reduced into three. These three could be finally reduced into two numbers to be added.

Such an adder unit would be used to reduce the number of normal radix numbers produced by the storage nodes such as 162-170 of FIG. 16. The 4 bit output of each of these nodes would be split into bits $b_3$-$b_2$ and $b_1$-$b_0$. Bits $b_3$-$b_2$ of the outputs of nodes 162-170 would go to outputs 171-179 while bits $b_1$-$b_0$ go to outputs 180-188. These outputs would be connected to the inputs of the adder shown in FIG. 18. Outputs 171, 180, 172, 181, 173, and 182 would be connected to inputs 200-205. Outputs 174, 183, 175, 184, 176, and 185 would be connected to inputs 206-211. Outputs 177, 186, 178, 187, 179, and 188 would be connected to inputs 212-217. One of the results would emerge on outputs 224-229 while the other result would emerge on outputs 218-223. Two 0's would have to be padded on the least significant end of the number which emerged from outputs 218-223 to represent bits $b_1$ and $b_0$. This is shown at 199. All this can be done in parallel without carries using only table lookups.

As an example suppose the numbers in 12 bit two's complement to be added were 111110011100, 000000111011, and 000000010101 which represent $-100$, 59, and 21 respectively. 111110011100 would be fed in 2 bit slices to inputs 200-205. 000000111011 would be fed in 2 bit slices to inputs 206-211. 000000010101 would be fed in 2 bit sliced to inputs 212-217. The inputs to node 230 would be 11, 00, and 00. These would form an address of 110000 for Table 75 and produce 0011. Bits $b_3$-$b_2$, 00, would be output on line 218 while bits $b_1$-$b_0$, 11, would be placed on line 224. Nodes 231-235 would produce on lines 225-229 the outputs 11, 10, 01, 10, and 00. On lines 219-223 would be 00, 00, 00, 01, 01, 01. On line 199 would be 00. These results from lines 224-229 would form a number 111110011000 while the results on lines 218-223 and 199 would produce 00000001010100. If these two numbers were added they would produce 00111111101100. Since 12 bit two's complement notation was used only the lower 12 bits are relevant. This produces 111111101100. This is the two's complement representation of $-20$ which is equal to $-100+59+21$.

These techniques can be extended to handle numbers of any length. Tables which handled larger slices can be implemented with larger memories.

The two numbers which emerge from the carry save adder section have to be added together. This can be accomplished by a carry propagate adder. This unit is simpler and more compatible than a conventional approach in that multibit slices are used and the unit is implemented with nodes using table lookups. Such a unit is shown in FIG. 19. Nodes 236-241 are 3 operand multibit binary adder nodes as represented by Table 75. The inputs to the adder are denoted as 287-298 and 198. Nodes 242-271 are delay nodes to delay the inputs until they are needed. Nodes 272-286 are delay nodes which delay portions of the result so that they emerge from outputs 197 and 299-304 in synchronization. The strategy that the adder uses is to add the least significant slice of the two numbers. This produces a sum slice and a carry slice. The next least significant slice is then processed. This slice of the two numbers is added with the carry slice produces by the previously processed slice to form a sum slice and a carry slice. This process is continued until all the slices have been processed in ascending order of significance. This allows a carry to propagate through the adder.

If the inputs 287, 289, 291, 293, 295, and 297 are connected to a number, A, to be added such as outputs 224-229 of a carry save adder section as shown in FIG. 18. And if inputs 228, 290, 292, 294, 296, and 298 are connected to a number, B, to be added such as outputs 218-223 and 199 of FIG. 18. Node 241 adds bits $b_1$-$b_0$ of numbers A and B and 00 from input 198. Input,198 is set to 00 since there is no proceeding digit to produce a carry slice. Node 241 produces a sum slice S[1:0] bits $b_1$-$b_0$ of the result which is delayed by nodes 282-304. It also produces a carry slice C[3:2], bits $b_3$-$b_2$ of the result, which is fed to node 240. Node 240 processes bits $b_3$-$b_2$ of A and B which have been delayed by nodes 270 and 271 respectively. It produces a sum slice S[3:2] which is delayed by node 278-303. It also produces a carry slice C[5:4] which is fed to node 239. The other slices of numbers A and B are processed in a similar manner in ascending order of significance.

As an example suppose the two numbers to be added were in 12 bit two's complement notation such as 111110011000 and 000001010100 which is $-104$ and 84. 111110011000 would be fed in 2 bit slices to inputs 287, 289, 291, 293, 295, and 297. 000001010100 would be fed in 2 bit slices to inputs 288, 290, 292, 294, 296, and 298.

Adder node 241 would have as inputs 00 and 00 and 00 from input 198. These would form an address of 000000 for Table 75. This produces the result 0000. the sum slice 00 would be distributed to delay node 282 while the carry slice 00 would be fed to node 240. Node 240 has as inputs 10 and 01 originating from inputs 295 and 296 and delayed by nodes 270 and 271. Node 240 also has as an input 00 which is the carry slice from node 241. These form an address of 100100. Table 75 translates this into 0011. The sum slice 11 is fed to delay node 278 while the carry slice 00 is fed to binary adder node 239. Nodes 239–236 perform in a similar manner. They produce carry slices of 00, 00, 00, 00, and sum slices of 10, 11, 11, 11 respectively. The output of lines 197, and 299–304 combine to produce the number 001111111101100. Since this is 12 bit two's complement only the lower 12 bits are relevant. 111111101100 is the two's complement representation of −20 which is equal to −104 +84.

Such a carry propagate adder can be extended to handle numbers of any length. Tables to handle larger slices can be implemented with larger memories.

Sections of the processor constructed from various types of nodes have been used to encode numbers into their modular equivalents, perform computations in a modular manner, convert these modular results into mixed radix numbers, and to convert these mixed radix numbers into their normal radix equivalents. Such a system to sum four numbers in 6 bit two's complement form is shown in FIG. 20. Nodes 306–317 are the encoding sections. Nodes 306–309 are modulus 5 encoders for 6 bit two's complement. They are represented by Table 48. Nodes 310–313 are modulus 7 encoders for 6 bit twos complement. They are represented by Table 49. Nodes 314–317 are modulus 8 encoders for 6 bit twos complement. They are represented by Table 50.

Nodes 320–328 form the modular processors. Nodes 320, 321, and 326 perform modulus 5 addition. They are represented by Table 5. Nodes 322, 323, and 327 perform modulus 7 addition. They are represented by Table 6. Nodes 324, 325, and 328 perform modulus 8 addition. They are represented by Table 7. Nodes 329, 332, 333, 339–343, 350 and all the other nodes marked by a "D" are delay nodes and represented by Table 22.

Nodes 329–334 form a residue to mixed radix converter. Nodes 330, 331, and 334 perform the polynomial transforms required to convert a residue number into a mixed radix number. Node 330 is represented by Table 58. Node 331 is represented by Table 59. Node 334 is represented by Table 60.

The rest of the nodes form a mixed to normal radix converter. Nodes 335, 336, 337 are storage nodes which store the equivalents of coefficients $a_1$ and $a_2$ needed for the conversion into two's complement. They are represented by Tables 67, 68, and 69 respectively. Node 338 contains the equivalent to coefficient $a_0$ and is represented by Table 63. Since these storage nodes produce only two numbers to be added no carry save adder section is needed in this case. The number representing the sum of $a_1$ and $a_2$ can be at maximum 12 bits long while the other representing $a_0$ can at most be 4 bits long. The rest of nodes form the carry propagate adder. The 12 bit number is fed in two bit slices to inputs 351, 353, 355, 357, 359, and 361. The 4 bit number associated with $a_0$ is distributed in 2 bit slices to inputs 360 and 362. Since the rest of the inputs are not needed for such a small number, $a_0$, inputs 352, 354, 356, and 358 are set to 00. Input 363 of adder node 349 is set to 00 since there is no preceding slice to generate a carry slice. Nodes 344–349 are 3 operand multibit slice binary adders as represented by Tables 75.

The nodes are implemented by tables stored in memories. These memories function in three basic ways. They either havelatchable inputs, latchable outputs, or are not latachable at all. Latchable inputs means that the address will not be read until a clock signal occurs. The memory is then read and the output updated. Latchable output means that the input is used and the memory is read but the output is not updated until a clock signal occurs. Latching of the address or output are equivalent in that the output will not be updated without a clock pulse. Unlatchable means that the input is used to address the memory and the output is immediately updated without the need of a clock signal. If the input changes then the output will be updated.

If the nodes in FIG. 20 are implemented with either address or output latchable memories then the processor can be pipelined. A clock signal would be provided to the clock signal inputs of each node shown as horizontal inputs on the right side of all the nodes such as 355 and 356.

As an example of how such a pipelined version of the processor would operate suppose the data for a calculation denoted A was placed at the inputs of encoder nodes 306–317. On the next clock signal the modular equivalents of the data of calculation A would be placed on the output of these nodes. These outputs form the inputs to adder nodes 320–235. A new set of data for a calculation denoted as B can be placed at the inputs of the encoder nodes 306–317. On the next clock signal the partial sum of the calculation A would be placed on the outputs of nodes 320–325 while the modular equivalents of the data of calculation B would be placed on the output of nodes 306–317. On each clock pulse the data of a new calculation can be entered and the resident calculations will each move to the next higher level. On subsequent clock pulses calculation A will move to the level of node 326, node 329, node 332, node 335, node 339, node 340, node 341, node 342, node 343, and node 344. What emerges from outputs 364–369 would be the 12 two's complement of the answer to calculation A in 2 bit slices. Calculation B would follow calculation A through the system and emerge on the next clock signal. The data for a new calculation can be entered on each clock cycle.

The operation of the encoders, modular processors, residue to mixed radix converter, and mixed to normal radix converter have been explained previously. As a further example suppose the input of the summation processor shown in FIG. 20 were 5, −9, 3, and −11. In 6 bit two's complement this would be 000101, 110111, 000011, and 110101. These numbers would be distributed to nodes 306, 310, 314, and 307, 311, 315 and 308, 312, 316, and 309, 313, 317 respectively. The results of encoders 306–317 would be 000, 001, 011, 100, and 010, 101, 011, 011, and 101, 111, 011, 101. The result of the summation modular processors would emerge form nodes 326–328 as 011, 010, and 100. This would be converted by the residue to mixed radix converter and emerge at nodes 332–334 as 011, 100, and 111. The storage node of the normal to mixed radix converter would produce at nodes 335–338 the values 1111, 1111, 0001, 0011 respectively. These would be added by the carry propagate adder and emerge at outputs 364–369 as 111111110100 which is −12 in 12 bit twos complement form for the summation of 5+ −9+3+ −11.

The necessity of the delay nodes can be seen in the pipelined version of the vector processor shown in FIG. 20. If the delays were not present then the different portions of a calculation would not merge properly. All the portions of a calculation should be resident in the same level of nodes.

If the nodes are implemented by memories which are not latchable then the system cannot be pipelined. An asynchronous version is possible though. An asynchronous version of the processor shown in FIG. 20 is shown in FIG. 21. The exact synchronization between various portions of a calculation is not crucial. Thus the delay nodes are not required and all the delay nodes can be removed. The data of the desired calculation would be placed on the inputs of nodes 380–391. These results would immediately propagate to nodes 392–397 and continue through the system. Many races wil develop but they are non critical. The system has no "memory" or any feedback. It can be viewed as just a large combinatoric circuit. The output will eventually settle to the result of the desired calculation and emerge at 398–404. At this time the coefficients of another calculation can be entered. The cycle time would be dictated by the worst case propagation time.

The cycle time can be further reduced. The signals associated with a given calculation propagate through the system in a wave like manner. The signals of several calculations can be propagating through the system at the same time. The only criterion is that the different wavefronts do not become tangled and interact. The spacing in time required between the waves of calculations will depend on the configuration of the processor and the performance of the individual components. The cycle time would probably have to be determined experimentally.

The structure of processors can sometimes be simplified in a global manner. The functions of several nodes whether they are used for encoders, modular arithmetic, storage, or binary arithmetic can in some structures be telescoped into one node. This happens quite often when the inputs of some of the nodes are constants. Any network of nodes where the non-constant inputs can be represented in the address space of a memory and the output can be held by the memory can be replaced by a node implemented with that memory.

As an example suppose in FIG. 7 the inputs to encoders 63 and 64 were constants. In this case encoders 62–65 and nodes 68, 69, and 71 could be replaced by one node. The inputs to this node would be the same as that of encoders 62 and 65. The output of the node would be the same as those of node 71. One way to generate the table for such a node would be to first construct a simulation of the network of nodes involved. Every possible combination of the inputs to nodes 62 and 65 would be generated. Each combination would be used to form an address. The output of node 71 of the simulated network would be stored at this location. Thus in this example the function of encoders, modular multipliers and adders can be telescoped together.

Any number and types of nodes can be telescoped together in this manner. One difficulty with this technique is that the branch lengths are modified. If care is not taken the computational streams within the processor will not merge properly. For this reason this approach is more applicable to asynchronous versions rather than pipelined versions of the processor.

Memories which can be written as well as read are also available. This would allow the functions of various nodes to be modified and thus change the overall processor.

The additional hardware needed by these alterable nodes is shown in FIG. 22. The node to be altered is shown as 425. Units 432 is a write selector. It monitors a select bus 433 for its particular select signal. On receiving such a signal it sends a write signal to node 425 and bus selectors 426, 427, and 434. Bus selectors 426 and 427 disconnect the normal inputs 428 and 430 into node 425 and instead connects them to an address bus via 429 and 431. Bus selector 434 disconnects the normal output 436 and connects it to a data bus 435. The memory in node 425 then uses the signals on the address bus as an address and writes the contents of the data bus into this location. The contents of the memory of node 425 can be reprogrammed in this manner. This allows the processor to be modified.

The nodes as previously discussed perform their functions with table lookup. It is also possible to use a computing element such as a microprocessor to perform the functions of a node. This approach is advantageous for large moduli where the size of the tables become quite awkward. Moduli particularly amenable to this approach are powers of 2 since the MOD of these numbers can be easily be accomplished with binary arithmetic. The Mersenne numbers. $2^k-1$ where k is a prime, are also attractive for this reason. The use of microprocessors in a number theoretic structure would allow the microprocessor to extent their accuracy. Most microprocessor arithmetic is limited to 8 bits. Software is needed to synthesize greater accuracy. In a number theoretic processor the accuracy is distributed. Each modular processor need only have a limited range. The range of the entire number theoretic processor is the product of the moduli used. The overall range of the processor can be viewed as being distributed among the modular processors.

From a global view each node could be a computer functioning in a number theoretic structure to synthesize a range which is a product of the moduli which they are emulating. This would allow the facility of very large ranges at high speeds without the need of dedicated hardware.

Figure 23:
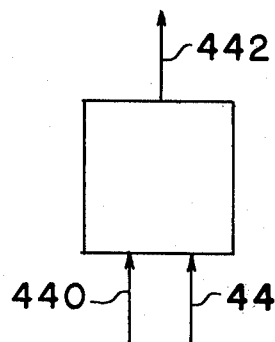
FIG. 23 illustrates the structure of a two input and one output module.

The processors as described can be implemented with conventional electronic layout techniques using circuit boards and backplane interconnections. The processors can also be constructed in a modular manner. A node with 2 inputs and 1 output can be implemented as shown in FIG. 23. The module would have input interfaces 440 and 441. These inputs provided the address bits for the memory. The output of the memory would be distributed by the output interface 442. A module of this structure is capable of representing modular arithmetic nodes, storage nodes, and delay nodes. In the case of modular arithmetic nodes each input interface 440 and 441 would represent a separate operand. The output interface 442 would carry the result. In the case of a storage node inputs 440 and 441 would combine to form an address and the contents of that address would be placed on output 442. Delay nodes are just a special case of a modular arithmetic node.

Figure 24:
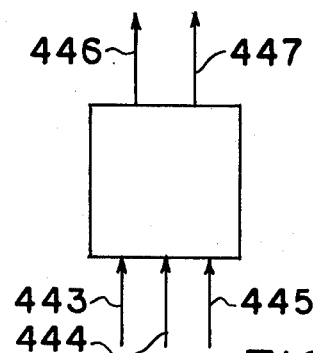
FIG. 24 illustrates the structure of a three input and two output module.

A module as shown in FIG. 24 can be used to implement a three operand binary adder node. Input interfaces 443, 444, and 445 represent each of the operands. Output interfaces 446 and 447 carry portions of the result of the binary addition.

Figure 25:
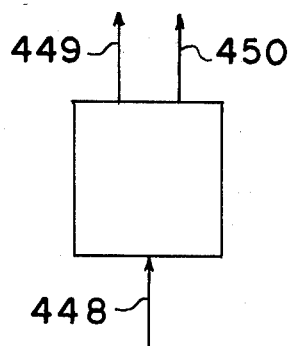
FIG. 25 illustrates the structure of a branch module.

In certain situations the output of a node has to be distributed to several other nodes. A module as shown in FIG. 25 can be used to duplicate such signals. The input at interface 448 is duplicated on output interfaces 449 and 450. Versions can be controlled which triplicate, quadruple, etc., the inputs.

Figure 26:
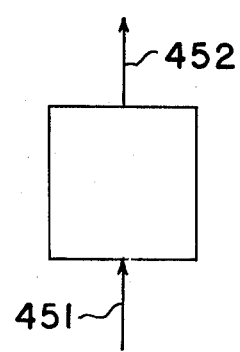
FIG. 26 illustrates the structure of a amplifier module.

The outputs of memory chips have a limited fan out. In situtations where the output has to be distributed to several nodes the output might have to be amplified. A module as shown in FIG. 26 can be used to amplify the inputs at 451 and place the result at output 452.

By standardizing the interfaces of all these modules they can be interconnected with standardized cables.

Figure 27:
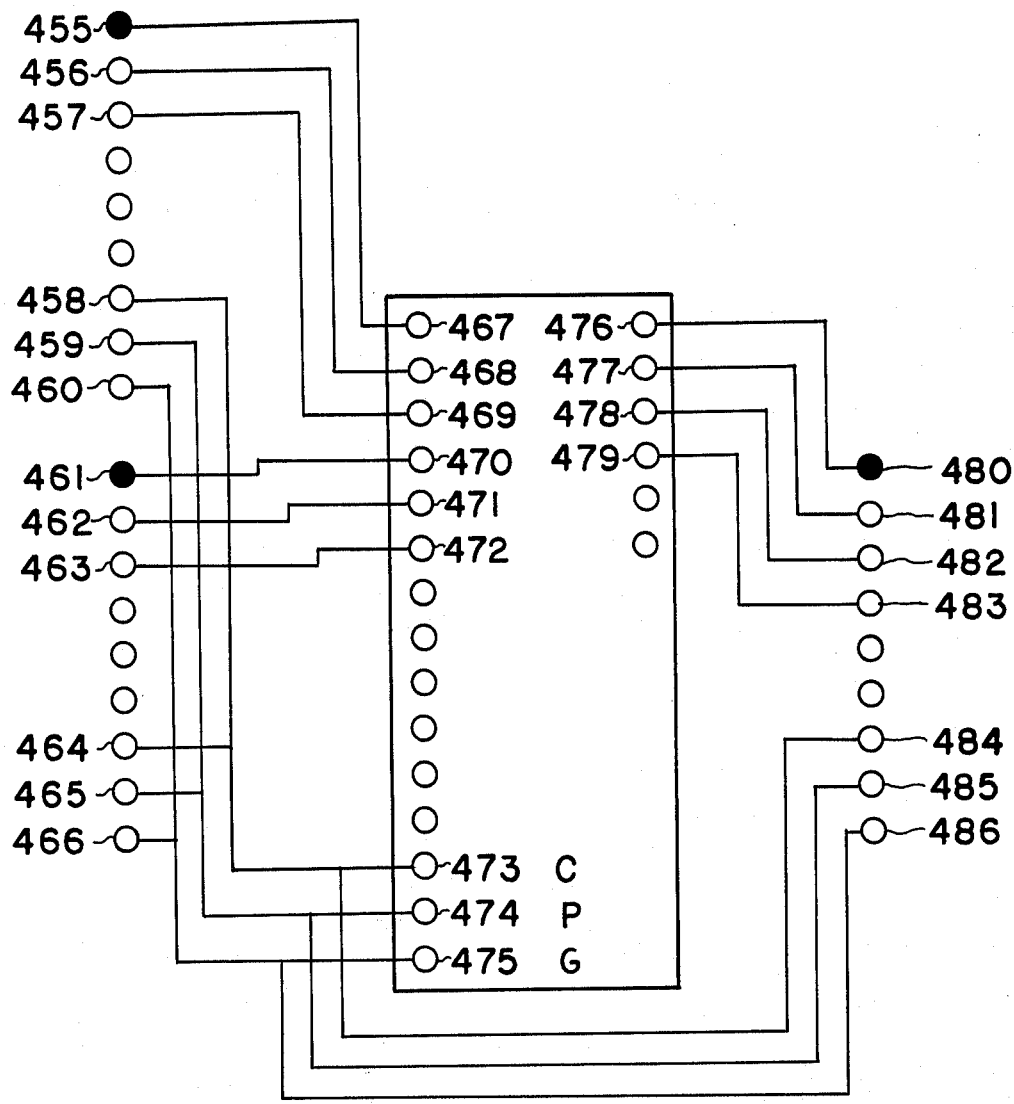
FIG. 27 illustrates a two input and one output module.

An example of an two input one input module as shown in FIG. 23 is shown in FIG. 27. For this example it is assumed that the interface connectors have 9 pins. Pins 455-460 represent one input connector while pins 461-466 represents the other. Pins 480-486 represent the output connector. Pins 467-479 represent the pins of the memory chip. The moduli are assumed to be each representable with 3 bits. Pins 455, 461, and 480 are shown as reference pins on the various connectors. This is done to emphasize the pin to pin compatibility of the connectors. Pins 455-457 of one input connector and pins 458-460 of the other provide the two operands. These inputs are connected to the address bits of the memory 467-472. The pattern of interconnections assumes that pins 455-457 represent bits $b_0$-$b_2$ of one operand while pins 458-460 represent bits $b_0$-$b_2$ of the other operands. Bits $b_0$-$b_4$ of the chip on pins 476-479 are connected to the output connector pins 480-483. Pins 458, 464, and 484 are for a clock signal and are connected to pin 473 of the memory chip if the processor is pipelined. Pins 459, 465, and 485 are power leads and are connected to pin 474 of the memory. Pins 460, 466, and 486 are ground connections which are connected to pin 475 of the memory.

Figure 28:
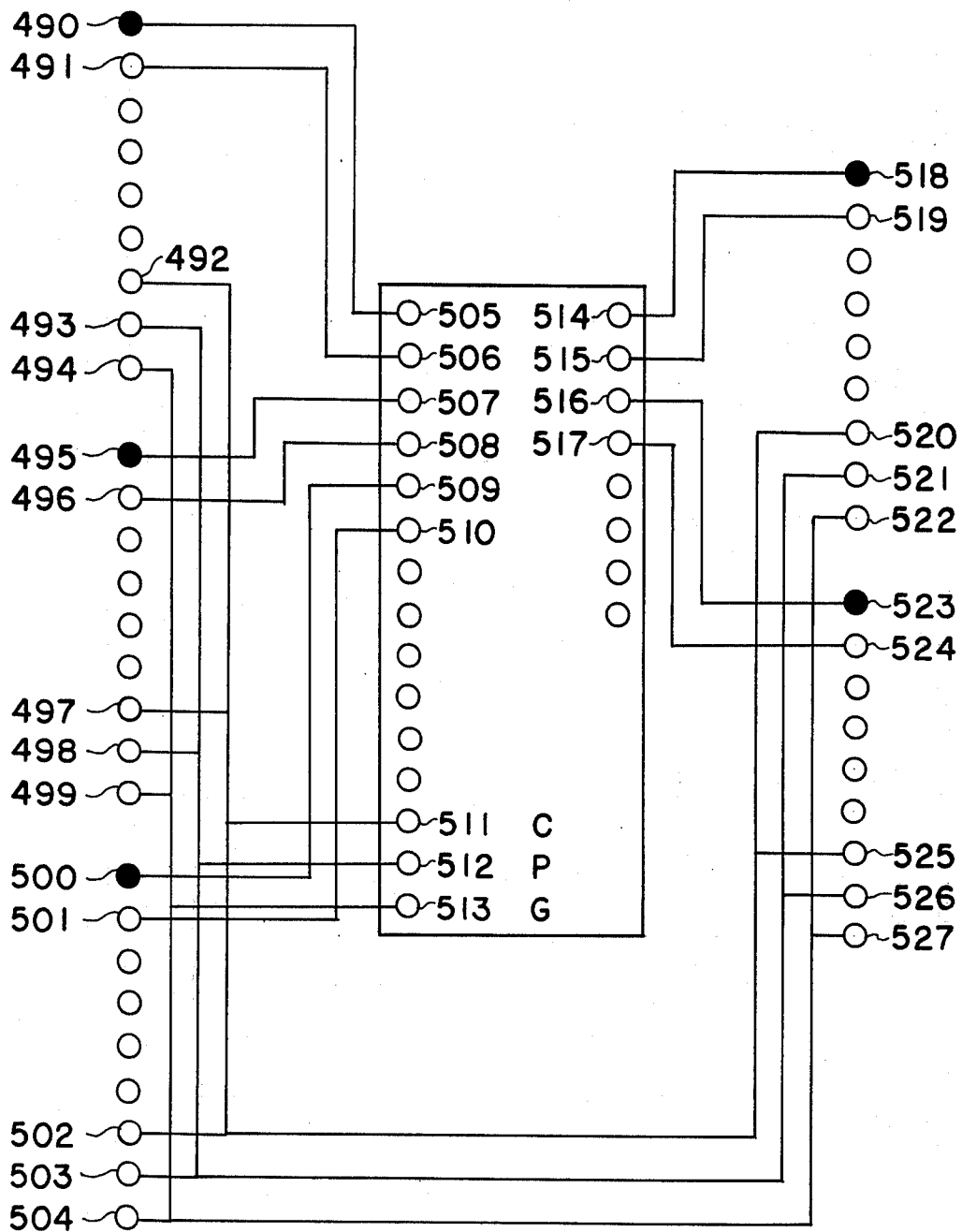
FIG. 28 illustrates a three input and two output module.

An example of the 3 input 2 output type of module shown in FIG. 24 is shown in FIG. 28. This type of module is used for three oprand binary adders. Pins 490-494, 495-499, and 500-504 represent the various input connectors. Pins 490, 495, 500, 518, and 523 are shown as reference pins to emphasize the pin to pin compatibility of the connectors. Pins 518-522 and 523-527 represent the output connectors. Pins 490-491, 495-496, and 500-501 provide the 2 bit slices to be added. These inputs are connected to memory address pins 505-510 to form an address. Bits $b_0$-$b_1$ of the output 515-515 are connected to pins 518-519 of an output connector while the outputs bits $b_2$-$b_3$, 516-517 are connected to pins 523-524. The pins 492, 497, 502, 520, and 525 are connected to the clock pin 511. Pins 493, 498, 503, 521, and 526 are connected to the power pin 512. Pins 494, 499, 504, 522, and 527 are connected to the ground pin 513.

Figures 29, 31:
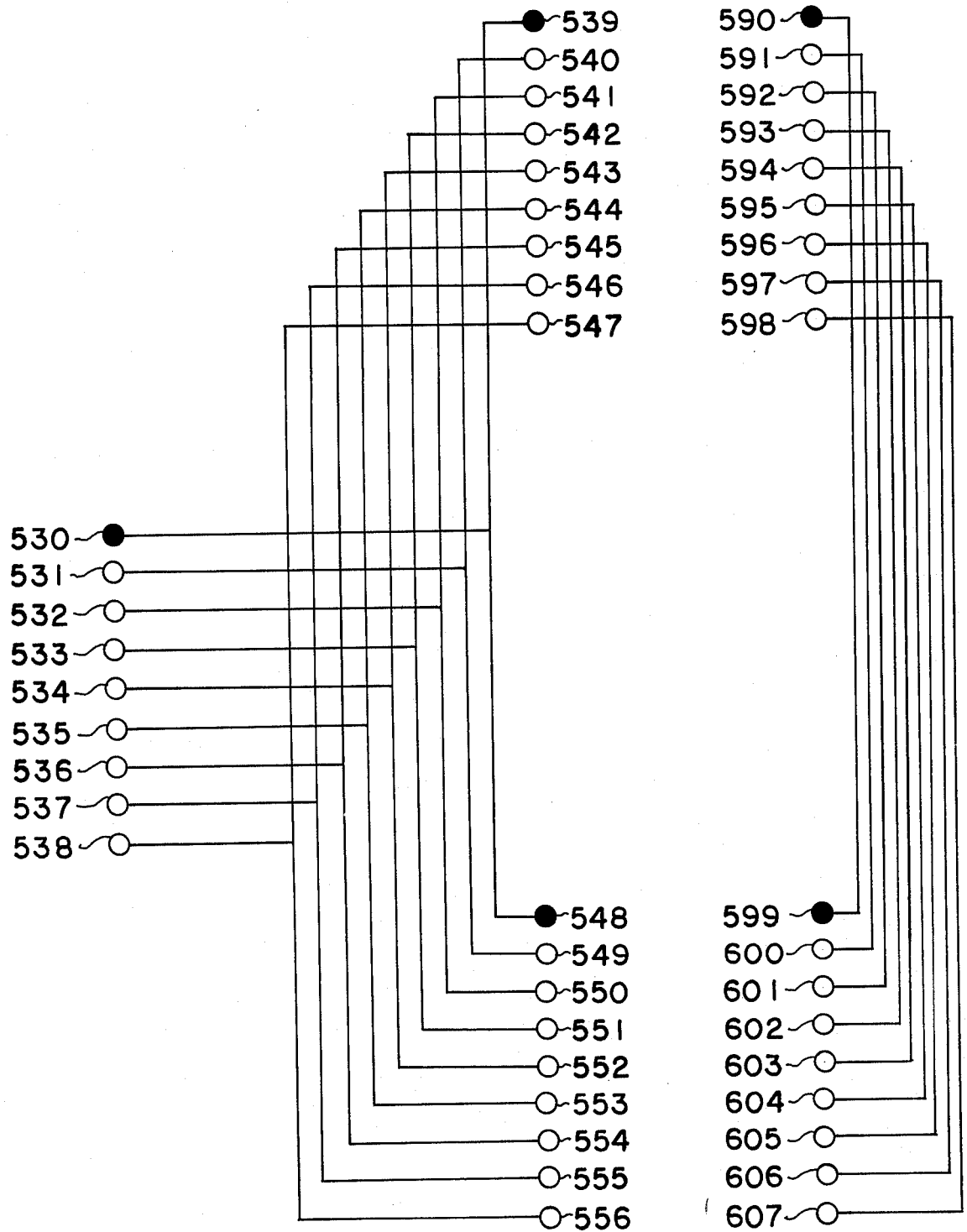
FIG. 29 illustrates a branch module.
FIG. 31 illustrates a standardized cable.

An example of the duplicator type of module shown in FIG. 25 is shown in FIG. 29. Pins 530-538 of the input connectors are connected to pins 539-547 and pins 548-556 of the output connector. Pins 530, 539, and 548 are shown as reference pins to emphasize the pin to pin compatibility of the connectors.

Figure 30:
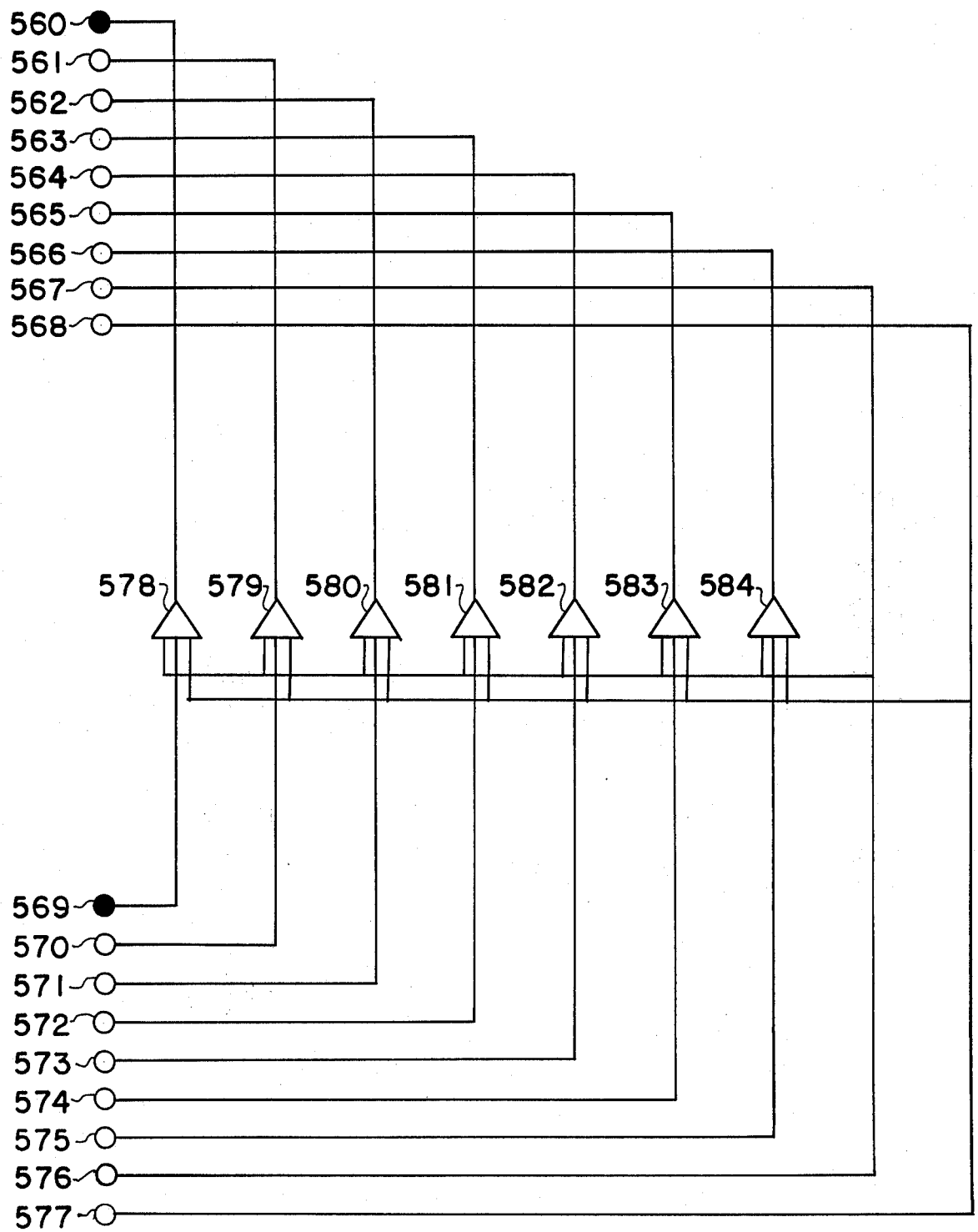
FIG. 30 illustrates an amplifier module.

An example of an amplifier type of module shown in FIG. 26 is shown in FIG. 30. Pins 560-568 are on the input connector. Pins 569-577 are on the output connector. The input and output connectors are pin to pin compatible as denoted by key pins 560 and 569. Pins 560-566 are connected to amplifiers 578-584. The outputs of amplifiers 578-584 are connected to output pins 569-575. Power pin 567 is connected to every amplifier and to output pin 576. The ground pin 568 is connected to every amplifier and to output pin 577. In this case the clock signal on input 566 is also amplified.

A standardized interconnection cable is shown in FIG. 31. Pins 590-598 of one connector are shown to pins 599-607 of the other connector. The connectors are pin to pin compatible as denoted by key pins 590 and 599.

The example of a two input one output type of module shown in FIG. 27 is somewhat restrictive. It can only handle input operands of 3 bits in width. If a modulus such as 11 was desired which required 4 bit operands a different module would have to be designed. Such a design is shown in FIG. 32. To handle a modulus requiring 4 bit operands a larger memory chip would be needed. Memory chips exist in families in which the pin assignments of the chips are upwards compatible for ease in memory size expansion. Pins 633-644 on the memory chip are reversed for 12 bits of address even though only portions of this would be used in different cases. Six bits of address would only use pins 633-638. Eight bits of address would use pins 633-640, etc. Input pins 615-620 are connected to pins 633, 635, 637, 639, 641, and 643 of the memory address pins. Input pins 624-629 are connected to pins 634, 636, 638, 640, 642, and 644 of the memory address pins. The signal inputs are connected to the address pins in an interwoven manner. This is done so that no matter how many bits are needed for each operand a contiguous address is formed at the address pins. As an example suppose each operand required only 2 bits. Inputs 615 and 616 would supply one 2 bit operand to address pins 633 and 635. Inputs 624 and 625 would supply the other 2 bit operand to address pins 634 and 636. Thus a 4 bit address would be formed on pins 633-636. If 4 bits were required to represent each operand then pins 615-618 and pins 624-627 would form an interwoven address on pins 633-640. No changes in wiring would be needed to accommodate operands of different bit lengths. The bits of each operand would be in a interwoven order at the address pins. In the algorithm used to generate the tables used to represent the nodes, bit $b_2$-$b_0$ and $b_5$-$b_3$ were usually assumed to represent the two operands. This assignment is quite arbitrary. Bits $b_5$, $b_3$, and $b_1$ could have been used to form one operand while bits $b_4$, $b_2$, and $b_0$ formed the other.

TABLE 76

| Contiguous and Interwoven Addresses |
|---|
| CONTIGUOUS ADDRESS |
| OP1 : = ADDR [5:3]; |
| OP2 : = ADDR [2:0]; |
| INTERWOVEN ADDRESS |
| OP1[2] : = ADDR [5]; |
| OP1[1] : = ADDR [3]; |
| OP1[0] : = ADDR [1]; |
| OP2[2] : = ADDR [4]; |
| OP2[1] : = ADDR [2]; |
| OP2[0] : = ADDR [0]; |

The differences between obtaining the operands from a contiguous and interwoven address is demonstrated in Table 76. This technique can be applied to any of the previously discussed algorithm. Thus unscrambling of the oprand bits from the address is very useful. Rather than having to modify the modules or interconnections only the interpretation of the meaning of the different pins need be modified.

The output pins of the memory 648-653 are connected to output pins 654-659. If the memory had only 4 output bits then only pins 648-651 would be active. If the memory had 6 output bits then pins 648-653 would be active. All the output pins of the memory are connected to the output in anticipation of different memory sizes. Pins 615, 624, and 654 are shown as reference pins. Pins 621, 630, and 660 are connected to the clock pin 645. Pins 622, 631, and 661 are connected to the power pin 646. Pins 623, 632, and 662 are connected to the ground pin 647. The module shown in FIG. 32 is different from that shown in FIG. 27 in that it can handle a wide range of memory sizes and thus modulii sizes without modification.

A module for 3 input and 2 outputs can also be constructed to handle a wide range of memory sizes without modification. An example o such a module is shown in FIG. 33. The signal inputs of the three input connectors 670-672, 676-678, and 682-684 are connected to the memory pins 688-696 in a three way interwoven manner. This interweaving insures that each input contributes an equal amount to a contiguous address, independent of the bit width of the operands. If each input was 2 bits wide then inputs 683, 677, 671, 682, 676, and 670 would be connected to address pins 693-688 to form a 6 bit address. If each operand was 3 bits wide then inputs 684, 678, 672, 683, 677, 671, 682, 676, and 670 would be connected to address pins 696-688 to form a 9 bit address. The bits of the operands are interwoven in the address. The operand on inputs 672-670 is represented by bits $b_7$, $b_3$, and $b_0$ on pins 694, 691, and 688. This interweaving has to be compensated for in the programing of the memory. The technique is similar to that used in Table 76 for two way interweaving.

Pins 670, 676, 682, 703, and 709 are shown as reference pins. Pins 673, 679, 685, 706, and 712 are connected to the clock pin 715. Pins 674, 680, 686, 707, and 713 are connected to the power pin 716. Pins 675, 681, 687, 708, and 714 are connected to the ground pin 717.

The outputs of the memory has to be partitioned between two outputs. To make this partition independent of the memory width, the output bits are connected in an alternating manner between the two outputs. Memory output pins 697, 699, and 701 are connected to outputs 703-705 while pins 698, 700, and 702 are connected to pins 709-711. Whether the memory used is 2, 4, or 6 bits wide half of the bits will go to each output connector. In the case of a 3 operand binary adder node it is desired that the top half of the result go to one connector and the bottom half to the other. The programming of the memory would have to compensate for this scrambling. The top half of the result could be placed in either the even or odd bits while the lower bits would occupy the other bits.

TABLE 77

| Interweaved Output |
| --- |
| TEMP[0] : = RESULT[0]; |
| TEMP[2] : = RESULT[1]; |
| TEMP[1] : = RESULT[2]; |
| TEMP[3] : = RESULT[3]; |
| MEM(ADDR) : = TEMP; |

An example of how the result can be permuted in a compensating manner is shown in Table 77. Such a module shown in FIG. 33 is different from that shown in FIG. 28 in that it can handle memories of different sizes without modification. As an example it can be used as a 3 operand binary adder node which handles either 1, 2, or 3 bit slices with only a change in memory size.

The modules as shown in FIGS. 29, 30, 31, 32, and 33 are designed to allow upgrading to larger moduli without any physical modifications of the cabling or modules. Only the size and programming of the memories need be changed. These modules will also handle cohabitating nodes without modification.

The processors discussed can be entirely constructed from the modules shown in FIGS. 27-33. The modules and cables can be mass manufactured. To design a processor only the programming of the memories of the modules and the interconnection of the modules need be specified. The processor can be easily modified. The programming of the memories can be changed, mode nodes inserted, larger memories used, or the interconnection pattern modified.

The accuracy of the processors depends on the product of the moduli used. In this discussion the moduli 5, 7, and 8 were used giving a range of 280. This range can be greatly extended. As an example, if memories of 1024 words each 6 bits wide had been used then the moduli 32, 31, 29, 27, 25, 23, 19, 17, 13, 11, and 7 could have been used. This would give a range of 144,403,552,893,600 which is greater than 47 bits of accuracy. If memories of 4096 words each 8 bits wide were used then the moduli 64, 61, 59, 57, 53, 51, 49, 47, 43, 41, 37, 31, 29, 25, 23, 19, 17, 13, and 11 could be used. This would give a range of 127,290,734,521,737,197,468,723,265,600 which is greater than 96 bits of accuracy.

This range which is the product of the moduli is only a limit on the output. No restrictions exist on the intermediate calculations. This property is referred to as compute through overflow. It is not available in conventionally designed processors. As an example, it is possible to compute 999*1001-998*1002 with the moduli 5, 7, and 8 even though the output range would be limited to 0-279. This facility can be used to greatly simplify the processor in situations where the output range of some calculations is limited and known beforehand but where a large range is needed by intermediate calculations.

In some situations it is desirable to be able to process floating point numbers. The basic approach used in floating point units is to add additional hardware to a fixed point arithmetic unit to appropriately scale the inputs and normalize the output. A good review of floating point units can be found in chapters 15 and 16 of *The Logic of Computer Arithmetic* by Ivan Flores (Prentice-Hall, N.J.).

A block floating point approach can be used with these number theoretic vector processors. All the operands of a calculation can be scaled to have the same exponent. The mantissa portion of these numbers are then treated as integers and processed by the number theoretic processor. The result along with the exponent of this block of data are used to construct a normal floating point version of the answer.

Such a unit is shown in FIG. 34. Units 720-733 represent a number theoretic processor. 720-728 are encoders. 729-731 are modular processors. 732 is a residue to mixed radix converter. 733 is a mixed radix to normal radix converter. Units 738-736 are floating point scaling units. 737 is a floating point normalizing unit. Unit 738 is a floating point control unit.

Floating point numbers are fed to the scaling units 734-736. These units communicate the exponents of each input to the floating point control unit 738. This unit decides which exponent to use to represent this block of data. The smallest exponent is usually used. The floating point equivalents of 0 and 1 are handled as special cases as they are in conventional floating point units. This block exponent is communicated back to the scalers 734–736. Each scaler attempts to scale their number to have this same exponent. This is done by shifting the mantissa and adjusting the exponent accordingly. Sometimes this cannot be accomplished because in the process all the significant bits are lost. This is a problem common to all floating point units. In such a situation the scalers 734–736 would signal the floating point control unit of an error.

In the normal case the mantissa portion of these scaled floating point numbers would be processed as if they were integers. The output of scaler 734 would be feed to encoders 720, 723, and 726. The outputs of the other scalers would be handled in a similar manner. These values would then be processed by the number theoretic processor. The result would be fed to a normalizing unit 737. The floating point control unit would also feed the block exponent to this normalizing unit. This unit takes the result of the calculation and the block exponent and produces a normalized floating point number by shifting the result and adjusting the exponent. The output of the normalizer 737 is the floating point equivalent of the answer.

In addition to the accuracy of a processor the throughput is also of interest. Pipelined number theoretic processors can operate with large throughputs. As an example, a pipelined processor capable of performing inner products of vectors each 100 elements long where each element is 20 bits wide, can be constructed entirely from memories with 1024 words each 6 bits wide. If each memory is latchable and has a cycle time of 300 nanoseconds then 3.3 million inner products can be performed a second. Since each inner product consists of 100 multiplications and 99 additions that is equivalent to a throughput of 656.7 million, 47 bit arithmetic operations a second. The latency of a particular inner product would be 12.3 microseconds.

A pipelined inner product processor capable of handling vectors each 1000 elements long where each element was only 18 bits wide, could also be constructed with the same memory chips. Each inner product would consist of 1000 multiplications and 1013 additions. The throughput in this case would be $6.71 \times 10^9$, 47 bit arithmetic operations a second. The latency would be 13.5 microseconds.

Larger ranges are possible with larger memories. Larger throughput rakes are capable with faster memory chips.

What is claimed is:

1. A system for converting a mixed radix number to a normal radix number comprising:
   a means for storing a normal radix number at a location specified by each value of each mixed radix coefficient;
   a means for retrieving from the storage means the normal radix numbers corresponding to each of the mixed radix coefficients to be converted connected to the output of said storage means;
   and a means for adding the normal radix numbers which have been produced by the retrieval means connected to the output of said retrieval means.

2. A system for converting a mixed radix number to a normal radix number comprising:
   a means for storing a normal radix number at a location specified by each value of each independent subset of mixed radix coefficients wherein the normal radix number stored is the sum of a normal reflux number associated with each of the values of each mixed radix coefficient in the subset;
   a means for retrieving from the storage means the number associated with each subset of mixed radix coefficients to be converted, connected to the storage means;
   and a means for adding the normal radix numbers which have been produced by the retrieval means conducted to the output of the retrieval means.

3. A system for converting from a mixed radix to a sign magnitude number comprising:
   a means for deriving the sign of the mixed radix number;
   a means for storing the normal radix equivalents associated with the mixed radix coefficients;
   a means for retrieving from the storage means the equivalents of the coefficients to be converted;
   a means for adding the normal radix equivalents produced by the retrieval means and if the sign deriving means indicated that the number is negative then the negative of $M+1$ where M is the range would be added to this sum;
   a means of bitwise complementing the result of the adding means if the sign deriving means indicated that the number is negative;
   and a means of attaching a sign bit to the result of the c.sp 2.

4. A system for converting from a mixed radix to two's complement comprising:
   a means for deriving the sign of the mixed radix number;
   a means for storing the normal radix equivalents of the mixed radix coefficients;
   a means for retrieving from the storage means the equivalent of the coefficients to be converted;
   and a means for adding the normal radix equivalents produced by the retrieval means and if the sign deriving means indicates that the number is negative then the negative of the range, M, is added to this sum.

5. A system for converting from mixed radix to two's complement where the most significant mixed radix coefficient evolved from an even modulus comprising:
   a means for storing the two's complement equivalent associated with the mixed radix coefficients wherein those equivalents associated with the values of the most significant mixed radix coefficient indicating a negative number have the range, M, presubtracted from the equivalent;
   a means for retrieving from the storage means the number associated with the coefficients to be converted;
   and a means for adding the equivalents produced by the retrieval means.

6. A system for converting from mixed radix to sign magnitude where the most significant mixed radix coefficient evolved from an even modulus comprising:
   a means for storing the two's complement equivalent associated with the mixed radix coefficients wherein those equivalents associated with the values of the most significant mixed radix coefficient indicating a negative number have the range, M, incremented by one-re-subtracted from the equivalent;

a means for retrieving from the storage means the number associated with the coefficients to be converted;

a means for adding the equivalents produced by the retrieval means;

a means for bitwise complementing the result of the adding means if the most significant mixed radix coefficient indicates that the number is negative;

and a means for attaching a sign bit to the result of the conditional bitwise complementing means.

7. A system for converting from mixed radix to two's complement where the most significant mixed radix coefficient evolved from an even modulus comprising:

a means for storing a two's complement number (A) in association with each value of each independent subset of mixed radix coefficients where the number (A) is the two's complement of the sum of the normal radix equivalents of each mixed radix coefficient of the subset and where the subset containing the most significant mixed radix coefficient has the range, M, pre-subtracted from the number (A) normally associated with the values of those most significant coefficients which indicate a negative number;

a means for retrieving from the storage means the numbers associated with the coefficients to be converted;

and a means for adding the numbers produced by the retrieval means.

8. A system for converting from mixed radix to two's complement where the most significant mixed radix coefficient evolved from an even modulus as recited in claim 7, wherein the independent subsets of coefficients consists of pairs of coefficients.

9. A system for converting from mixed radix to sign magnitude where the most significant mixed radix coefficient evolved from an even modulus comprising:

a means for storing a two's complement number (A) in association with each value of each independent subset of mixed radix coefficients where the number (A) is the two's complement of the sum of the normal radix equivalents of each mixed radix coefficient of the subset and where the subset contains the most significant mixed radix coefficient has the range, M, incremented by 1 pre-subtracted from the number (A) normally associated with the values of those most significant coefficients which indicate a negative number;

a means for retrieving from the storage means the number associated with the coefficients to be converted;

a means for adding the equivalents produced by the retrieval means;

a means for bitwise complementing the result of the adding means if the most significant mixed radix coefficient indicates that the number is negative;

and a means for attaching a sign bit to the result of the conditional bitwise complementing means.

10. A system for converting from mixed radix to sign magnitude where the most significant mixed radix coefficient evolved from an even modulus, as recited in claim 9, wherein the subsets of the coefficients consists of pairs of coefficients.

11. An encoder for the direct encoding of a non-negative number (B) comprising:

a means for translating the number to be encoded (B) into a number (C);

a storage means which has a number (A) stored at an address (D)

where (D) represents a magnitude and where (A) is the modular equivalent of the equivalent of (D); and a means for communicating the number (C) from the translating means to the storage means for use as address (D)

where the number to be encoded (B) is translated into number (C) which is used as address (D) to retrieve the number (A) which is the modular equivalent of (B).

12. An encoder for the direct encoding of a sign magnitude number (B), having a sign bit and a magnitude portion, comprising:

a means for translating the number to be encoded (B) into a number (C);

a storage means which has a number (A) stored at a location (D)

where (D) has a portion representing a sign bit and a portion representing a magnitude and where if the sign bit portion of (D) indicates a non-negative number then the number (A) is the modular equivalent of the equivalent of the magnitude portion of (D)

else the number (A) is the modular complement of the modular equivalent of the equivalent of the magnitude portion of (D); and a means for communicating the number (C) from the translating means to the storage means for use as address (D)

where the number to be encoded (B) is translated into number (C) which is used as address (D) to retrieve the number (A) which is the modular equivalent of (B).

13. An encoder for the direct encoding of a n bit two's complement number (B), having a most significant bit, comprising:

a means of translating the number to be encoded (B) into a number (C);

a storage means which has a number (A) stored at an address (D)

where (D) has a portion representing a number and a portion representing a most significant bit and where if the most significant bit portion of (D) indicates a non-negative number then the number (A) is the modular equivalent of the equivalent of the number portion of (D)

else the number (A) is the modular equivalent of the weighting factor of the n+1th binary digit subtracted from the equivalent of the number portion of (D); and a means for communicating the number (C) from the translating means to the storage means for use as address (D)

where the number to be encoded (B) is translated into (C) which is used to retreive from the storage means the number (A) which is the modular equivalent of (B).

14. An encoder for modified encoding of a sign magnitude number (B), having a sign bit and a magnitude portion, comprising:

a means for encoding non-negative numbers connected to the magnitude portion of the number to be encoded (B);

a means for translating the sign bit of (B) and the output of the encoding means into a number (C);

a means for communicating the sign bit of (B) and the output of the non-negative encoding means to the means for translating;

a storage means with a number (A) stored at a location (D)

where (D) has a portion representing a sign bit and a portion representing a modular equivalent and where if the sign bit portion of (D) indicates a non-negative number then the number (A) is equal to the equivalent of the modular-equivalent portion of (D)

else the number (A) is equal to the modular complement of the equivalent of the modular-equivalent portion of (D); and a means for communicating the number (C) from the translating means to the storage means for use as address (D)

where the number to be encoded (B) is translated into (C) which is used as as an address (D) to retreive from the storage means the number (A) which is the modular equivalent of (B).

15. An encoder for modified encoding of a n bit two's complement number (B), having a most significant bit, comprising:

an encoder means for encoding non-negative numbers with input connected to (B);

a means for translating the most significant bit of (B) and the output of the non-negative encoding means into a number (C);

a means for communicating the most significant bit of (B) and the output of the non-negative encoding means to the translating means;

a storage means with a number (A) stored at a location (D)

where (D) has a portion representing a most significant bit and a portion representing a modular equivalent and where if the most significant bit portion of (D) indicates a non-negative number then the number (A) is equal to the equivalent of the modular-equivalent portion of (D)

else the number (A) is equal to the modular equivalent of the weighting factor of the n+1th binary place subtracted in a modular manner from the equivalent of the modular-equivalent portion of (D); and a means for communicating the number (C) from the translating means to the storage means for use as address (D)

where the number to be encoded (B) is translated into (C) which is used as address (D) to retreive from the storage means the number (A) which is the modular equivalent of (B).

16. An encoder for parallel encoding of a sign magnitude number (B), having a sign and magnitude portion, comprising:

a plurality of storage means which each have a number (A) stored at a location (D)

where (D) has a portion representing a sign bit and a portion representing a magnitude and where if the sign bit portion of (D) indicates a non-negative number then the number (A) is equal to the modular equivalent of the numeric equivalent of the equivalent of the magnitude portion of (D)

else the number (A) is equal to the modular complement of the modular equivalent of the numeric equivalent of the equivalent of the magnitude portion of (D);

a means for communicating the sign bit of (B) and a unique portion of the magnitude portion of (B) to each of the storage means; and a modular adder means connected to the outputs of the plurality of storage means to add all the outputs in a modular manner to produce the modular equivalent of the (B).

17. An encoder for parallel encoding of a n bit two's complement number (B), having a most significant bit, comprising:

a first storage means with a number (G) stored at a location (H)

where (H) has a portion representing a sign bit and a portion representing a portion of a number to be encoded and where if the most significant bit portion of (H) indicates that the number is non-negative then the number (G) is equal to the modular equivalent of the numeric equivalent of the equivalent of (H)

else the number (G) is equal to the modular equivalent of the weighting factor of the n+1th binary place subtracted in a modular manner from the modular equivalent of the numeric equivalent of the equivalent of (H);

at least one other storage means with a number (A) stored at a location (D)

where (D) represents a portion of a number and where the number (A) is the modular equivalent of the numeric equivalent of the equivalent of (D);

a means for communicating the portion of (B) containing the most significant bit to the first storage means for use as (H);

a means for communicating the other portions of (B) to the other storage means for use as (D); and a modular summation means connected to the outputs of all the storage means to add these outputs in a modular manner.

18. An encoder for encoding a positive number (B) in a cascaded manner comprising:

a first storage means with a number (A) stored at a location (D)

where (D) represents a portion of a number and where the number (A) is the modular equivalent of the numeric equivalent of the equivalent of (D);

a second storage means with a number (G) stored at a location (H)

where (H) has a portion representing a portion of a number and a portion representing a modular equivalent and where the number (G) is equal to the modular sum of the equivalent of the modular-equivalent portion of (H) and the modular equivalent of the numeric equivalent of the equivalent of the portion-of-a-number portion of (H);

a means for communicating a portion of (B) to the first storage means for use as (D);

a means for communicating the output of the first storage means to the second storage means for use as a portion of (H); and a means for communicating another portion of (B) to the second storage means for use as a second portion of (H)

where the first storage means encodes it portion of (B) and passes the result to the second storage means which encodes its portion of (B) and adds it in a modular manner to the output of the first storage means to produce the modular equivalent of the two portions of (B).

19. An encoder for encoding in a cascaded manner a sign magnitude number (B), having a sign bit and a magnitude portion, comprising:
a means for encoding (J) a positive number;
a storage means with a number (A) stored at a location (D)
  where (D) has a portion representing a sign bit, a portion representing a portion of a number, and a portion representing a modular equivalent and
  where if the sign bit portion of (D) indicates a non-negative number
    then the number (A) is equal to the modular sum of the equivalent of the modular-equivalent portion of (D) and the modular equivalent of the equivalent of the portion-of-the-number portion of (D)
    else the number (A) is equal to the modular complement of the modular sum of equivalent of the modular-equivalent portion of (D) and the modular equivalent of the equivalent of the portion-of-the-number portion of (D);
a means for communicating a portion of the magnitude portion of (B) to the means of encoding (J);
a means for communicating another portion of the magnitude portion of (B) and the sign bit portion of (B) to the storage means for use as portions of (D); and
a means for communicating the output of the encoding means (J) to the storage means for use as another portion of (D)
where the encoder means encodes a portion of the magnitude portion of (B) and passes the result to the storage means which has the effect of encoding its portion of (B), adding this in a modular manner to the output of the encoder means, complementing this in a modular manner if the sign bit indicates a negative number, and producing (A) the modular equivalent of (B).

20. An encoder for encoding in a cascaded manner a n bit two's complement number (B), having a most significant bit, comprising:
a means for encoding (J) a positive number;
a storage means with a number (A) stored at a location (D)
  where a portion of (D) representing a portion of a number, a portion representing the most significant bit of the number, and a portion representing a modular equivalent and
  where if the most significant bit portion of (D) indicates a non-negative number
    then the number (A) is equal to the modular sum of the equivalent of the modular-equivalent portion of (D) and the modular equivalent of the numeric equivalent of the equivalent of the portion-of-a-number portion of (D)
    else the number (A) is equal to the modular sum of the equivalent of the modular-equivalent portion of (D), the modular equivalent of the numeric equivalent of the equivalent of the portion-of-a-number portion of (D), and the modular complement of the modular equivalent of the weighting factor of the n+1th binary place;
a means for communicating a portion of (B) to the means of encoding (J);
a means for communicating another portion of (B) containing the most significant bit of (B) to the storage means for use as a portion of (D);
a means for communicating the output of the encoder means (J) to the storage means for use as another portion of (D)
where the encoder means encodes a portion of (B) and passes the result to the storage means which has the effect of encoding its portion of (B), adding this in a modular manner to the output of the encoder means, adding to this in a modular manner the modular complement of the modular equivalent of the weighting factor of the n+1th binary place if the sign bit indicates a negative number, and producing (A), the modular equivalent of (B).

21. An encoder for encoding in a cascaded manner a n bit two's complement number (B), having a most significant bit, comprising:
a first storage means with a number (A) stored at a location (D)
  where a portion of (D) represents a portion of a number and a portion representing the most significant bit and
  where if the most significant bit portion of (D) indicates a non-negative number
    then the number (A) is equal to the modular equivalent of the numeric equivalent of the equivalent of the portion-of-a-number portion of (D)
    else the number (A) is equal to the modular sum of the modular equivalent of the numeric equivalent of the equivalent of the portion-of-a-number portion of (D) and the modular complement of the modular equivalent of weighting factor of the n+1th binary place;
a second storage means with a number (G) stored at a location (H)
  where (H) has a portion representing a portion of a number and a portion representing a modular equivalent and
  where the number (G) is equal to the modular sum of the modular equivalent of the numeric equivalent of the equivalent of the portion-of-a-number portion of (H) and the equivalent of the modular-equivalent portion of (H);
a means for communicating a portion of (B) containing the most significant bit to the first storage means for use as (D);
a means for communicating another portion of (B) to the second storage means for use as a portion of (H); and
a means for communicating the output of the first storage means to the second storage means for use as another portion of (H)
where the first storage means encodes a portion of (B) containing the most significant bit and passes this result to a second storage means which has the effect of encoding its portion of (B), adding this in a modular manner to the output of the first storage means, and producing (G), the modular equivalent of (B).

* * * * *

UNITED STATES PATENT AND TRADEMARK OFFICE
CERTIFICATE OF CORRECTION

PATENT NO.  : 4,281,391
DATED       : July 28, 1981
INVENTOR(S) : Alan Huang

It is certified that error appears in the above—identified patent and that said Letters Patent is hereby corrected as shown below:

Column 1, after the title, insert:

The Government has rights in this invention pursuant to Grant No. AFOSR 77-3219 awarded by the United States Air Force.

Signed and Sealed this

Second Day of April 1985

[SEAL]

Attest:

DONALD J. QUIGG

*Attesting Officer*     *Acting Commissioner of Patents and Trademarks*